US005986494A

United States Patent [19]

Kimura

[11] Patent Number: 5,986,494

[45] **Date of Patent: *Nov. 16, 1999**

[54] ANALOG MULTIPLIER USING MULTITAIL CELL

[75] Inventor: Katsuji Kimura, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/720,572

[22] Filed: Oct. 1, 1996

Related U.S. Application Data

[63] Continuation of application No. 08/401,427, Mar. 9, 1995, abandoned.

[30] Foreign Application Priority Data

Mar. 9, 1994 [JP] Japan .................................... 6-65639

[51] Int. Cl.[6] ................................ G06F 7/52; H03F 3/45

[52] U.S. Cl. .......................... 327/359; 327/356; 327/119; 330/254

[58] Field of Search .................................. 327/356, 357, 327/358, 359, 560, 561, 562, 563, 488, 116, 119, 122, 350, 113, 349, 355; 330/252, 253, 254

[56] References Cited

U.S. PATENT DOCUMENTS

| | | | |
|---|---|---|---|
| 3,678,416 | 7/1972 | Burwen | 327/559 |
| 4,663,594 | 5/1987 | Perkins | 327/231 |
| 4,951,003 | 8/1990 | DeJager et al. | 330/252 |
| 4,977,378 | 12/1990 | Tero | 330/258 |
| 5,068,621 | 11/1991 | Hayward et al. | 330/253 |
| 5,107,150 | 4/1992 | Kimura . | |
| 5,187,682 | 2/1993 | Kimura | 364/841 |
| 5,381,113 | 1/1995 | Kimura | 330/253 |
| 5,438,296 | 8/1995 | Kimura | 327/560 |
| 5,475,328 | 12/1995 | Kimura | 327/351 |
| 5,481,224 | 1/1996 | Kimura | 330/253 |

(List continued on next page.)

FOREIGN PATENT DOCUMENTS

| | | | |
|---|---|---|---|
| 60-229520 | 11/1985 | Japan | 327/119 |
| 61-232708 | 10/1986 | Japan | 330/253 |
| 174808 | 3/1989 | Japan | 327/122 |
| 3196279 | 8/1991 | Japan | 330/252 |
| 4-34673 | 2/1992 | Japan . | |
| 5-94552 | 4/1993 | Japan . | |

OTHER PUBLICATIONS

Adams et al., "Extended Transconductance Adjustment/ Linearisation Technique", Electronics Letters, vol. 27, No. 10, pp. 842–844, May 1991.

(List continued on next page.)

*Primary Examiner*—Timothy P. Callahan
*Assistant Examiner*—Terry L. Englund
*Attorney, Agent, or Firm*—Sughrue, Mion, Zinn, Macpeak & Seas, PLLC

[57] ABSTRACT

A two-quadrant multiplier for multiplying first and second signals, which can realize wide input voltage ranges at a low supply voltage such as 3 or 3.3 V, has a multitail cell. This multitail cell contains a pair of first and second transistors having differential input ends and differential output ends, a third transistor having an input end, and a constant current source for driving the pair and the third transistor. The first signal is applied across the differential input ends of the pair, and the second signal is applied in a single polarity (e.g., either a positive or negative polarity) to the input end of the third transistor. An output signal of the multiplier is a multiplication result of the first and second signals which is differentially derived from the differential output ends of the pair. At least one additional transistor may be provided, an input end of which is coupled with the input ends of the third transistor to be applied with the second signal. Two such multitail cells may be combined to form a four-quadrant multiplier for the first and second signals.

23 Claims, 49 Drawing Sheets

U.S. PATENT DOCUMENTS

| | | | |
|---|---|---|---|
| 5,521,542 | 5/1996 | Kimura | 327/352 |
| 5,523,717 | 6/1996 | Kimura | 330/252 |
| 5,552,734 | 9/1996 | Kimura | 327/356 |
| 5,576,653 | 11/1996 | Kimura | 327/356 |
| 5,578,965 | 11/1996 | Kimura | 330/254 |
| 5,581,210 | 12/1996 | Kimura | 327/355 |
| 5,581,211 | 12/1996 | Kimura | 327/356 |
| 5,587,682 | 12/1996 | Colli et al. | 327/113 |
| 5,587,687 | 12/1996 | Adams | 330/254 |
| 5,602,509 | 2/1997 | Kimura | 330/253 |
| 5,617,052 | 4/1997 | Kimura | 327/357 |
| 5,631,594 | 5/1997 | Kimura | 327/352 |
| 5,631,607 | 5/1997 | Huijsing et al. | 330/253 |
| 5,640,121 | 6/1997 | Kimura | 330/252 |
| 5,668,750 | 9/1997 | Kimura | 327/356 |
| 5,712,594 | 1/1998 | Kimura | 330/253 |
| 5,712,810 | 1/1998 | Kimura | 327/359 |
| 5,748,041 | 5/1998 | Kimura | 330/254 |

OTHER PUBLICATIONS

*Electronics Letters,* vol. 28, No. 19, "Highly Linear Four Quadrant Analogue BiCMOS Multiplier for ±1·5V Supply Operation"; pp. 1783–1785 (Sep. 10, 1992), Ramirez–Angulo.

*IEEE Journal of Solid–State Circuits,* SC–20, No. 6, "A 20–V Four–Quadrant CMOS Analog Multiplier", pp. 1158–1168 (Dec. 1985), Babanezhad et al.

*IEICE Transactions on Electronics,* E76–C, No. 5, "A Unified Analysis of Four–Quadrant Analog Multipliers Consisting of Emitter and Source–Coupled Transistors Operable on Low Supply Voltage", pp. 714–737, (May 15, 1993), Kimura.

Wang, "A CMOS Four–Quadrant Analog Multiplier with Single–Ended Voltage Output and Improved Temperature Performance", *IEEE Journal of Solid–State Circuits,* vol. 26, No. 9, Sep. 1991, pp. 1293–1301.

Katsuji Kimura, "An MOS Operational Transconductance Amplifier and an MOS Four–Quadrant Analog Multiplier Using the Quadritail Cell", *IEICE Trans. Fundamentals,* vol. E75–A, No. 12, Dec. 1992, pp. 1774–1776.

ANALOG MULTIPLIER USING MULTITAIL CELL

This is a continuation of application Ser. No. 08/401,427 now abandoned filed Mar. 9, 1995.

BACKGROUND OF THE INVENTION

1. Field of the Invention

The present invention relates to a multiplier for multiplying two analog input signals, which is to be realized on a semiconductor integrated circuit device and more particularly, to an analog multiplier formed of bipolar transistors and/or metal-oxide-semiconductor field-effect transistors (MOSFETs), which can operate within an expanded input voltage range or ranges even at a low supply voltage such as 3 or 3.3 V.

2. Description of the Prior Art

An analog multiplier constitutes a functional circuit block essential for analog signal applications. Recently, semiconductor integrated circuits have been made finer and finer and as a result, their supply voltages have been decreasing from 5 V to 3.3 or 3 V.

Under such a circumstance, a low-voltage circuit technique that enables to operate at such a low voltage as 3 V has been required to be developed. In the case, the input voltage ranges of the multiplier need to be wide as much as possible.

The Gilbert multiplier cell is well known as a bipolar multiplier. However, the Gilbert multiplier cell has such a structure that bipolar transistor-pairs are stacked in two stages and as a result, it cannot respond to or cope with such the supply voltage reduction as above. Therefore, a new bipolar multiplier that can operate at such the low supply voltage has been expected instead of the Gilbert multiplier cell.

Besides, the Complementary MOS (CMOS) technology has become recognized to be the optimum process technology for Large Scale Integration (LSI), so that a new circuit technique that can realize a multiplier using the CMOS technology has been required.

To respond such the expectation as above, the inventor, Kimura, developed multipliers as shown in FIGS. 1, 4 and 7, each of which has two squaring circuits. One of the squaring circuits is applied with a differential input voltage (V1+V2), and the other thereof is applied with another differential input voltage (V2−V1), where $V_1$ and $V_2$ are input signal voltages to be multiplied. The outputs of these two squaring circuits are subtracted to generate an output voltage $V_{OUT}$ of the multiplier, which is expressed as $$V_{OUT}=(V_1+V_2)^2-(V_2-V_1)^2=4V_1\cdot V_2$$

From this equation, it is seen that the output voltage $V_{OUT}$ is proportional to the product $V_1 \cdot V_2$ of the first input voltage $V_1$ and the second input voltage $V_2$, meaning that the circuit having the two squaring circuits provides a multiplier characteristic.

The squaring circuits are arranged along a straight line transversely not in stack, to be driven at the same supply voltage.

The above prior-art multipliers developed by Kimura were termed "quarter-square multipliers" since the constant "4" of involution contained in the term of the product was changed to "1".

Next, the Kimura's prior-art multipliers will be described below.

First, the Kimura's prior-art multiplier shown in FIG. 1 is disclosed in the Japanese Non-Examined Patent Publication No. 5-94552 (April, 1993). In FIG. 1, this multiplier includes a first squaring circuit made of bipolar transistors Q51, Q52, Q53 and Q54 and a second squaring circuit made of bipolar transistors Q55, Q56, Q57 and Q58.

In the first squaring circuit, the transistors Q51 and Q52 form a first unbalanced differential pair driven by a first constant current source (current :$I_0$) and the transistors Q53 and Q54 form a second unbalanced differential pair driven by a second constant current source (current: $I_0$). The transistor Q51 is K times in emitter area as large as the transistor Q52 and the transistor Q54 is K times in emitter area as large as the transistor Q53.

Emitters of the transistors Q51 and Q52 are connected in common to the first constant current source, and emitters of the transistors Q53 and Q54 are connected in common to the second constant current source.

In the second squaring circuit, the transistors Q55 and Q56 form a third unbalanced differential pair driven by a third constant current source (current: $I_0$) and the transistors Q57 and Q58 form a fourth unbalanced differential pair driven by a fourth constant current source (current: $I_0$). The transistor Q55 is K times in emitter area as large as the transistor Q56 and the transistor Q58 is K times in emitter area as large as the transistor Q57.

Emitters of the transistors Q55 and Q56 are connected in common to the third constant current source, and emitters of the transistors Q57 and Q58 are connected in common to the fourth constant current source.

Bases of the transistors Q51 and Q53 are coupled together to be applied with a first input voltage $V_x$, and bases of the transistors Q52 and Q54 are coupled together to be applied with a second input voltage $V_y$.

Bases of the transistors Q55 and Q57 are coupled together to be applied with the first input voltage $V_x$, and bases of the transistors Q56 and Q58 are coupled together to be applied in opposite phase with the second input voltage $V_y$, or $-V_y$.

The transfer characteristics and the transconductance characteristics of the multiplier of FIG. 1 are shown in FIGS. 2 and 3, respectively, where K is $e^2$ ($\approx$7.389). A differential output current ΔI shown in FIG. 2 is defined as the difference of output currents $I_p$ and $I_q$ shown in FIG. 1, or ($I_p-I_q$).

FIG. 2 shows the relationship between the differential output current ΔI and the first input voltage $V_x$ with the second input voltage $V_y$ as a parameter. FIG. 3 shows the relationship between the transconductance ($d\Delta I/dV_x$) and the first input voltage $V_x$ with the second input voltage $V_y$ as a parameter.

Second, the Kimura's prior-art multiplier shown in FIG. 4 is disclosed in the Japanese Non-Examined patent Publication No. 4-34673 (February, 1992). In FIG. 4, the multiplier includes a first squaring circuit made of MOS transistors M51, M52, M53 and M54 and a second squaring circuit made of MOS transistors M55, M56, M57 and M58.

In the first squaring circuit the transistors M51 and M52 form a first unbalanced differential pair driven by a first constant current source (current :$I_0$), and the transistors M53 and M54 form a second unbalanced differential pair driven by a second constant current source (current: $I_0$). The transistor M52 is K' times in ratio (W/L) of a gate-width W to a gate-length L as much as the transistor M51, and the transistor M53 is K' times in ratio (W/L) of a gate-width W to a gate-length L as much as the transistor M54.

Sources of the transistors M51 and M52 are connected in common to the first constant current source, and sources of the transistors M53 and M54 are connected in common to the second constant current source.

In the second squaring circuit, the transistors M55 and M56 form a third unbalanced differential pair driven by a third constant current source (current: $I_0$), and the transistors M57 and M58 form a fourth unbalanced differential pair driven by a fourth constant current source (current: $I_0$). The transistor M56 is K' times in ratio (W/L) of a gate-width W to a gate-length L as much as the transistor M55, and the transistor M57 is K' times in ratio (W/L) of a gate-width W to a gate-length L as much as the transistor M58.

Sources of the transistors M55 and M56 are connected in common to the third constant current source, and sources of the transistors M57 and M58 are connected in common to the fourth constant current source.

Gates of the transistors M51 and M53 are coupled together to be applied with a first input voltage $V_x$, and gates of the transistors M52 and M54 are coupled together to be applied in opposite phase with a second input voltage $V_y$, or $-V_y$.

Gates of the transistors M55 and M57 are coupled together to be applied with the first input voltage $V_x$, and gates of the transistors M56 and M58 are coupled together to be applied with the second input voltage $V_y$.

In FIG. 4, the transconductance parameters of the transistors M51, M54, M55 and M58 are equal to be β, and those of the transistors M52, M53, M56 and M57 are equal to be K'β.

The transfer characteristics and the transconductance characteristics of the multiplier are shown in FIGS. 5 and 6, respectively, where K' is 5. A differential output current ΔI shown in FIG. 5 is defined as the difference of output currents $I^+$ and $I^-$ shown in FIG. 4, or $(I^+-I^-)$.

FIG. 5 shows the relationship between the differential output current ΔI and the fist input voltage $V_x$ with the second input voltage $V_y$ as a parameter. FIG. 6 shows the relationship between the transconductance $(d\Delta I/dV_x)$ and the first input voltage $V_x$ with the second input voltage $V_y$ as a parameter Third, the Kimura's prior-art multiplier shown in FIG. 7 is disclosed in IEICE TRANSACTIONS ON FUNDAMENTALS, Vol. E75-A, No. 12, December, 1992. In FIG. 7, the multiplier includes a first squaring circuit made of MOS transistors M61, M62, M63 and M64 and a first constant current source (current: $I_0$) for driving the transistors M61, M62, M63 and M64, and a second squaring circuit made of MOS transistors M65, M66, M67 and M68 and a second constant current source (current: $I_0$) for driving the transistors M65, M66, M67 and M68. The transistors M61, M62, M63, M64, M65, M66, M67 and M68 are equal in capacity or ratio (W/L) of a gate-width W to a gate-length L to each other.

The first and second squaring circuits are termed "quadritail circuits" or "quadritail cells" in which four transistors are driven by a common constant current source, respectively.

In the first quadritail circuit, sources of the transistors M61, M62, M63 and M64 are connected in common to the first constant current source. Drains of the transistors M61 and M62 are coupled together and drains of the transistors M63 and M64 are coupled together. A gate of the transistor M61 is applied with a first input voltage $V_x$, and a gate of the transistor M62 is applied in opposite phase with a second input voltage $V_y$, or $-V_y$. Gates of the transistor M63 and M64 are coupled together to be applied with the middle level of the voltage applied between the gates of the transistors M61 and M62, or $(½)(V_x+V_y)$, which is obtained through resistors (resistance: R).

Similarly, In the second quadritail circuit, sources of the transistors M65, M66, M67 and M68 are connected in common to the second constant current source. Drains of the transistors M65 and M66 are coupled together and drains of the transistors M67 and M68 are coupled together. A gate of the transistor M65 is applied with the first input voltage $V_x$, and a gate of the transistor M66 is applied with the second input voltage $V_y$. Gates of the transistor M67 and M68 are coupled together to be applied with the middle level of the voltage applied between the gates of the transistors M65 and M66, or $(½)(V_x-V_y)$, which is obtained through resistors (resistance: R).

Between the first and second quadritail circuits, the drains coupled together of the transistors M61 and M62 and the drains coupled together of the transistors M67 and M68 are further coupled together to form one of differential output ends of the multiplier. The drains coupled together of the transistors M63 and M64 and the drains coupled together of the transistors M65 and M66 are further coupled together to form the other of the differential output ends thereof.

The transfer characteristics and the transconductance characteristics of the multiplier are shown in FIGS. 8 and 9, respectively. A differential output current ΔI shown in FIG. 8 is defined as the difference of output currents $I_P$ and $I_Q$ shown in FIG. 7, or $(I_p-I_Q)$.

FIG. 8 shows the relationship between the differential output current ΔI and the first input voltage $V_x$ with the second input voltage $V_y$ as a parameter. FIG. 9 shows the relationship between the transconductance $(d\Delta I/dV_x)$ and the first input voltage $V_x$ with the second input voltage $V_y$ as a parameter.

Further prior-art multiplier is shown in FIG. 10, which was developed by Wang and termed the "Wang cell". This is disclosed in IEEE Journal of Solid-State Circuits, Vol. 26, No. 9, September, 1991. The circuit in FIG. 10 is modified by the inventor, Kimura, to clarify its characteristics In FIG. 10, the multiplier includes one quadritail circuit made of MOS transistors M71, M72, M73 and M74 and a constant current source (current: $I_0$) for driving the transistors M71, M72, M73 and M74. The transistors M71, M72, M73 and M74 are equal in capacity (W/L) to each other.

Sources of the transistors M71, M72, M73 and M74 are connected in common to the constant current source. Drains of the transistors M71 and M74 are coupled together to form one of differential output ends of the multipliers and drains of the transistors M72 and M73 are coupled together to form the other of the differential output ends thereof.

A gate of the transistor M71 is applied with a first input voltage $(½)V_x$ based on a reference point, and a gate of the transistor M72 is applied in opposite polarity with the first input voltage $V_x$, or $-V_x$ based on the reference point. A gate of the transistor M73 is applied with a voltage of the half difference of the first input voltage and a second input voltage, or $(½)(V_x-V_y)$. A gate of the transistor M74 is applied with the voltage $(½)(V_x-V_y)$ in opposite polarity, or $(-½)(V_x-V_y)$.

The transfer characteristics and the transconductance characteristics of the Wang's multipliers which were obtained through analysis by the inventor, are shown in FIGS. 11 and 12, respectively. A differential output current ΔI shown in FIG. 11 is defined as the difference of output currents $I_L$ and $I_R$ shown in FIG. 10, or $(I_L-I_R)$.

FIG. 11 shows the relationship between the differential output current ΔI and the first input voltage $V_x$ with the second input voltage $V_y$ as a parameter. FIG. 12 shows the relationship between the transconductance $(d\Delta I/dV_x)$ and the first input voltage $V_x$ with the second input voltage $V_y$ as a parameter.

The prior-art bipolar multiplier of FIG. 1 has input voltage ranges that is approximately equal to those of the conventional Gilbert multiplier cell. Each of the prior-art MOS multipliers of FIGS. 4, 7 and 10 has input voltage ranges of superior linearity that is comparatively wider than those of the Gilbert multiplier cell.

However, on operating at a low supply voltage such as 3 or 3.3 V, all of the prior-art multipliers cannot expand their input voltage ranges of superior linearity due to causes relating their circuit configurations.

SUMMARY OF THE INVENTION

Accordingly, an object of the present invention is to provide a multiplier that can realize wider input voltage ranges than those of the above prior-art ones at a low supply voltage such as 3 or 3.3 V.

Another object of the present invention is to provide a bipolar multiplier that can operate at a low supply voltage such as 3 or 3.3 V.

Still another object of the present invention is to provide an MOS multiplier that can be realized by the Complementary MOS (CMOS) process steps.

According to a first aspect of the present invention, a two-quadrant multiplier for multiplying first and second signals having a single multitail cell is provided.

This multiplier contains a pair of first and second transistors having input ends and output ends, a third transistor having an input end, and a constant current source for driving the pair of the first and second transistors and the third transistor.

The first signal is applied across the input ends of the pair, and the second signal is applied in a single polarity (i.e., either a positive or negative polarity) to the input end of the third transistor.

An output signal of the multiplier as a multiplication result of the first and second signals is derived from the output ends of the pair.

With the multiplier according to the first aspect of the present invention, the pair of the first and second transistors and the third transistor are driven by the common constant current source, and the first signal is applied across the input ends of the pair and the second signal is applied in a single phase to the input end of the third transistor. Also, the multiplication result of the first and second signals is derived from the output ends of the pair.

Therefore, the first, second and third transistors constitute a multitail cell, and they are driven at the same supply voltage. This means that the multiplier according to the first aspect can operate at a low supply voltage such as 3 or 3.3 V.

Also, wider input voltage ranges than those of the prior-art ones can be obtained.

When the first, second and third transistors are made of bipolar transistors, a new bipolar multiplier that can operate at a low supply voltage such as 3 or 3.3 V is provided, instead of the Gilbert multiplier cell.

When the first, second and third transistors are made of MOSFETS, the multiplier can be realized by the CMOS process steps.

The first and second transistors may be made of bipolar transistors or MOSFETs. In the case of bipolar transistors, bases and collectors of the bipolar transistors act as the input ends and output ends of the pair, respectively. In the case of MOSFETS, gates and drains of the MOSFETs act as the input ends and output ends of the pair, respectively.

Similarly, the third transistor may be made of a bipolar transistor or an MOSFET. In the case of a bipolar transistor, a base of the bipolar transistor acts as the input end of the third transistor. In the case of an MOSFET, a gate of the MOSFET acts as the input end of the third transistor.

In addition, when the pair of the first and second transistors are made of bipolar transistors, the third transistor may be made of a bipolar transistor or an MOSFET. Even when the pair of the first and second transistors are made of MOSFETs, the third transistor may be made of a bipolar transistor or an MOSFET.

Further in additions the third transistor may either be of the same type as the pair of the first and second transistors, or be of the opposite type as the pair. The type of a bipolar transistor, can either be npn and pnp, or the type of channel conductivity of an MOSFET, can either be n- and p-channels.

The first and second transistors forming the pair need to be the same in type and in capacity (e.g., emitter area for bipolar transistors and gate-width to gate-length ratio W/L for MOSFETs). On the other hand, the third transistor is optional in type and capacity.

In a preferred embodiment of the multiplier according to the first aspect, the pair of the first and second transistors and/or the third transistor are made of bipolar transistors, and emitters of the first and second transistors and/or an emitter of the third transistor may have resistors or diodes for emitter degeneration purpose.

In this case, the input voltage ranges become wider than the case of no such resistors and diodes as above.

In another embodiment of the first aspect, a dc voltage is applied to one of the input ends of the pair, and a first resistor is connected between the other of the input ends and the input end of the third transistor. The second signal is applied through a second resistor to the input end of the third transistor. There is an additional advantage that no differential input is required for the multiplier.

In still another preferred embodiment of the first aspect, the first, second and third transistors are made of bipolar transistors, and the third transistor has an emitter area of K times as large as those of the first and second transistors, where K=1 or K≧2. If the second input signal and the thermal voltage are defined as $V_2$ (V) and $V_T$ (V), respectively, such a relationship as $V_2=v_T \cdot \ln(4/K)$ is approximately satisfied.

The multiplier according to the first aspect may include at least one additional transistor. The at least one additional transistor has an input end connected to the input end of the third transistor and is driven by the same constant current source.

In the case of one additional transistor, the combination of the third and additional transistors are equivalent to one transistor whose emitter area or gate-width to gate-length ratio is twice as much as those of the first and second transistors.

In general, if the multiplier contains n additional transistors, where n≧1, the third transistor and the n additional transistors are equivalent to one transistor whose emitter area or gate-width to gate-length ratio is (n+1) times as much as those of the first and second transistors.

According to a second aspect of the present inventions a four-quadrant multiplier for multiplying first and second signals is provided, which contains first and second multitail cells.

The first multitail cell contains a first pair of first and second transistors having input ends and output ends, a third transistor having an input end, and a first constant current source for driving the first pair of the first and second transistors and the third transistor.

The second multitail cell contains a second pair of fourth and fifth transistors having input ends and output ends, a sixth transistor having an input end, and a second constant current source for driving the second pair of the fourth and fifth transistors and the sixth transistor.

The output ends of the first pair are coupled with the output ends of the second pair in opposite polarities.

The first signal is applied across the input ends of the first pair and across the input ends of the second pair in the same phase.

The second signal is applied across the input end of the third transistor and the input end of the sixth transistor. In other words, the second signal is applied in a polarity (e.g., in a negative polarity) to the input end of the third transistor, and the second signal is applied in an opposite polarity (e.g., in a positive polarity) to the input end of the sixth transistor.

An output signal as a multiplication result of the first and second signals is derived from the coupled output ends of the first and second pairs.

With the multiplier according to the second aspect of the present inventions the first pair of the first and second transistors and the third transistor are driven by the first constant current source, the second pair of the fourth and fifth transistors and the sixth transistor are driven by the second constant current source. The first signal is applied across the input ends of the first pair and across those of the second pair, and the second signal is applied across the input ends of the third and sixth transistors. The multiplication result of the first and second signals is derived from the coupled output ends of the first and second pairs.

Therefore, the first, second, third, fourth, fifth, and sixth transistors are driven at the same supply voltage, which means that the multiplier according to the second aspect can operate at a low supply voltage such as 3 or 3.3 V.

Also, since the output ends of the first multitail cell and those of the second multitail cell are coupled with each other in opposite phases, the non-linearities of the transfer characteristics of the first and second cells are cancelled with each other, resulting in wider input voltage ranges for good transconductance linearity than those of the conventional ones.

Similar to the two-quadrant multiplier according to the first aspect, when the four-quadrant multiplier according to the second aspect is made of bipolar transistors, a new bipolar multiplier that can operate at a low supply voltage such as 3 or 3.3 V is provided When the multiplier is made of MOSFETs, it can be realized by the CMOS process steps.

As each of the first and second multitail cells, the multiplier according to the first aspect can be employed.

In a preferred embodiment, the multiplier according to the second aspect includes first and second compensation circuits for compensating in transconductance linearity the first and second multitail cells. These compensation circuits are the same in configuration.

Each of the first and second compensation circuits has a first converter for converting an initial differential input voltage into a differential current, and a second converter for converting the differential current thus obtained to produce a compensated differential input voltage that acts as the first or second signal to be multiplied.

Preferably, the first converter is composed of a differential pair of two transistors and two diodes connected to differential output ends of the differential pair. The diodes act as loads for the respective transistors. The initial differential input voltage is applied across the input ends of the differential pair. The compensated differential input voltage is derived from the output ends of the pair.

The transistors forming the differential pair of each compensation circuit may be made of bipolar transistors or MOSFETs. The diodes thereof may be made from bipolar transistors or MOSFETs that are diode-connected.

In the present invention, the word “multitail cell” means that a circuit cell containing three or more transistors driven by a common constant current source, in which all currents passing through the respective transistors are defined by a constant current of the current source.

DETAILED DESCRIPTION OF THE PREFERRED EMBODIMENTS

Preferred embodiments of the present invention will be described below referring to FIGS. 13 to 56.

[Basic Configuration]

Figure 1:
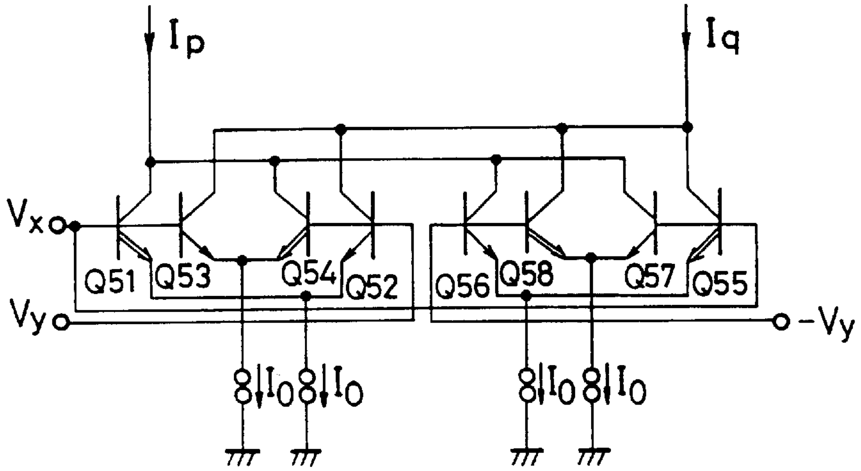
FIG. 1 PRIOR ART
FIG. 1 is a circuit diagram showing a first prior-art multiplier.
Figure 4:
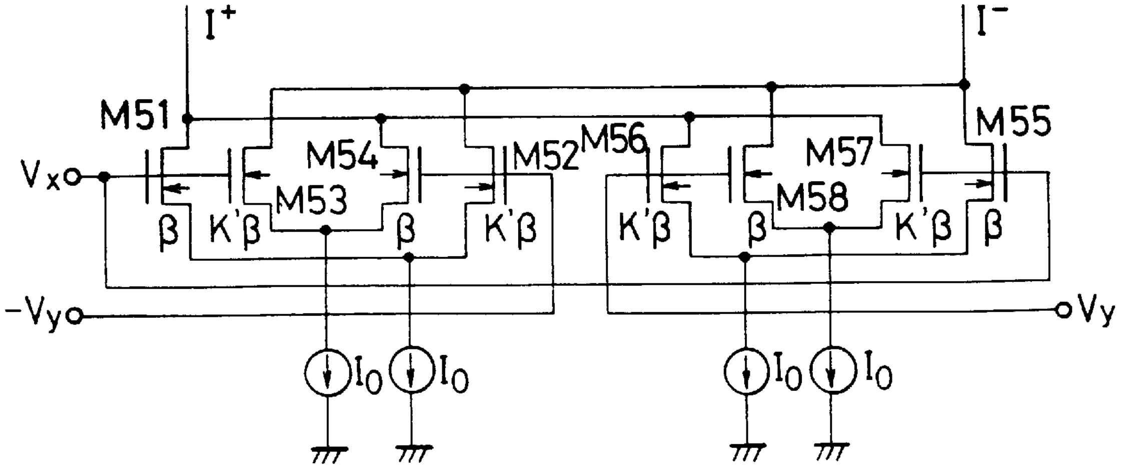
FIG. 4 PRIOR ART
FIG. 4 is a circuit diagram showing a second prior-art multiplier.
Figure 2:
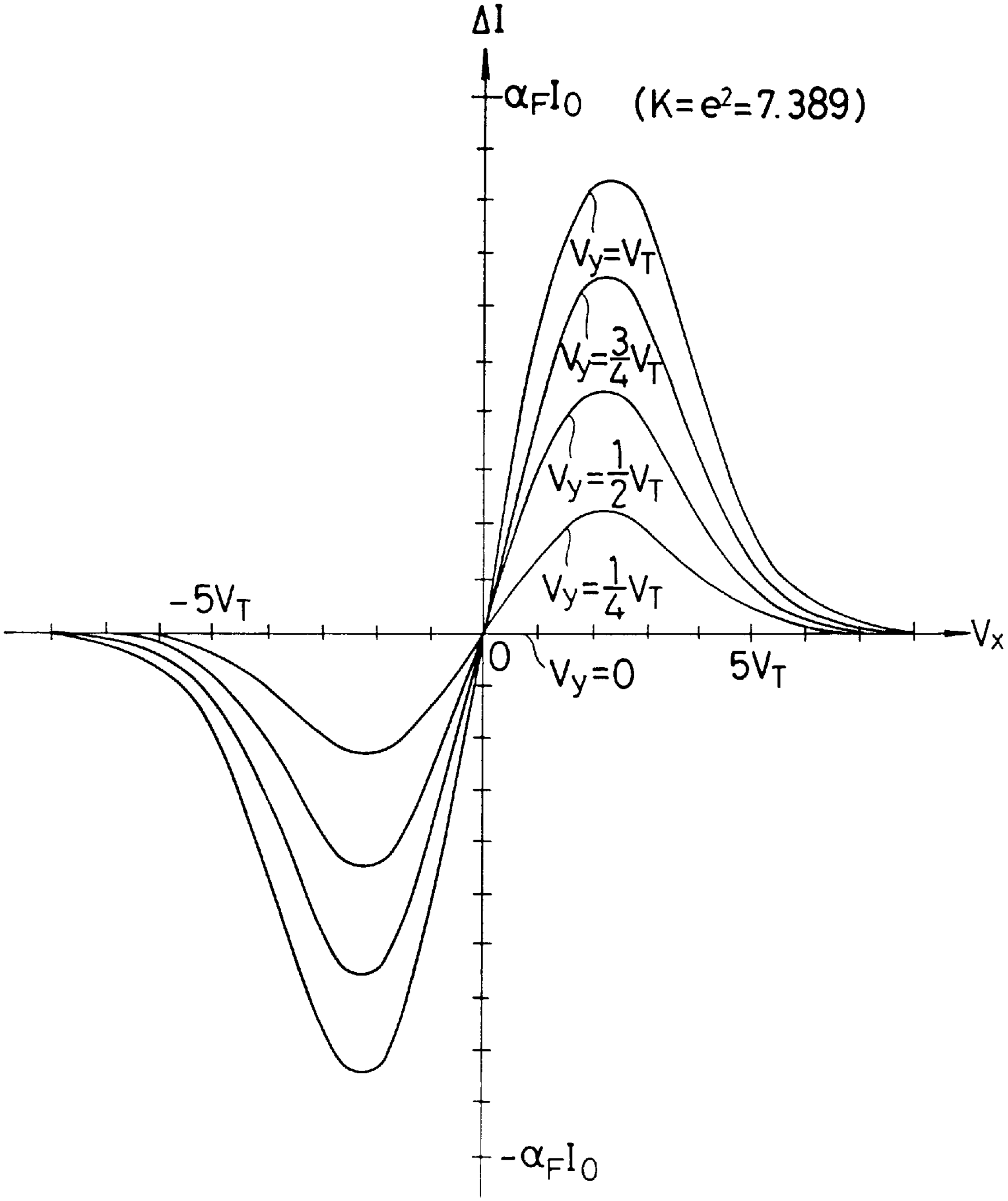
FIG. 2 PRIOR ART
FIG. 2 is a graph showing the transfer characteristic of the first prior-art multiplier shown in FIG. 1.
Figure 3:
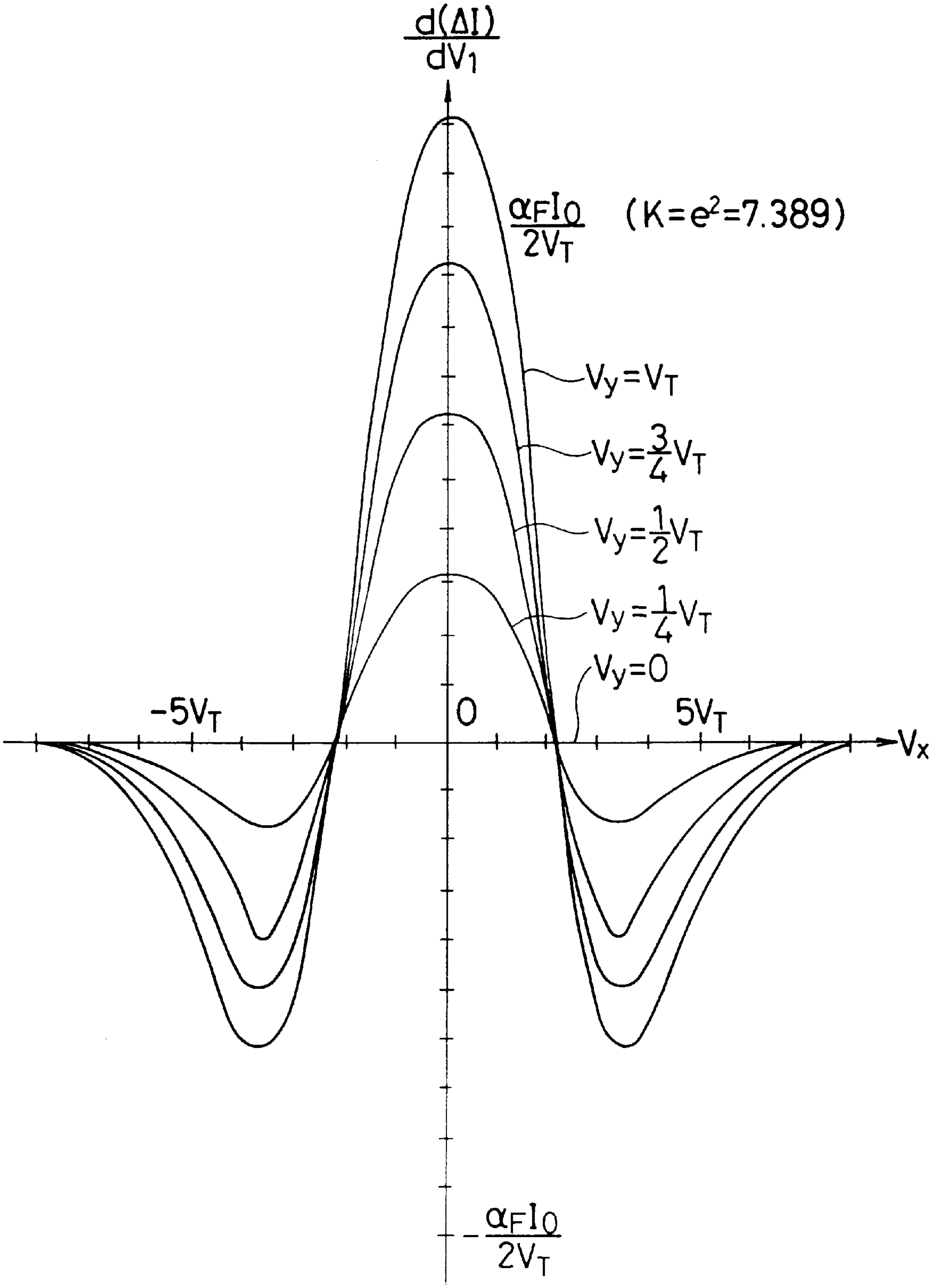
FIG. 3 PRIOR ART
FIG. 3 is a graph showing the transconductance characteristic of the first prior-art multiplier shown in FIG. 1.
Figure 5:
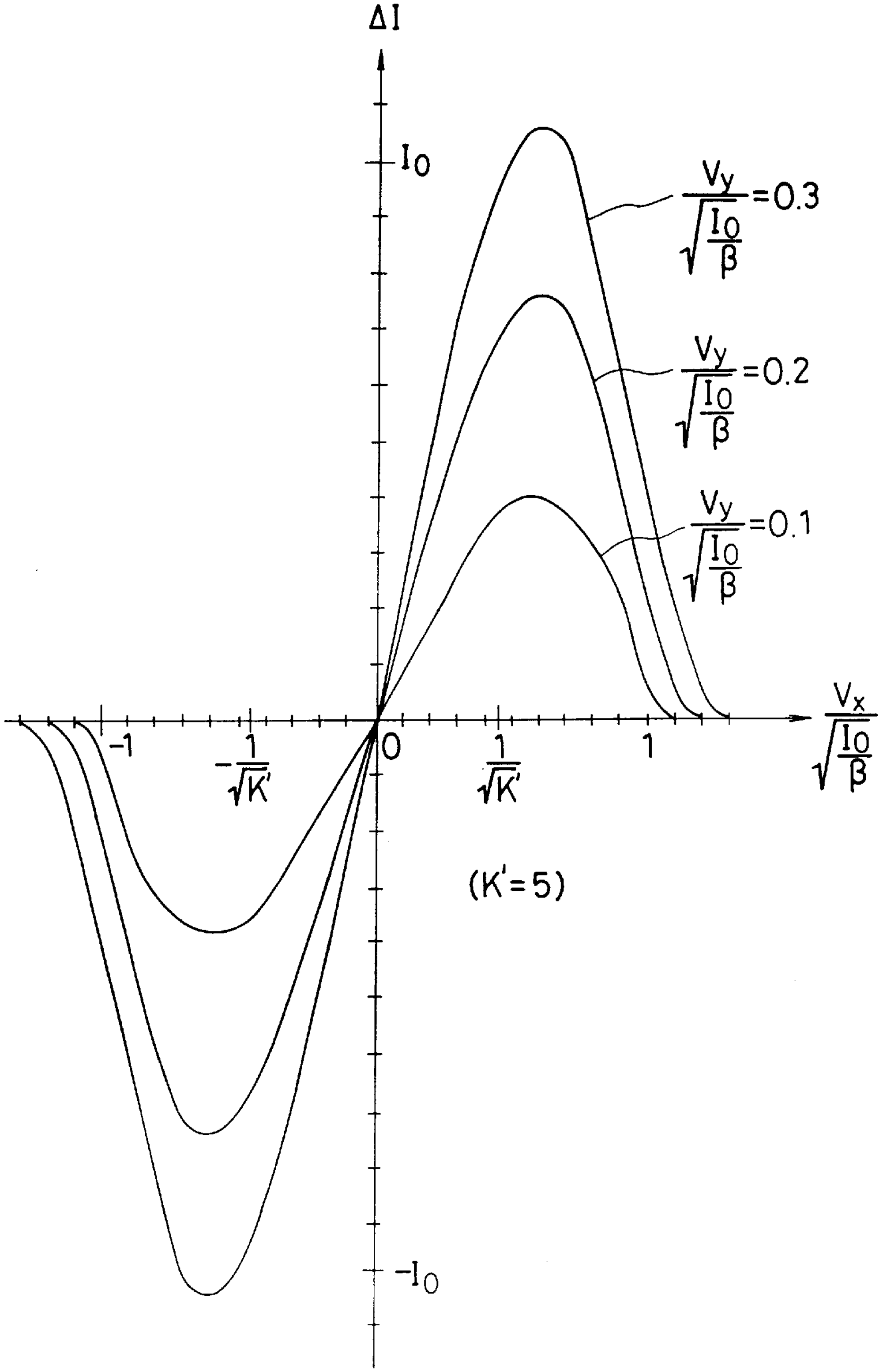
FIG. 5 PRIOR ART
FIG. 5 is a graph showing the transfer characteristic of the second prior-art multiplier shown in FIG. 4.
Figure 6:
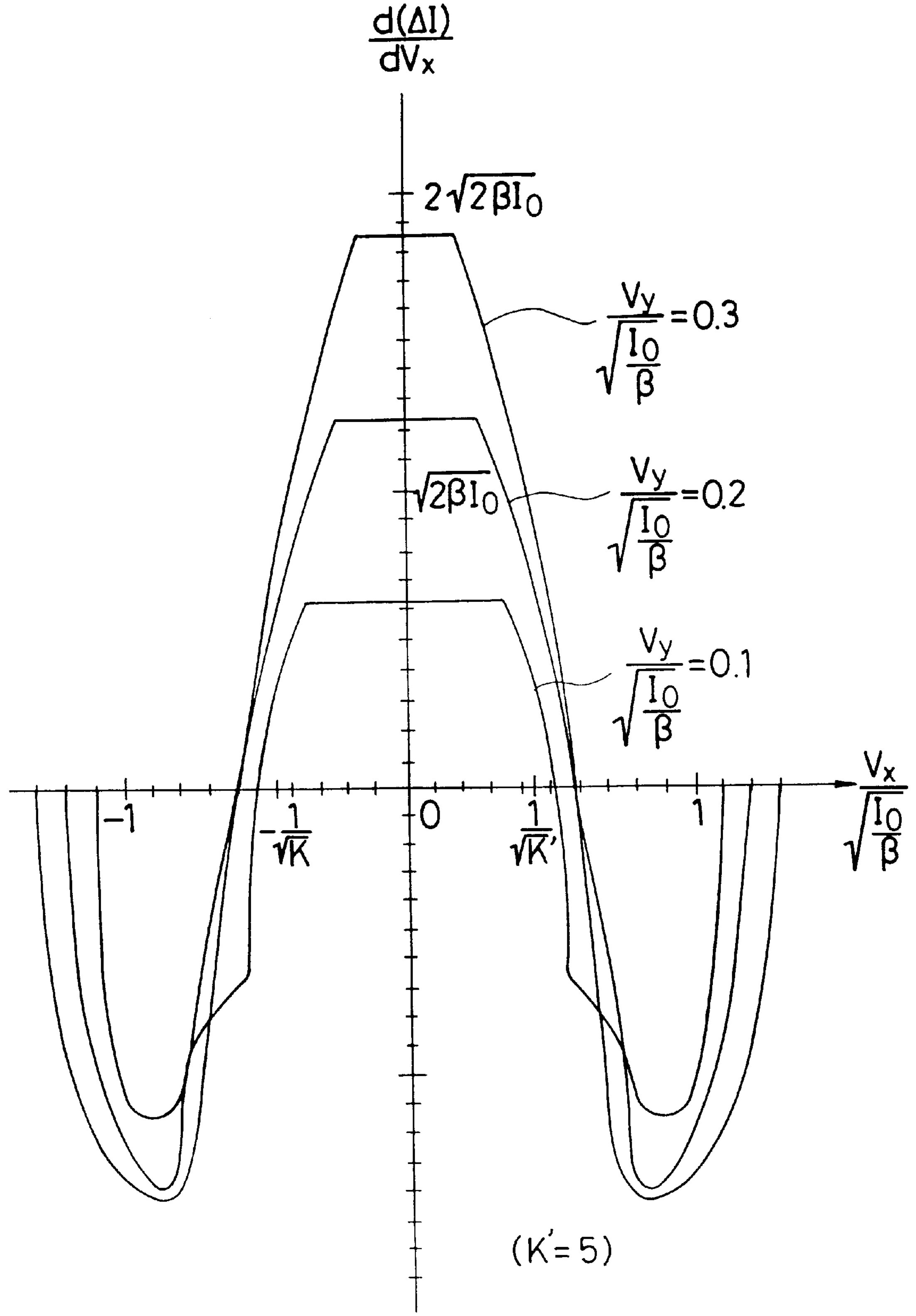
FIG. 6 PRIOR ART
FIG. 6 is a graph showing the transconductance characteristic of the second prior-art multiplier shown in FIG. 4.
Figure 7:
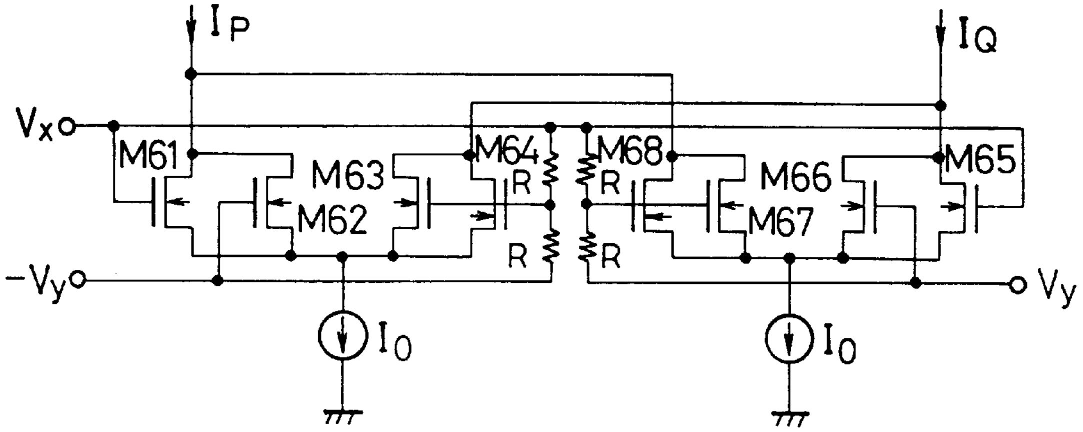
FIG. 7 PRIOR ART
FIG. 7 is a circuit diagram showing a third prior-art multiplier.
Figure 10:
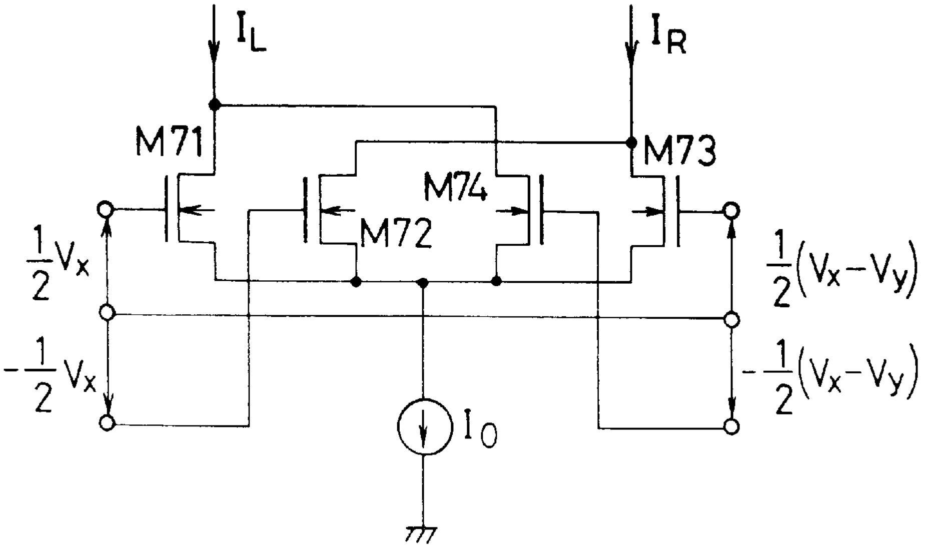
FIG. 10 PRIOR ART
FIG. 10 is a circuit diagram showing a fourth prior-art multiplier.
Figure 8:
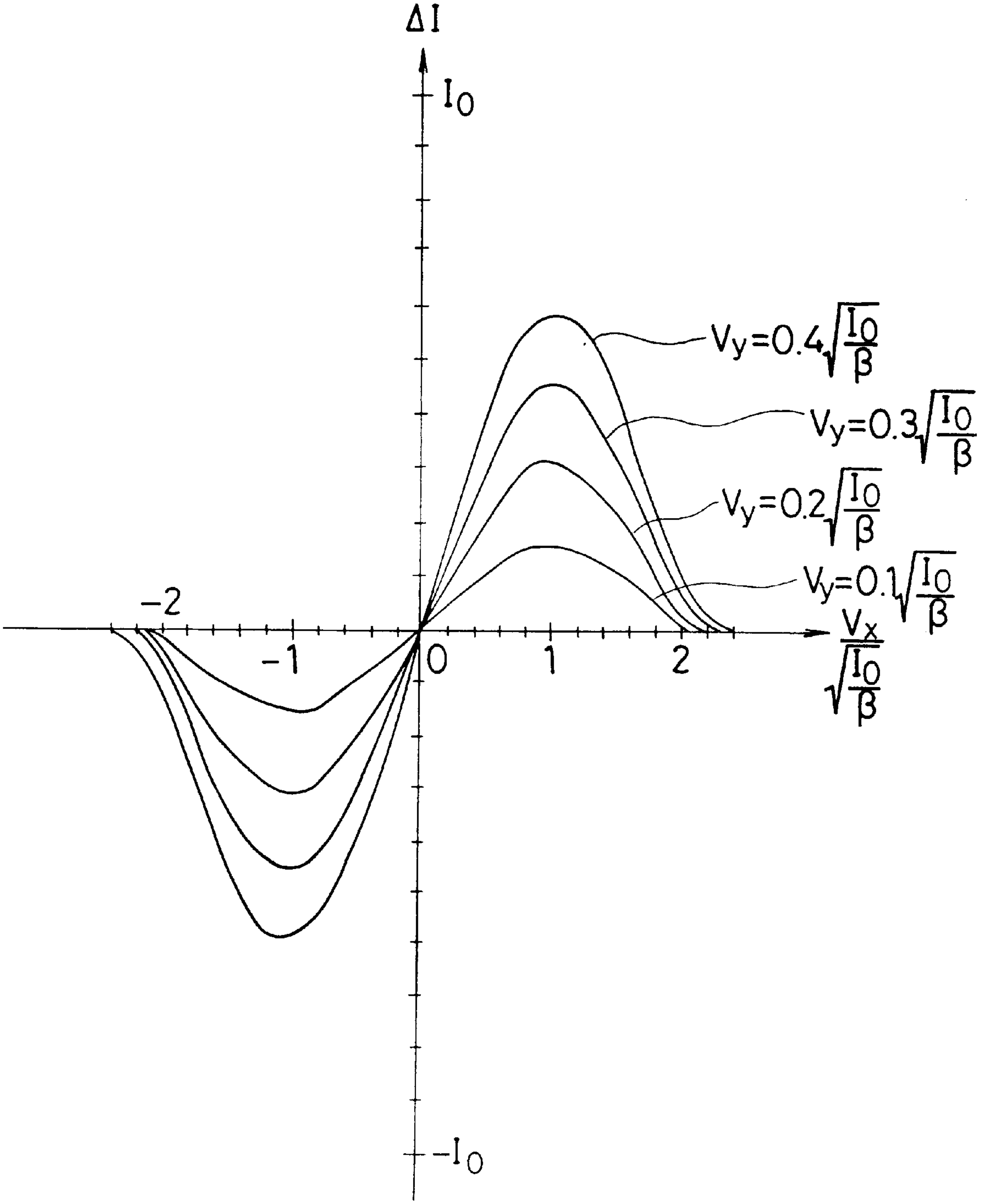
FIG. 8 PRIOR ART
FIG. 8 is a graph showing the transfer characteristic of the third prior-art multiplier shown in FIG. 7.
Figure 9:
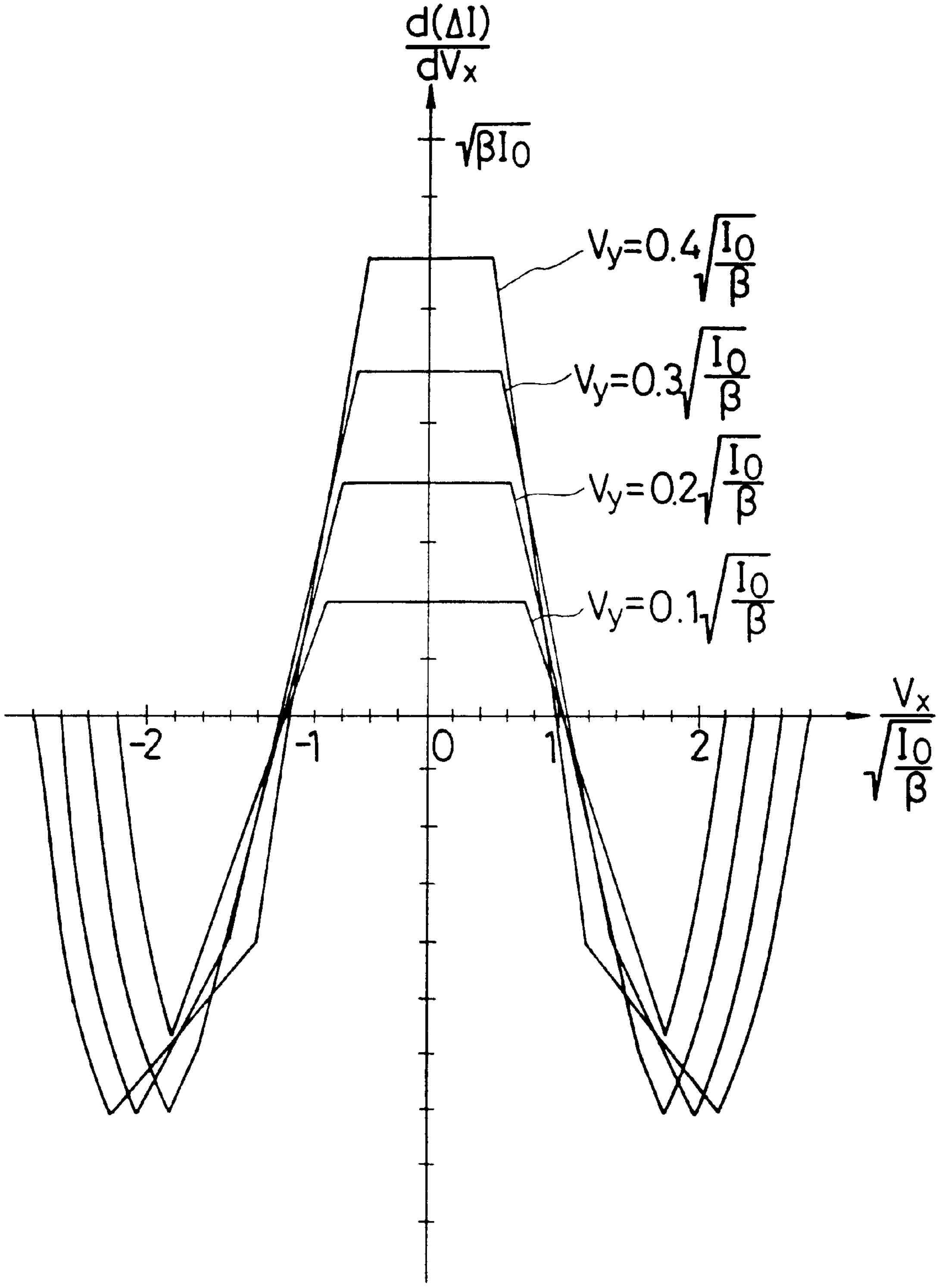
FIG. 9 PRIOR ART
FIG. 9 is a graph showing the transconductance characteristic of the third prior-art multiplier shown in FIG. 7.
Figure 11:
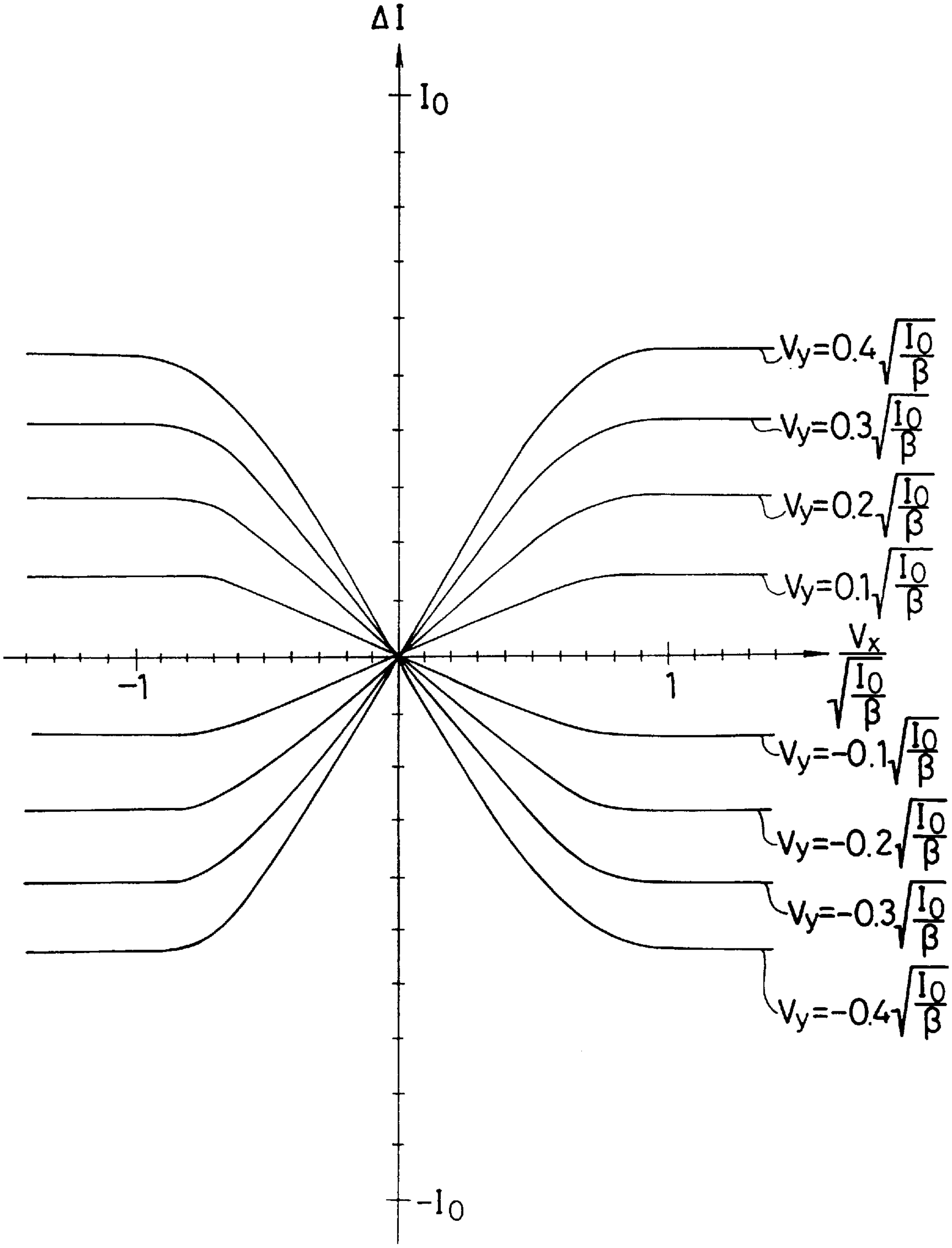
FIG. 11 PRIOR ART
FIG. 11 is a graph showing the transfer characteristic of the fourth prior-art multiplier shown in FIG. 10.
Figure 12:
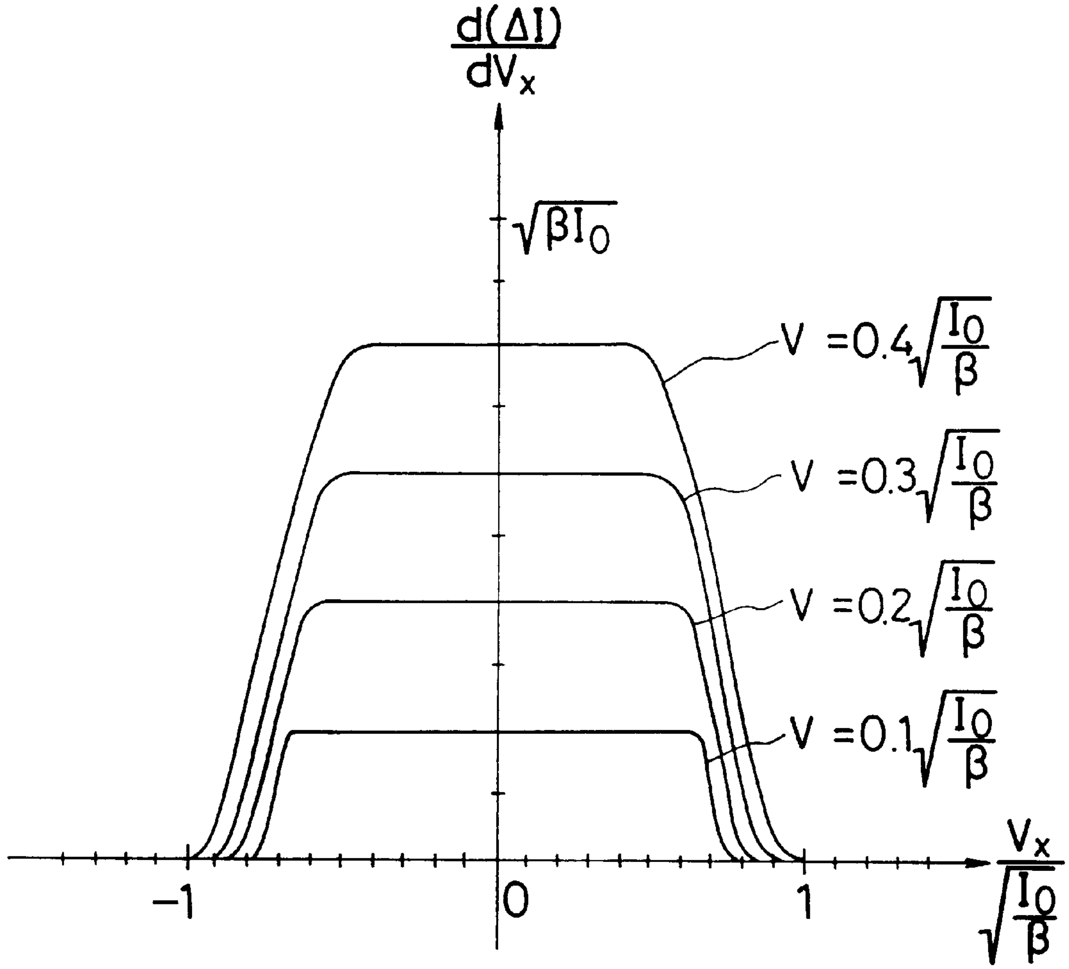
FIG. 12 PRIOR ART
FIG. 12 is a graph showing the transconductance characteristic of the fourth prior-art multiplier shown in FIG. 10.
Figure 13:
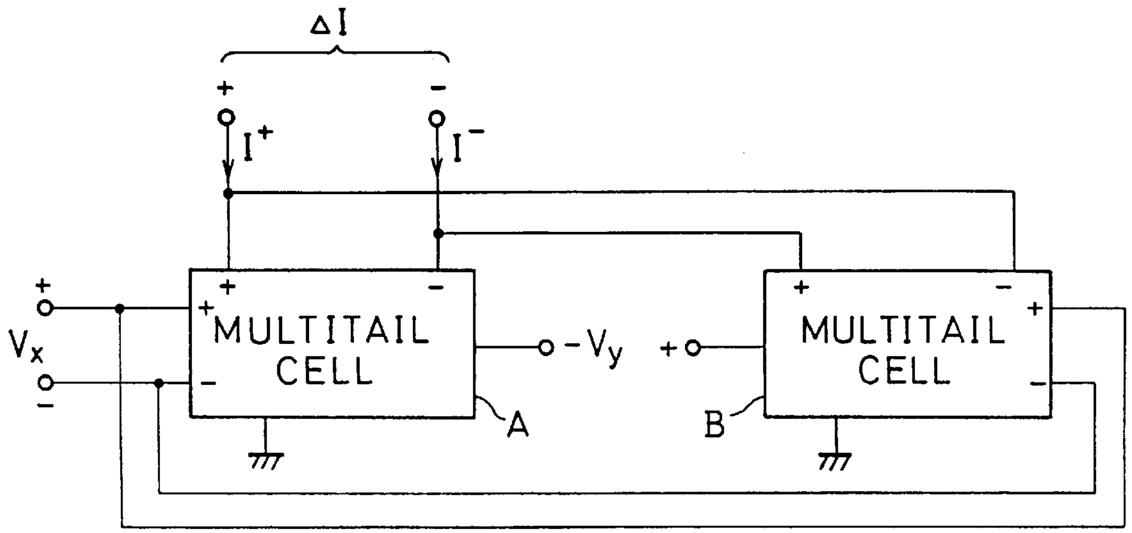
FIG. 13 is a block diagram showing the basic configuration of a multiplier according to the invention.

FIG. 13 is a block diagram showing the basic configuration of a two-quadrant analog multiplier according to the invention.

As shown in FIG. 13, the multiplier contains a first multitail cell A and a second multitail cell B, both of which are the same in circuit configuration. Each of the first and second multitail cells A and B is a circuit cell containing three or more transistors driven by a common constant current source, in which all currents passing through the respective transistors are defined by a constant current of the current source.

A first signal (voltage: $V_x$) is applied across a first differential input ends of the cell A and across a second differential input ends of the cell B. A second signal (voltage: $V_y$) is applied in negative phase to a first input end of the cell A and is applied in positive phase to a second input end of the cell B.

Differential output ends of the cell A are coupled with differential output ends of the cell B in opposite polarities, respectively. In other words, the differential output ends of the cell A and those of the cell B are cross-coupled.

Output currents $I^+$ and $I^-$ forming a differential output current $\Delta I$ are derived from the cross-coupled differential output ends of the cells A and B. The differential output current $\Delta I$ provides a multiplication result of the first and second signals $V_x$ and $V_y$.

With the multiplier shown in FIG. 13, although the first signal $V_x$ may be both positive and negative for the multitail cells A and B, the second signal $V_y$ is only positive for the cell B and negative for the cell A. This means that this multiplier is a two-quadrant one.

It has been known that a two-quadrant multiplier generally has a comparative narrow range of satisfactorily linear transconductance. Then, to improve the transconductance linearity, the inventor, Kimura, has developed several improved multipliers of this type by combining a plurality of the multipliers. The multiplier of the present invention also is due to his development.

This multiplier of the invention features its multitail cells, so that the multitail cell itself is explained below prior to the description for the combination of the multitail cells.

The number of the transistors constituting each multitail cell is optional if it is 3 or more. Therefore, the number may be 5 or more; however, only a "triple-tail cell" containing three transistors and a "quadritail cell" containing four transistors are described here.

FIG. 13 shows the basic configuration of the multiplier having two multitail cells; however, the invention is not limited to the multiplier of this type, and only one of the multitail cells A and B itself may be used as a two-quadrant multiplier. But, the input voltage ranges are limited to narrower than the case of two multitail cells.

[First Embodiment]

Figure 14:
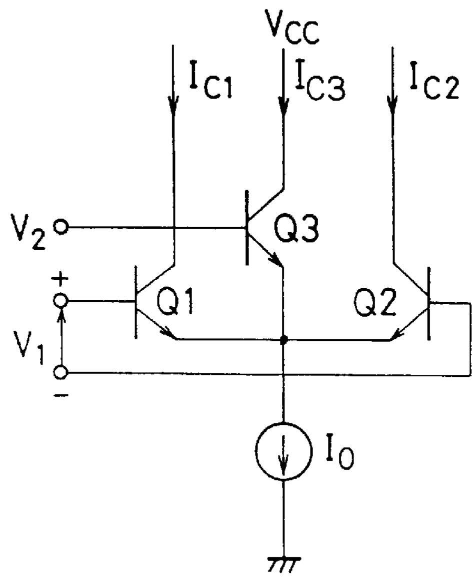
FIG. 14 is a circuit diagram of a multiplier containing one multitail cell according to a first embodiment of the invention.

FIG. 14 shows a two-quadrant analog multiplier according to a first embodiment, which is composed of only one triple-tail cell of bipolar transistors.

In FIG. 14, the triple-tail cell contains a differential pair of npn bipolar transistors Q1 and Q2, an npn bipolar transistor Q3, and a constant current source (current: $I_0$).

All the transistors Q1, Q2 and Q3 have emitters connected in common to one end of the constant current source, and they are driven by the same current source. The other end of the constant current source is grounded. All the transistors Q1, Q2 and Q3 are the same in emitter area.

A supply voltage $V_{CC}$ is applied to a collector of the transistor Q3.

A first signal or a differential voltage $V_1$ is applied across differential input ends of the pair, i.e., bases of the transistors Q1 and Q2. A second signal or a differential voltage $V_2$ is applied in positive or negative phase (or polarity) to an input end or a base of the transistor Q3.

Then, supposing that the transistors Q1, Q2 and Q3 are matched in characteristic and ignoring the base-width modulation, collector currents $I_{C1}$, $I_{C2}$ and $I_{C3}$ of the respective transistors Q1, Q2 and Q3 can be expressed as the following equations (1), (2) and (3), respectively.

$$I_{C1} = I_S \exp\left(\frac{V_R - V_A + \frac{1}{2}V_1}{V_T}\right) \tag{1}$$

$$I_{C2} = I_S \exp\left(\frac{V_R - V_A - \frac{1}{2}V_1}{V_T}\right) \tag{2}$$

$$I_{C3} = I_S \exp\left(\frac{V_R - V_A + V_2}{V_T}\right) \tag{3}$$

In the equations (1), (2) and (3), $V_T$ is the thermal voltage of the transistors Q1, Q2 and Q3 defined as $V_T$=kT/q where k is the Boltzmann's constant, T is absolute temperature in degrees Kelvin and q is the charge of an electron. Also, $I_S$ is the saturation current, $V_R$ is a dc component of the first input voltage, and $V_A$ is a common emitter voltage, i.e., a voltage at a connection point of the emitters of the transistors Q1, Q2 and Q3.

Tail currents of the triple-tail cell, i.e., the collector currents $I_{C1}$, $I_{C2}$ and $I_{C3}$, satisfies the following equation.

$$I_{C1}+I_{C2}+I_{C3}=\alpha_F I_0 \tag{4}$$

where $\alpha_F$ is the dc common-base current gain factor of the transistors Q1, Q2 and Q3.

The common term $I_S \cdot \exp\{(V_R - V_A)/V_T\}$ contained in the equations (1), (2) and (3) is given as the following equation (5) by solving the equations (1) to (4).

$$I_S \exp\left(\frac{V_R - V_A}{V_T}\right) = \frac{\alpha_F I_0}{\left\{2\cosh\left(\frac{V_1}{2V_T}\right) + \exp\left(\frac{V_2}{V_T}\right)\right\}} \tag{5}$$

A differential output current $\Delta I_C$ ($=I_{C1}-I_{C2}$) of the triple-tail cell is given by the following equation (6).

$$\Delta I_C = I_{C1} - I_{C2} = \frac{2\alpha_F I_0 \sinh\left(\frac{V_1}{2V_T}\right)}{\left\{2\cosh\left(\frac{V_1}{2V_T}\right) + \exp\left(\frac{V_2}{V_T}\right)\right\}} \tag{6}$$

Figure 15:
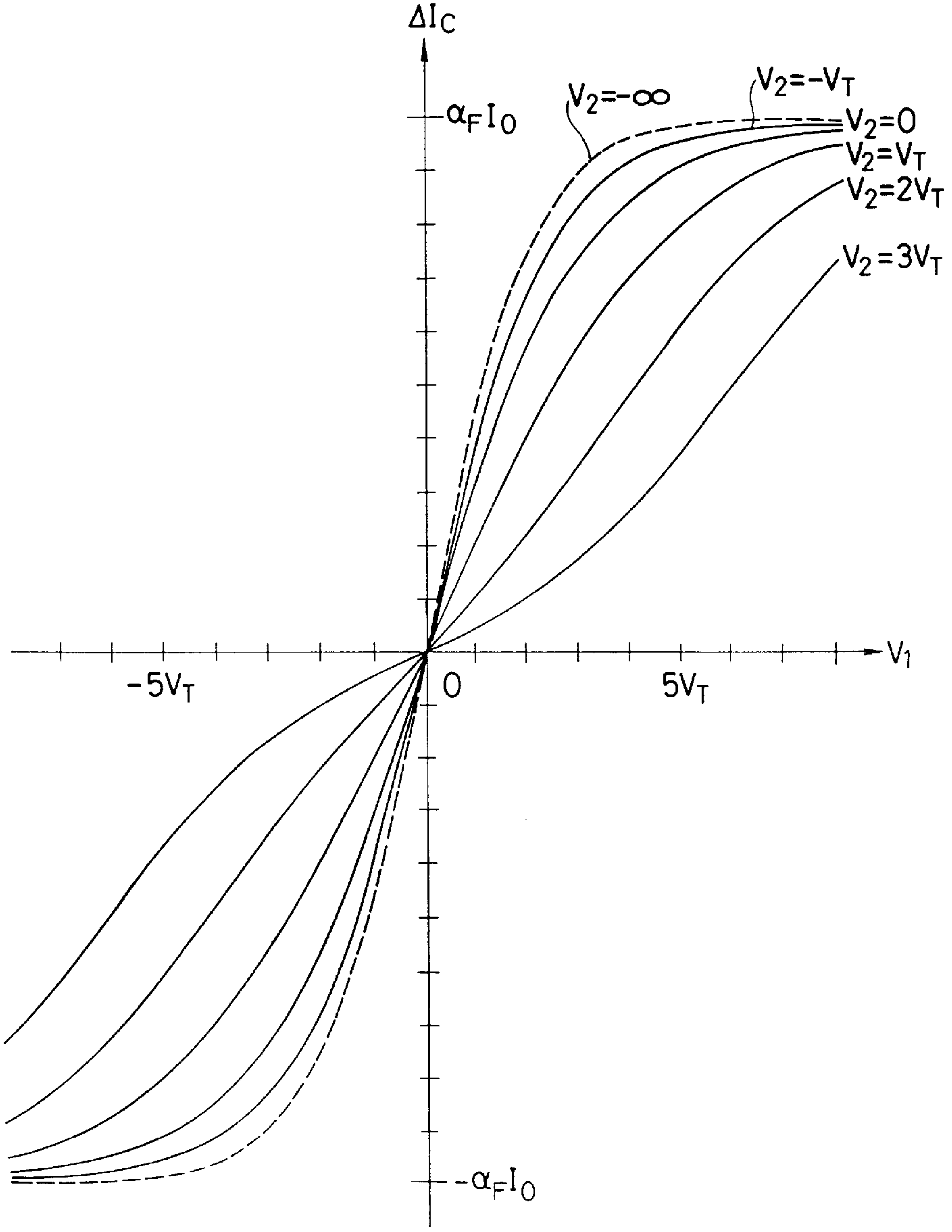
FIG. 15 is a graph showing the transfer characteristic of the multiplier of FIG. 14 according to the first embodiment.

FIG. 15 shows the transfer characteristic of the bipolar triple-tail cell or the multiplier according to the first embodiment, which shows the relationship between the differential output current $\Delta I_C$ and the first input voltage $V_1$ with the second input voltage $V_2$ as a parameter.

It is seen from FIG. 15 that the differential output current $\Delta I_C$ increases monotonously and has a limiting characteristic concerning the first input voltage $V_1$. On the other hand, concerning the second input voltage $V_2$, it is seen that the current $\Delta I_C$ has a limiting characteristic only for a negative value of $V_2$ and it varies within a very narrow range for the negative value of $V_2$ although the current $\Delta I_C$ increases monotonously.

The transconductance characteristics of the multiplier according to the first embodiment can be given by differentiating the differential output current $\Delta I_C$ by the first or second input voltage $V_1$ or $V_2$ in the equation (6), resulting in the following equations (7) and (8).

$$\frac{d(\Delta I_C)}{dV_1} = \frac{\alpha_F I_0}{V_T} \times \frac{\left(2+\cosh\left(\frac{V_1}{2V_T}\right)\exp\left(\frac{V_2}{V_T}\right)\right)}{\left\{2\cosh\left(\frac{V_1}{2V_T}\right)+\exp\left(\frac{V_2}{V_T}\right)\right\}^2} \tag{7}$$

$$\frac{d(\Delta I_C)}{dV_2} = -\frac{2\alpha_F I_0}{V_T} \times \frac{\sinh\left(\frac{V_1}{2V_T}\right)\exp\left(\frac{V_2}{V_T}\right)}{\left\{2\cosh\left(\frac{V_1}{2V_T}\right)+\exp\left(\frac{V_2}{V_T}\right)\right\}^2} \tag{8}$$

Figure 16:
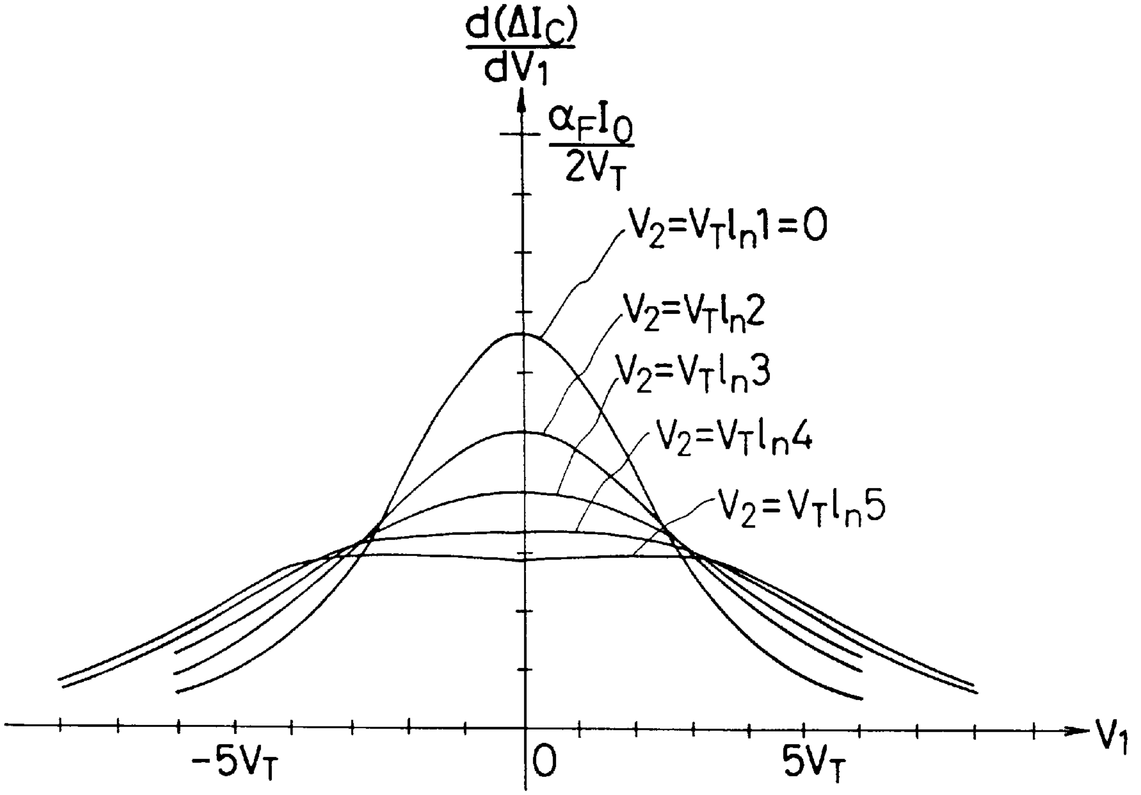
FIG. 16 is a graph showing the transconductance characteristic of the multiplier of FIG. 14 according to the first embodiment.

The equation (7) represents the transconductance characteristic for the first input voltage $V_1$, which is shown in FIG. 16. The equation (8) represents that for the second input voltage $V_2$.

It is seen that the triple-tail cells i.e., two-quadrant analog multiplier according to the first embodiment is expanded in linear transconductance range for the first input voltage $V_1$.

To make the transconductance characteristic linear for the first input voltage $V_1$, the second input voltage $V_2$ needs to satisfy the following relationship as $$exp(V_2/V_T)=4$$

This relationship is obtained by differentiating the above equation (6) by the voltage $V_1$ three times and obtaining a condition that makes a differential coefficient thus obtained maximally flat, i.e., $d^3(\Delta I_C)/dV_1^3=0$, at $V_1=0$.

It is not always required that the second input voltage $V_2$ exactly satisfies such the relationship as $\exp(V_2/V_T)=4$, because such an exact value of $V_2$ cannot be realized on a practical semiconductor integrated circuit device.

Generally, if the transistor Q3 has an emitter area of K times as large as those of the transistors Q1 and Q2, to make the transconductance characteristic linear for the first input voltage $V_1$, the second input voltage $V_2$ needs to satisfy the following relationship as $$exp(V_2/V_T)=4/K, \text{ or } V_2=V_T\cdot ln(4/K)$$

Here, since the transistor Q3 is the same in emitter area as the transistors Q2 and Q3, the above relationship, $\exp(V_2/V_T)=4$ is obtained.

As described above, with the triple-tail cell or multiplier according to the first embodiment, the transistors Q1, Q2 and Q3 are driven at the same supply voltage, which means that this multiplier can operate at a low supply voltage such as 3 or 3.3 V.

Also, an expanded input voltage range for good transconductance linearity can be obtained compared with those of the prior-art multipliers.

Further, this triple-tail cell provides a new bipolar analog multiplier that can operate at a low supply voltage such as 3 or 3.3 V, instead of the Gilbert multiplier cell.

[Second Embodiment]

Figure 14A:
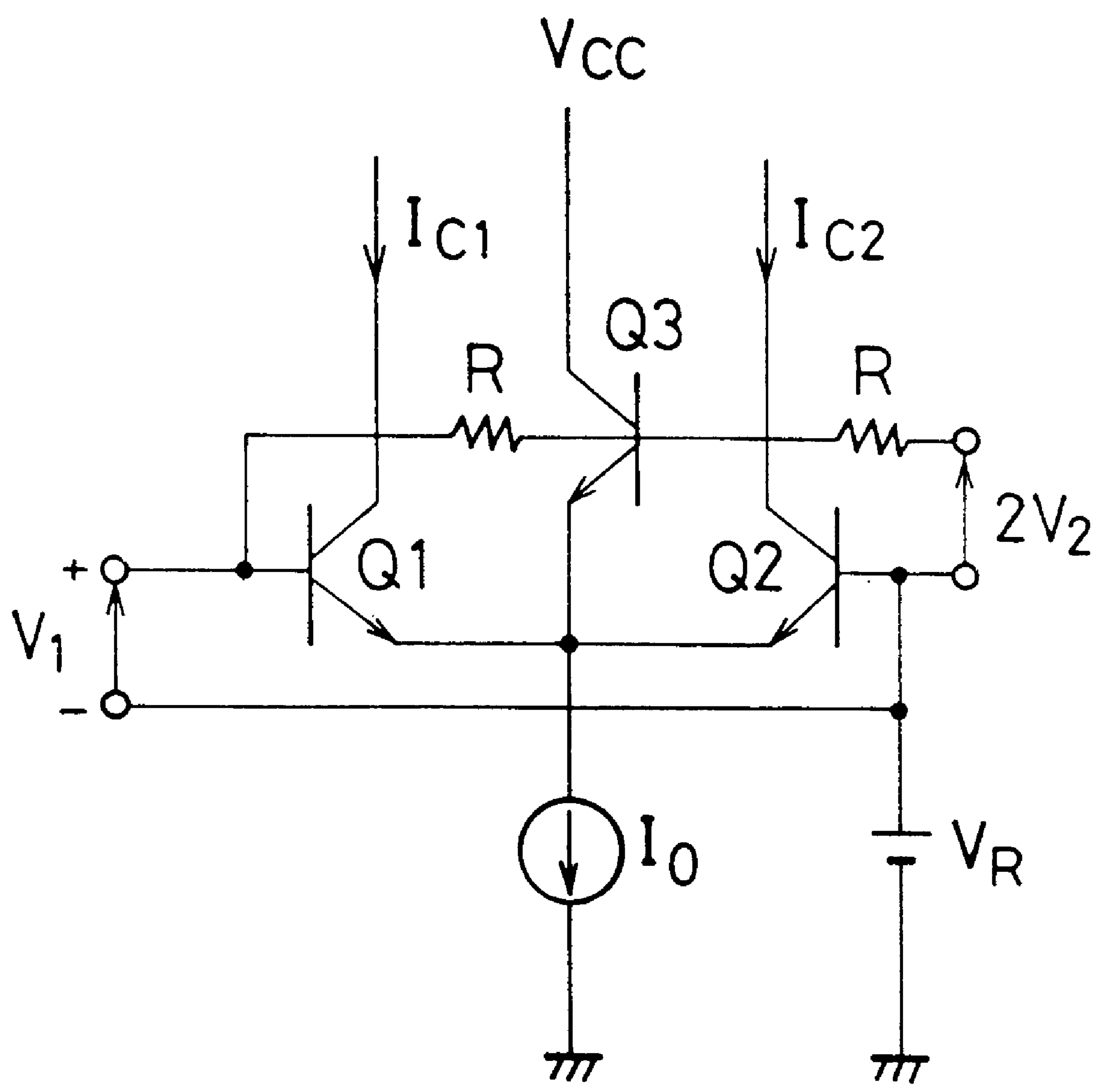
FIG. 14A is a circuit diagram of a multiplier containing one multitail cell according to a second embodiment of the invention.

FIG. 14A shows a two-quadrant analog multiplier according to a second embodiment, which is composed of only one triple-tail cell of bipolar transistors.

The second embodiment is a variation of the first embodiment as shown in FIG. 15, and is the same in circuit configuration as the first embodiment except for the following:

As shown in FIG. 14A, a pair of input terminals are provided for $V_1$ and another pair of input terminals are provided for $V_2$. The positive-side input terminal for $V_1$ is connected to the base of the transistor Q1, and the negative-side input terminal for $V_1$ is connected to the base of the transistor Q2. The negative-side input terminal for $V_2$ is connected to the base of the transistor Q2. The positive-side input terminal for $V_2$ is connected through a resistor R to the base of the transistor Q3. The base of the transistor Q3 is connected through another resistor R to the base of the transistor Q1 and the positive-side input terminal for $V_1$.

A first resistor (resistance: R) is connected between the bases of the transistors Q1 and Q3 and a second resistor (resistance: R) is connected to the base of the transistor Q3.

A voltage $(2V_2+V_R)$ is applied to the base of the transistor Q3; in other words, a voltage of twice the second input voltage $V_2$, or $2V_2$, is applied to the base of the transistor Q3 through the second resistor. Since the first and second resistors are the same in resistance value, a half of the voltage $2V_2$, i.e., $V_2$ is applied to the base of the transistor Q3.

As described above, the multiplier of the second embodiment is substantially the same in circuit configuration as the first embodiment, so that it provides the same effects or advantages as those of the first embodiment.

Also, in the first embodiment, the first input voltage $V_1$ needs to be applied differentially across the bases of the transistors Q1 and Q2. However, in this second embodiment, it is not required for the voltage $V_1$ to be differentially applied, which is an additional advantage of the second embodiment.

To be seen from the second embodiment, in general, the same operation or function is obtained even when the same voltage is additionally applied to the differential input ends of the differential pair of the first and second transistors Q1 and Q2 and the input end of the third transistor Q3.

[Third Embodiment]

Figure 17:
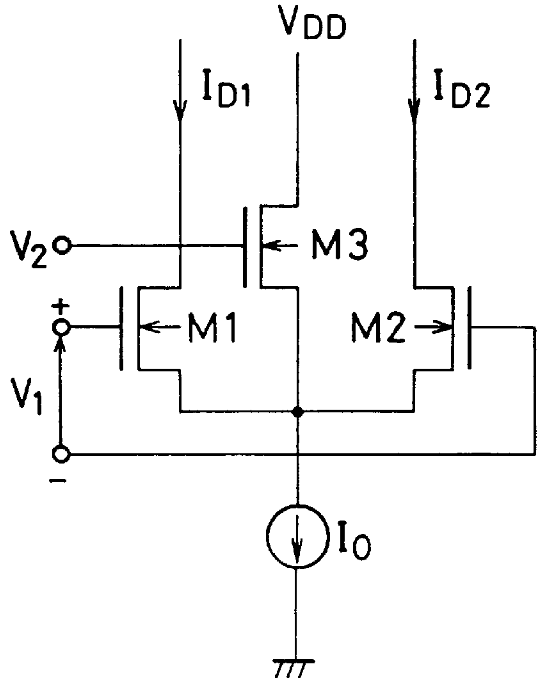
FIG. 17 is a circuit diagram of a multiplier containing one multitail cell according to a third embodiment of the invention.

FIG. 17 shows a two-quadrant analog multiplier according to a third embodiment, which is composed of only one triple-tail cell of MOSFETs. This is equivalent to one that the bipolar transistors Q1, Q2 and Q3 are replaced by MOSFETs in the first embodiment.

In FIG. 17, the triple-tail cell contains a differential pair of n-channel MOSFETs M1 and M2, an n-channel MOSFET M3, and a constant current source (current: $I_0$).

All the transistors M1, M2 and M3 have sources connected in common to one end of the constant current source, and they are driven by the same current source. The other end of the constant current source is grounded. All the transistors M1, M2 and M3 are the same in transconductance parameter, i.e., gate-width to gate-length ratio.

A supply voltage $V_{DD}$ is applied to a drain of the transistor M3.

A first signal or a differential voltage $V_1$ is applied across differential input ends of the pair, i.e., gates of the transistors M1 and M2. A second signal or a differential voltage $V_2$ is applied in positive or negative phase (or polarity) to an input end or a gate of the transistor M3.

Then, supposing that the transistors M1, M2 and M3 are matched in characteristic and ignoring the gate-width modulation, drain currents $I_{D1}$, $I_{D2}$ and $I_{D3}$ of the respective transistors M1, M2 and M3 can be expressed as the following equations (9), (10) and (11), respectively.

$$I_{D1} = \beta\left(V_R - V_A + \frac{1}{2}V_1 - V_{TH}\right)^2 \tag{9}$$

$$\left(V_R - V_A - \frac{1}{2}V_1 \geq V_{TH}\right)$$

-continued $$I_{D1}=0$$
$$\left(V_R - V_A - \frac{1}{2}V_1 \le V_{TH}\right)$$

$$I_{D2}=\beta\left(V_R - V_A - \frac{1}{2}V_1 - V_{TH}\right)^2 \tag{10}$$
$$\left(V_R - V_A + \frac{1}{2}V_1 \ge V_{TH}\right)$$

$$I_{D2}=0$$
$$\left(V_R - V_A + \frac{1}{2}V_1 \le V_{TH}\right)$$

W and L are a gate-width and a gate-length of each transistor. Also, $V_{TH}$ is the threshold voltage and $V_R$ is a dc component of the first input voltage $V_1$, and $V_A$ is the common source voltage of the transistors M1, M2 and M3.

A tail current of the triple-tail cell is expressed as the following equation (12).

$$I_{D1}+I_{D2}+I_{D3}=I_0 \tag{12}$$

A differential output current $\Delta I_D$ ($=I_{D1}-I_{D2}$) of the triple-tail cell is given by the following equations (13) to (16), by solving the equations (9) to (12).

$$\Delta I_D = I_{D1} - I_{D2} = -\frac{2}{3}\beta V_1 V_2 + 2\beta V_1\sqrt{\frac{I_0}{3\beta} - \frac{1}{6}V_1^2 - \frac{2}{9}V_2^2} \tag{13}$$

$$\left(V_2 \le 0,\ |V_1| \le \sqrt{\frac{2I_0}{\beta} - 4V_2^2},\ -\frac{2}{5}V_2 - \frac{2}{5}\sqrt{\frac{5I_0}{\beta} - 4V_2^2} \le |V_1| \le -\frac{2}{5}V_2 + \frac{2}{5}\times\sqrt{\frac{5I_0}{\beta} - 4V_2^2}\ \text{or}\ V_2 \ge 0,\ |V_1| \le -\frac{2}{5}V_2 + \frac{2}{5}\sqrt{\frac{5I_0}{\beta} - 4V_2^2}\right)$$

$$\Delta I_D = I_{D1} - I_{D2} = \left\{\frac{I_0}{2} + \frac{1}{8}\beta(|V_1| - 2V_2)\times\sqrt{\frac{8I_0}{\beta} - (|V_1| - 2V_2)^2}\right\}sgn(V_1) \tag{14}$$

$$\left(|V_1| \le -\frac{1}{2}V_2,\ V_2 \le 0,\ V_1 \le -\frac{2}{5}V_2 - \frac{2}{5}\sqrt{\frac{5I_0}{\beta} - 4V_2^2},\ -\frac{2}{5}V_2 + \frac{2}{5}\sqrt{\frac{5I_0}{\beta} - 4V_2^2} \le V_1,\ \text{or}\ V_1 \le -\frac{2}{5}V_2 - \frac{2}{5}\sqrt{\frac{5I_0}{\beta} - 4V_2^2},\ -\frac{2}{5}V_2 + \frac{2}{5}\sqrt{\frac{5I_0}{\beta} - 4V_2^2} \le V_1,\ V_2 \ge 0\right)$$

$$\Delta I_D = I_{D1} - I_{D2} = \beta V_1\sqrt{\frac{2I_0}{\beta} - V_1^2} \tag{15}$$

$$\left(\sqrt{\frac{2I_0}{\beta} - 4V_2^2} \le |V_1| \le -\frac{2}{5}V_2 + \sqrt{\frac{5I_0}{\beta} - 4V_2^2},\ V_2 \le 0\right)$$

$$\Delta I_D = I_{D1} - I_{D2} = I_0 sgn(V_1) \tag{16}$$

$$\left(2\sqrt{\frac{I_0}{\beta}} + 2V_2 \le |V_1|,\ \text{or}\ \sqrt{\frac{2I_0}{\beta} - 4V_2^2} \le |V_1|,\ \sqrt{\frac{I_0}{\beta}} \le |V_1|,\ V_2 \le 0\right)$$

-continued $$I_{D3}=\beta(V_R - V_A + V_2 - V_{TH})^2 \tag{11}$$
$$(V_R - V_A + V_2 \ge V_{TH})$$
$$I_{D3}=0$$
$$(V_R - V_A + V_2 \le V_{TH})$$

Figure 18:
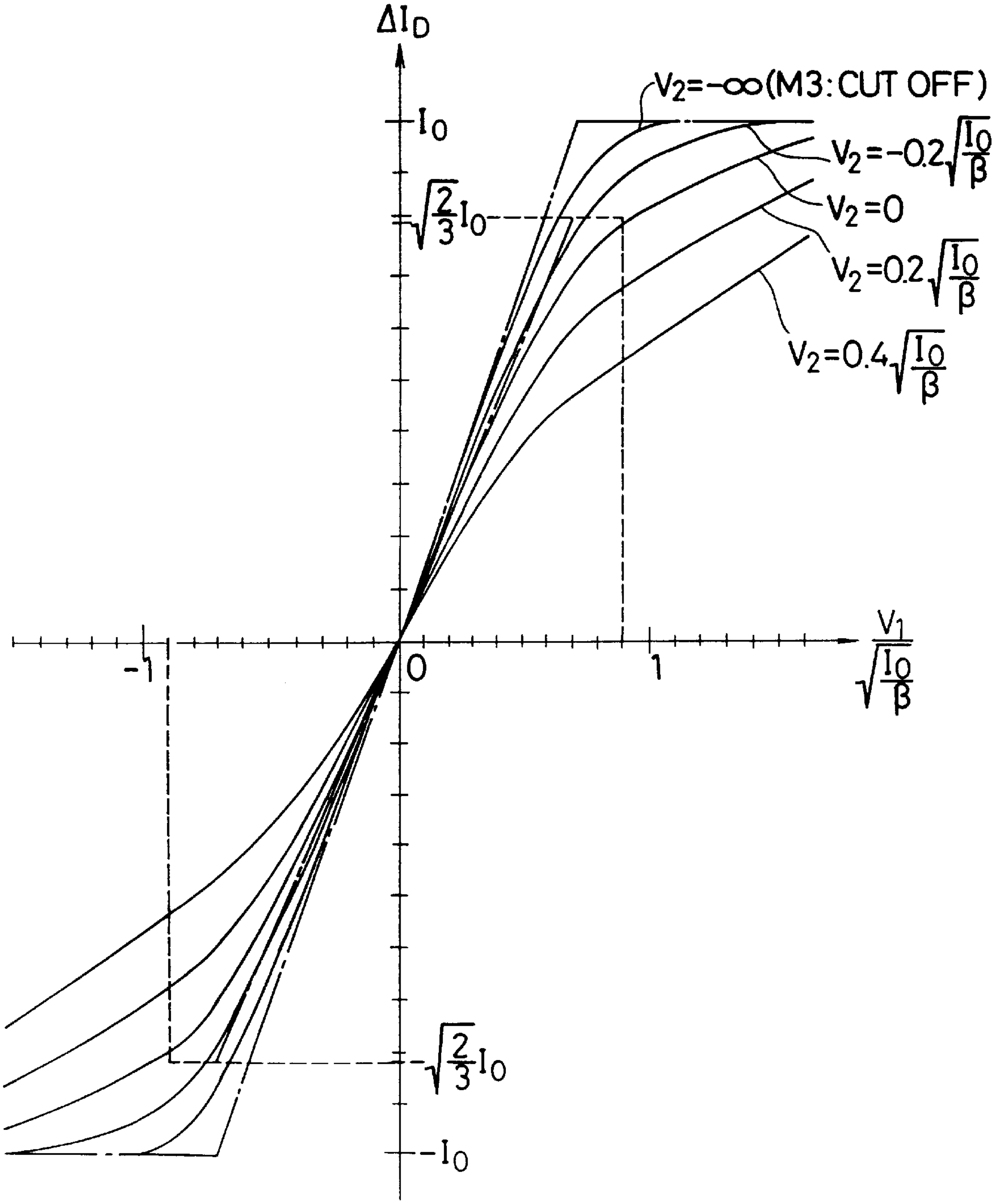
FIG. 18 is a graph showing the transfer characteristic of the multiplier of FIG. 17 according to the third embodiment.

In the equations (9), (10) and (11), β is the transconductance parameter of these MOS transistors. Here, β is expressed as $\mu(C_{OX}/2)(W/L)$ where $\mu$ is the effective carrier mobility, $C_{OX}$ is the gate oxide capacitance per unit area, and FIG. 18 shows the transfer characteristic of the MOS triple-tail cell or the multiplier according to the third embodiment, which shows the relationship between the differential output current $\Delta I_D$ and the first input voltage $V_1$ with the second input voltage $V_2$ as a parameter. In FIG. 18, the input voltages $V_1$ and $V_2$ are normalized by $(I_0/\beta)^{1/2}$.

It is seen from FIG. 18 that the deferential output current $\Delta I_D$ increases monotonously and has a limiting characteristic concerning the first input voltage $V_1$. On the other hands concerning the second input voltage $V_2$, it is seen that the current $\Delta I_D$ has a limiting characteristic only for a negative value of $V_2$ and it varies within a very narrow range for the negative value of $V_2$ although the current $\Delta I_D$ increases monotonously.

The transconductance characteristics of the multiplier can be given by differentiating the differential output current $\Delta I_D$ by the first or second input voltage $V_1$ or $V_2$ in the equations (13) to (16), resulting in the following equations (17) to (20) for $V_1$ and the following equations (21) to (23).

$$\frac{d(\Delta I_D)}{dV_1} = -\frac{2}{3}\beta V_2 + 2\beta\sqrt{\frac{I_0}{3\beta} - \frac{1}{6}{V_1}^2 - \frac{2}{9}{V_2}^2} \tag{17}$$

$$= -\frac{1}{3}\frac{\beta {V_1}^2}{\sqrt{\frac{I_0}{3\beta} - \frac{1}{6}{V_1}^2 - \frac{2}{9}{V_2}^2}}$$

$$\left(V_2 \le 0,\ |V_1| \le \sqrt{\frac{2I_0}{\beta} - 4{V_2}^2},\ -\frac{2}{5}V_2 - \frac{2}{5}\sqrt{\frac{5I_0}{\beta} - 4{V_2}^2} \le |V_1| \le -\frac{2}{5}V_2 + \frac{2}{5} \times \sqrt{\frac{5I_0}{\beta} - 4{V_2}^2},\ \text{or}\ V_2 \ge 0,\ |V_1| \le -\frac{2}{5}V_2 + \frac{2}{5}\sqrt{\frac{5I_0}{\beta} - 4{V_2}^2}\right)$$

$$\frac{d(\Delta I_D)}{dV_1} = \frac{1}{8}\beta\{\sqrt{\frac{8I_0}{\beta} - (|V_1| - 2V_2)^2} = -\frac{(|V_1| - 2V_2)^2}{\sqrt{\frac{8I_0}{\beta} - (|V_1| - 2V_2)^2}} \tag{18}$$

$$(V_2 \le 0,\ |V_1| \le -\frac{1}{2}V_2,\ V_1 \le -\frac{2}{5}V_2 - \frac{2}{5}\sqrt{\frac{5I_0}{\beta} - 4{V_2}^2},\ -\frac{2}{5}V_2 + \frac{2}{5}\sqrt{\frac{5I_0}{\beta} - 4{V_2}^2} \le V_1,\ \text{or}$$

$$V_2 \ge 0,\ V_1 \le -\frac{2}{5}V_2 - \frac{2}{5}\sqrt{\frac{5I_0}{\beta} - 4{V_2}^2},\ -\frac{2}{5}V_2 + \frac{2}{5}\sqrt{\frac{5I_0}{\beta} - 4V}$$

$$\frac{d(\Delta I_D)}{dV_1} = \beta\sqrt{\frac{2I_0}{\beta} - {V_1}^2} - \frac{\beta {V_1}^2}{\sqrt{\frac{2I_0}{\beta} - {V_1}^2}} \tag{19}$$

$$\left(\sqrt{\frac{2I_0}{\beta} - 4{V_2}^2} \le |V_1| \le -\frac{2}{5}V_2 + \sqrt{\frac{5I_0}{\beta} - 4{V_2}^2},\ V_2 \le 0\right)$$

$$\frac{d(\Delta I_D)}{dV_1} = 0 \tag{20}$$

$$\left(2\sqrt{\frac{I_0}{\beta}} + 2V_2 \le |V_1|,\ \text{or}\ \sqrt{\frac{2I_0}{\beta} - 4{V_2}^2} \le |V_1|,\ \sqrt{\frac{I_0}{\beta}} \le |V_1|,\ V_2 \le 0\right)$$

$$\frac{d(\Delta I_D)}{dV_2} = -\frac{2}{3}\beta V_1 - \frac{4}{9}\frac{\beta V_1 V_2}{\sqrt{\frac{I_0}{3\beta} - \frac{1}{6}{V_1}^2 - \frac{2}{9}{V_2}^2}} \tag{21}$$

$$\left(V_2 \le 0,\ |V_1| \le \sqrt{\frac{2I_0}{\beta} - 4{V_2}^2},\ -\frac{2}{5}V_2 - \frac{2}{5}\sqrt{\frac{5I_0}{\beta} - 4{V_2}^2} \le |V_1| - \frac{2}{5}V_2 + \frac{2}{5} \times \sqrt{\frac{5I_0}{\beta} - 4{V_2}^2},\ \text{or}\ V_2 \ge 0,\ |V_1| \le -\frac{2}{5}V_2 + \frac{2}{5}\sqrt{\frac{5I_0}{\beta} - 4{V_2}^2}\right)$$

$$\frac{d(\Delta I_D)}{dV_2} = \left\{-\frac{1}{4}\beta\sqrt{\frac{8I_0}{\beta} - (|V_1| - 2V_2)^2} + \frac{1}{4}\frac{\beta(|V_1| - 2V_2)^2}{\sqrt{\frac{8I_0}{\beta} - (|V_1| - 2V_2)^2}}\right\} sgn(V_1) \tag{22}$$

$$\left(V_2 \le 0,\ |V_1| \le -\frac{1}{2}V_2,\ V_1 \le -\frac{2}{5}V_2 - \frac{2}{5}\sqrt{\frac{5I_0}{\beta} - 4{V_2}^2},\ -\frac{2}{5}V_2 + \frac{2}{5}\sqrt{\frac{5I_0}{\beta} - 4{V_2}^2} \le V_1,\ \text{or}\right.$$

$$\left.V_2 \ge 0,\ V_1 \le -\frac{2}{5}V_2 - \frac{2}{5}\sqrt{\frac{5I_0}{\beta} - 4{V_2}^2},\ -\frac{2}{5}V_2 + \frac{2}{5}\sqrt{\frac{5I_0}{\beta} - 4{V_2}^2} \le V_1\right)$$

-continued $$\frac{d(\Delta I_D)}{dV_2} = 0 \tag{23}$$

$$\left(\sqrt{\frac{2I_0}{\beta} - 4V_2^2} \le |V_1|,\ V_2 \le 0 \quad 2\sqrt{\frac{I_0}{\beta}} + 2V_2 \le V_1\right)$$

It is seen that the triple-tail cells i.e., two-quadrant analog multiplier according to the third embodiment is expanded in linear transconductance range for the first input voltage $V_1$.

[Fourth Embodiment]

Figure 17A:
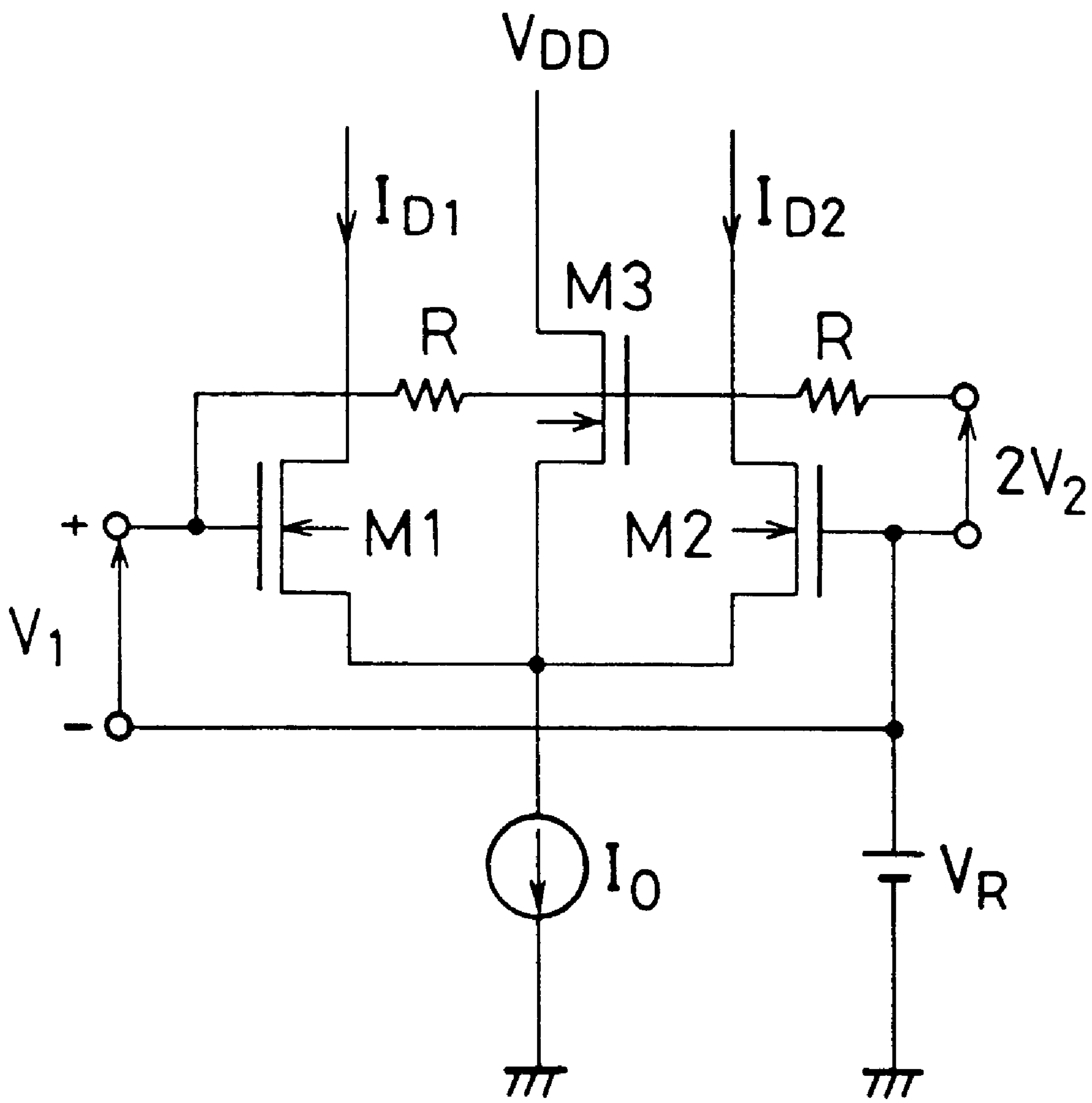
FIG. 17A is a circuit diagram of a multiplier containing one multitail cell according to a fourth embodiment of the invention.

FIG. 17A shows a two-quadrant analog multiplier according to a fourth embodiments which is composed of only one triple-tail cell of MOSFETs.

The fourth embodiment is a variation of the third embodiment as shown in FIG. 17, and is the same in circuit configuration as the second embodiment except for the following:

As shown in FIG. 17A, a pair of input terminals are provided for $V_1$ and another pair of input terminals are provided for $V_2$. The positive-side input terminal for $V_1$ is connected to the base of the MOSFET M1, and the negative-side input terminal for $V_1$ is connected to the base of the MOSFET M2. The negative-side input terminal for $V_2$ is connected to the base of the MOSFET M2. The positive-side input terminal for $V_2$ is connected through a resistor R to the base of the MOSFET M3. The base of the MOSFET M3 is connected through another resistor R to the base of the MOSFET M1 and the positive-side input terminal for $V_1$.

A first resistor (resistance: R) is connected between the gates of the MOSFETs M1 and M3 and a second resistor (resistance: R) is connected to the gate of the MOSFET M3.

A voltage $(2V_2+V_R)$ is applied to the gate of the MOSFET M3; in other words, a voltage of twice the second input voltage $V_2$, or $2V_2$, is applied to the gate of the MOSFET M3 through the second resistor. Since the first and second resistors are the same in resistance value, a half of the voltage $2V_2$, i.e., $V_2$ is applied to the gate of the MOSFET M3.

As described above, the multiplier of the fourth embodiment is substantially the same in circuit configuration as the third embodiment (FIG. 17), so that it provides the same effects or advantages as those of the third embodiment.

Also, in the third embodiment, the first input voltage $V_1$ needs to be applied differentially across the gates of the transistors M1 and M2. In this fourth embodiment, however, it is not required for the voltage $V_1$ to be differentially applied. This is an additional advantage of the fourth embodiment.

To be seen from the fourth embodiment, in general, the same operation or function is obtained even when the same voltage is additionally applied to the differential input ends of the differential pair of the first and second MOSFETs M1 and M2 and the input end of the third MOSFET M3.

[Fifth Embodiment]

Figure 19:
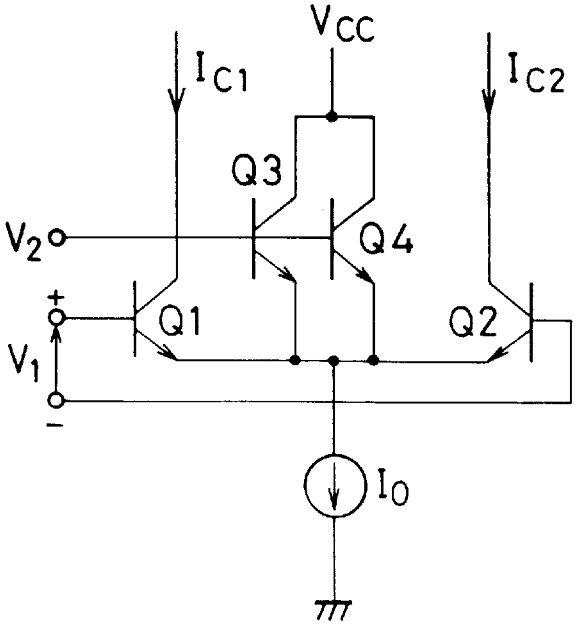
FIG. 19 is a circuit diagram of a multiplier containing one multitail cell according to a fifth embodiment of the invention.

FIG. 19 shows a two-quadrant analog multiplier according to a fifth embodiment, which is composed of only one quadritail cell of bipolar transistors.

In FIG. 19, the quadritail cell contains a differential pair of npn bipolar transistors Q1 and Q2, an npn bipolar transistor Q3, an npn bipolar transistor 4, and a constant current source (current: $I_0$).

All the transistors Q1, Q2, Q3 and Q4 have emitters connected in common to one end of the constant current source, and they are driven by the same current source. The other end of the constant current source is grounded. All the transistors Q1, Q2, Q3 and Q4 are the same in emitter area. Bases of the transistors Q3 and Q4 are coupled together. Collectors of the transistors Q3 and Q4 are coupled together to be applied with a supply voltage $V_{CC}$.

A first signal or a differential voltage $V_1$ is applied across differential input ends of the pair, i.e., bases of the transistors Q1 and Q2. A second signal or a differential voltage $V_2$ is applied in positive or negative polarity to input ends or coupled bases of the transistors Q3 and Q4.

Then, under the same condition as in the first embodiment (FIG. 14), collector currents $I_{C1}$, $I_{C2}$, $I_{C3}$ and $I_{C4}$ of the respective transistors Q1, Q2, Q3 and Q4 can be expressed as the following equations (24), (25) and (26), respectively.

$$I_{C1} = I_S \exp\left(\frac{V_R - V_A + \frac{1}{2}V_1}{V_T}\right) \tag{24}$$

$$I_{C2} = I_S \exp\left(\frac{V_R - V_A - \frac{1}{2}V_1}{V_T}\right) \tag{25}$$

$$I_{C3} = I_{C4} = I_S \exp\left(\frac{V_R - V_A + V_2}{V_T}\right) \tag{26}$$

In the equations (24), (25) and (26), $V_T$ is the thermal voltage of the transistors Q1, Q2, Q3 and Q4, $I_S$ is the saturation current thereof, $V_R$ is a dc component of the first input voltage, and $V_A$ is a common emitter voltage of the transistors Q1, Q2, Q3 and Q4.

Tail currents of the quadritail cell, i.e., the collector currents $I_{C1}$, $I_{C2}$, $I_{C3}$, and $I_{C4}$ satisfies the following equation.

$$I_{C1}+I_{C2}+I_{C3}+I_{C4}=\alpha_F I_0 \tag{27}$$

where $\alpha_F$ is the dc common-base current gain factor of the transistors Q1, Q2, Q3 and Q4.

The common term $I_S \cdot \exp\{(V_R - V_A)/V_T\}$ contained in the equations (24), (25) and (26) is given as the following equation (28).

$$I_S \exp\left(\frac{V_R - V_A}{V_T}\right) = \frac{\alpha_F I_0}{\left\{2\cosh\left(\frac{V_1}{2V_T}\right) + \exp\left(\frac{V_2}{V_T}\right)\right\}} \tag{28}$$

A differential output current $\Delta I_C$ $(=I_{C1}-I_{C2})$ of the quadritail cell is given by the following equation 29.

$$\Delta I_C = I_{C1} - I_{C2} = \frac{2\alpha_F I_0 \sinh\left(\frac{V_1}{2V_T}\right)}{\left\{2\cosh\left(\frac{V_1}{2V_T}\right) + \exp\left(\frac{V_2}{V_T}\right)\right\}} \tag{29}$$

Figure 20:
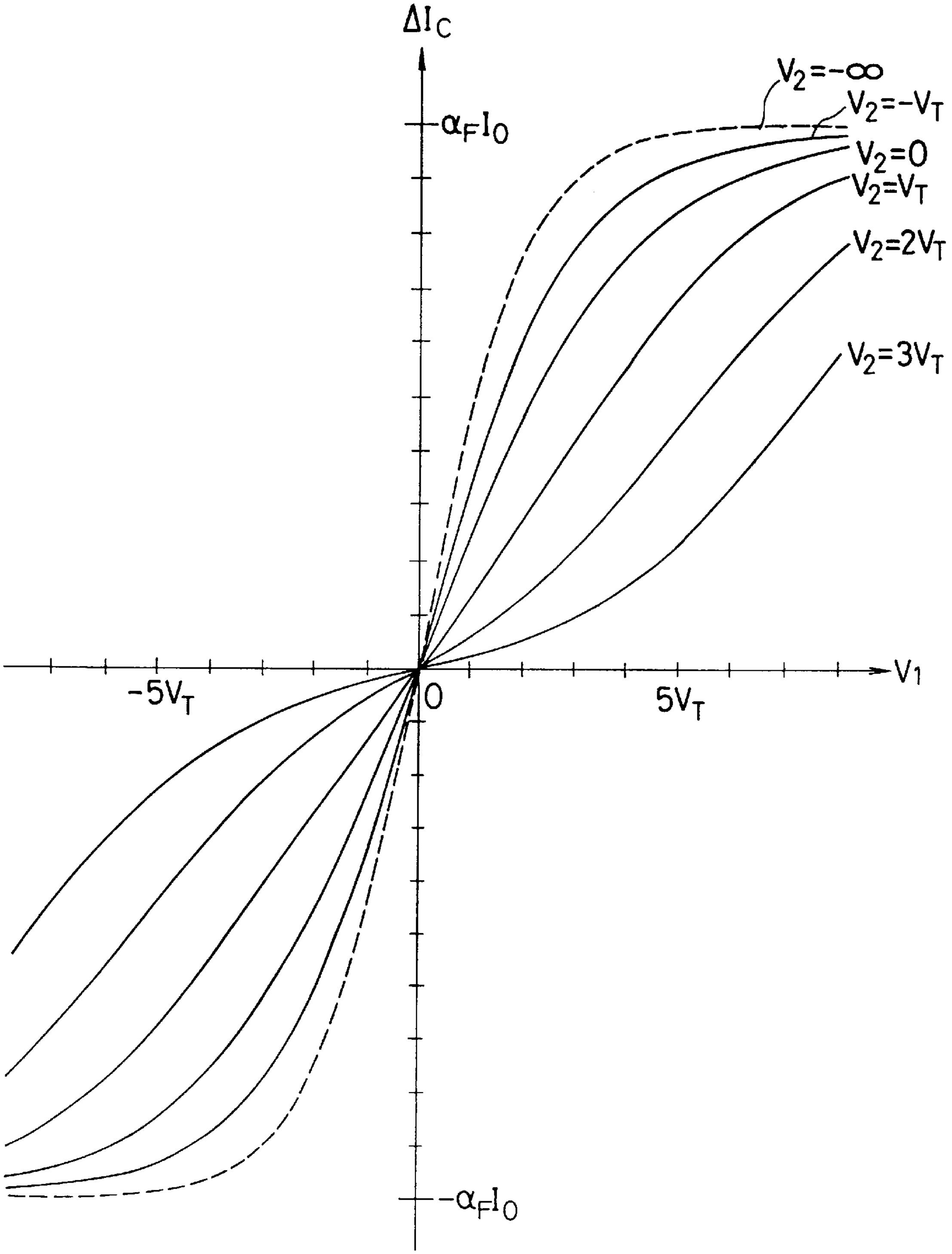
FIG. 20 is a graph showing the transfer characteristic of the multiplier of FIG. 19 according to the fifth embodiment.

FIG. 20 shows the transfer characteristic of the bipolar quadritail cell or the multiplier according to the fifth embodiment, which shows the relationship between the differential output current $\Delta I_C$ and the first input voltage $V_1$ with the second input voltage $V_2$ as a parameter.

It is seen from FIG. 20 that the differential output current $\Delta I_C$ increases monotonously and has a limiting characteristic concerning the first input voltage $V_1$. On the other hands concerning the second input voltage $V_2$, it is seen that the current $\Delta I_C$ has a limiting characteristic only for a negative value of $V_2$. This is similar to those of the bipolar triple-tail cell according to the first embodiment (FIG. 14).

Since the transistor Q4 is added to the bipolar triple-tail cell of the first embodiment, the current $\Delta I_C$ in the fifth embodiment varies within a relatively wider range for the negative value of $V_2$ compared with that in the first embodiment.

In other words, the bipolar quadritail cell of the fifth embodiment is equivalent to a bipolar triple-tail cell obtained by making the emitter area of the transistor Q3 twice as large as those of the transistors Q1 and Q2 in the first embodiment.

Therefore, it is understood, in general, that the number of additional bipolar transistor or transistors to be applied with the second input voltage $V_2$ may be 1, 2, 3, 4, 5, 6, . . . , and that the variation range of the differential output current $\Delta I_C$ may be expanded for the voltage $V_2$ dependent on this number.

The transconductance characteristics of the multiplier or bipolar quadritail cell according to the fifth embodiment is given by differentiating the differential output current $\Delta I_C$ by the first or second input voltage $V_1$ or $V_2$ in the equation (29), resulting in the following equations (30) and (31).

$$\frac{d(\Delta I_C)}{dV_1} = \frac{\alpha_F I_0}{2V_T} \times \frac{\left\{1 + \cosh\left(\frac{V_1}{2V_T}\right)\exp\left(\frac{V_2}{V_T}\right)\right\}}{\left\{\cosh\left(\frac{V_1}{2V_T}\right) + \exp\left(\frac{V_2}{V_T}\right)\right\}^2} \quad (30)$$

$$\frac{d(\Delta I_C)}{dV_2} = -\frac{\alpha_F I_0}{V_T} \times \frac{\sinh\left(\frac{V_1}{2V_T}\right)\exp\left(\frac{V_2}{V_T}\right)}{\left\{\cosh\left(\frac{V_1}{2V_T}\right) + \exp\left(\frac{V_2}{V_T}\right)\right\}^2} \quad (31)$$

Figure 21:
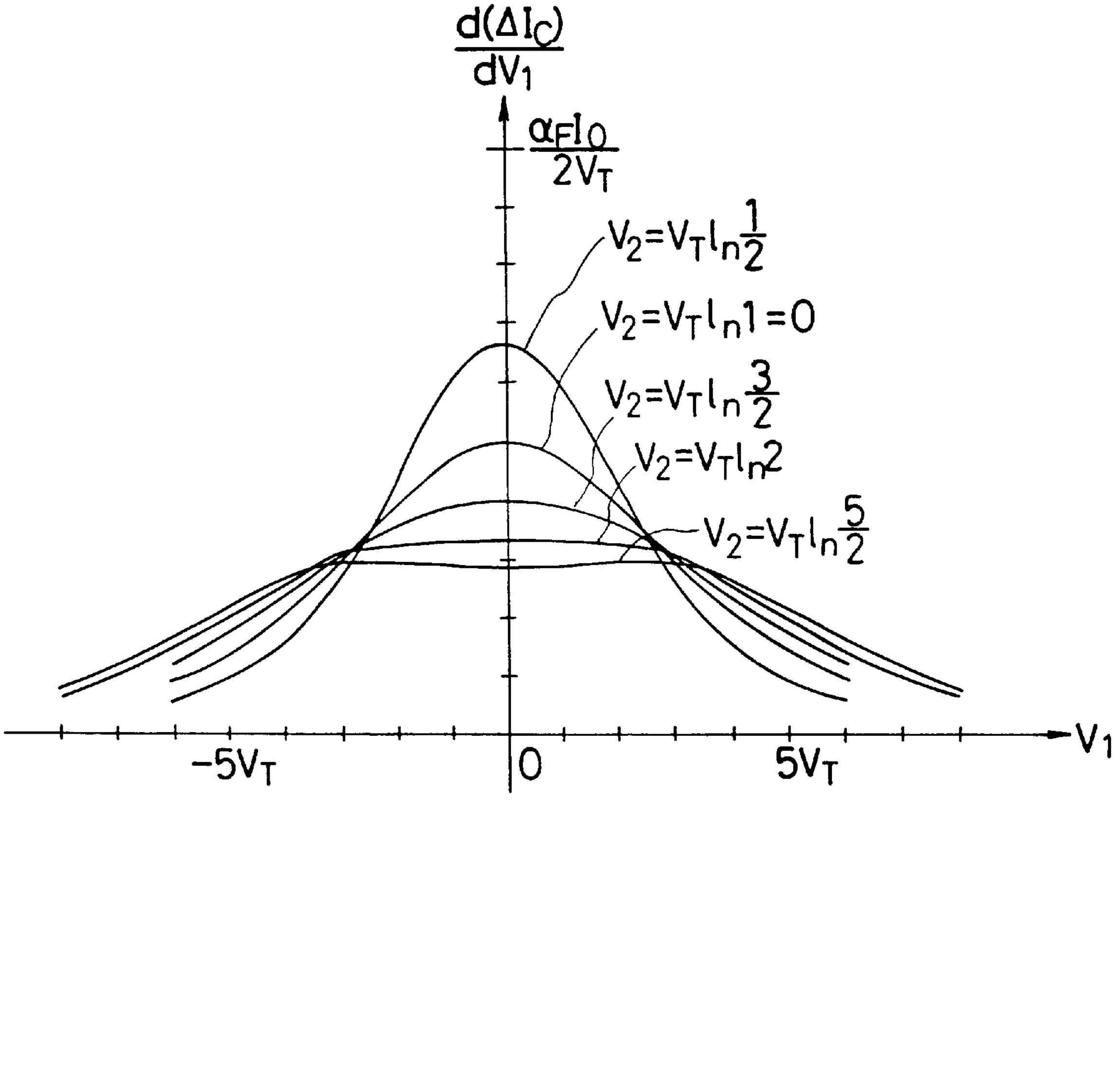
FIG. 21 is a graph showing the transconductance characteristic of the multiplier of FIG. 19 according to the fifth embodiment.

The equation (30) represents the transconductance characteristic for the first input voltage $V_1$, which is shown in FIG. 21. The equation (31) represents that for the second input voltage $V_2$.

It is seen that the quadritail cell, i.e., two-quadrant analog multiplier according to the fifth embodiment is expanded in linear transconductance range for the first input voltage $V_1$.

To make the transconductance characteristic linear for the first input voltage $V_1$, the second input voltage $V_2$ needs to satisfy the following relationship as $$exp(V_2/V_T)=2$$

This relationship is obtained by differentiating the above equation (29) by the voltage $V_1$ three times and obtaining a condition that makes a differential coefficient thus obtained maximally flat, i.e., $d^3(\Delta I_C)/dV_1^3=0$, where $V_1=0$.

This relationship is also derived from the general relationship of $\exp(V_2/V_T)=4/K$ described previously by setting the emitter-area ratio K at 2.

It is not always required that the second input voltage $V_2$ exactly satisfies such the relationship as $\exp(V_2/V_T)=2$, because such an exact value of $V_2$ cannot be realized on a practical semiconductor integrated circuit device.

As described above,, with the quadritail cell or multiplier according to the fifth embodiment, the transistors Q1, Q2, Q3 and Q4 are driven at the same supply voltage, which means that this multiplier can operate at a low supply voltage such as 3 or 3.3 V.

Also, an expanded input voltage range for good transconductance linearity can be obtained compared with those of the prior-art multipliers.

Further, this quadritail cell provides a new bipolar analog multiplier that can operate at a low supply voltage such as 3 or 3.3 V, instead of the Gilbert multiplier cell.

[Sixth Embodiment]

Figure 26:
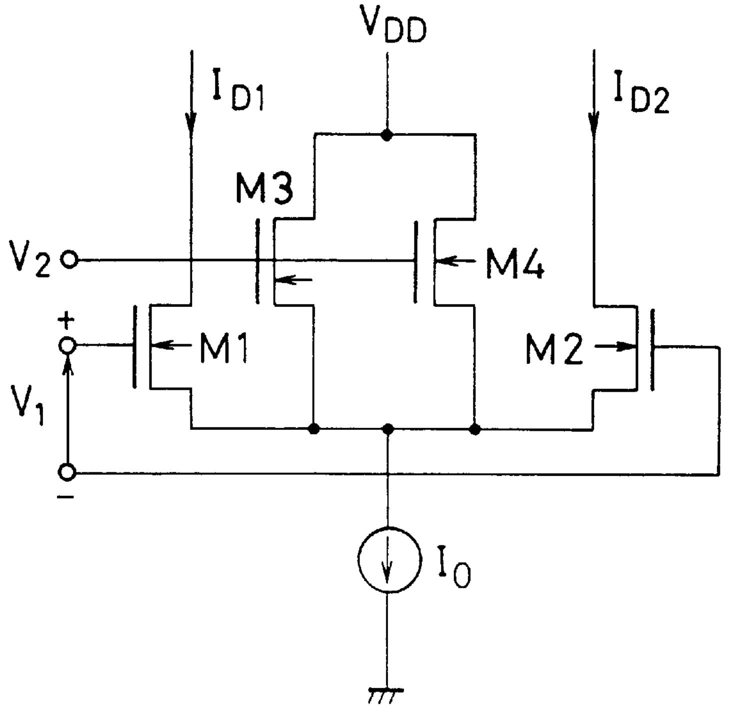
FIG. 26 is a circuit diagram of a multiplier containing one multitail cell according to a sixth embodiment of the invention.

FIG. 26 shows a two-quadrant analog multiplier according to a sixth embodiment, which is composed of only one quadritail cell of MOSFETs. This is equivalent to one that the bipolar transistors Q1, Q2, Q3 and Q4 are replaced by MOSFETs in the fifth embodiment.

In FIG. 26, the quadritail cell contains a differential pair of n-channel MOSFETs M1 and K2, an n-channel MOSFET M3, an n-channel MOSFET M4, and a constant current source (current: $I_0$).

All the MOSFETs M1, M2, M3 and M4 have sources connected in common to one end of the constant current source, and they are driven by the same current source. The other end of the constant current source is grounded. All the MOSFETs M1, M2, M3 and M4 are the same in transconductance parameter, i.e., gate-width to gate-length ratio.

A supply voltage $V_{DD}$ is applied to coupled drains of the MOSFETs M3 and M4.

A first signal or a differential voltage $V_1$ is applied across differential input ends of the pair, i.e., gates of the MOSFETs M1 and M2. A second signal or a differential voltage $V_2$ is applied in positive or negative polarity to coupled input ends or gates of the MOSFETs M3 and M4.

Then, under the same condition as in the third embodiment (FIG. 17), drain currents $I_{D1}$, $I_{D2}$, $I_{D3}$ and $I_{D4}$ of the respective MOSFETs M1, M2, M3 and M4 are expressed as the following equations (32), (33) and (34), respectively.

$$I_{D1} = \beta\left(V_R - V_A + \frac{1}{2}V_1 - V_{TH}\right)^2 \quad \left(V_R - V_A - \frac{1}{2}V_1 \geq V_{TH}\right) \quad (32)$$

$$I_{D1} = 0 \quad \left(V_R - V_A - \frac{1}{2}V_1 \leq V_{TH}\right)$$

$$I_{D2} = \beta\left(V_R - V_A - \frac{1}{2}V_1 - V_{TH}\right)^2 \quad \left(V_R - V_A + \frac{1}{2}V_1 \geq V_{TH}\right) \quad (33)$$

$$I_{D2} = 0 \quad \left(V_R - V_A + \frac{1}{2}V_1 \leq V_{TH}\right)$$

$$I_{D3} = I_{D4} = \beta(V_R - V_A + V_2 - V_{TH})^2 \quad (V_R - V_A + V_2 \geq V_{TH}) \quad (34)$$

$$I_{D3} = I_{D4} = 0 \quad (V_R - V_A + V_2 \leq V_{TH})$$

In the equations (32), (33) and (34), $\beta$ is the transconductance parameter of the MOSFETs M1, M2, M3 and M4 and $V_A$ is the common source voltage of the MOSFETs M1, M2, M3 and M4.

A tail current of the quadritail cell is expressed as the following equation (35).

$$I_{D1}+I_{D2}+I_{D3}+I_{D4}=I_0 \tag{35}$$

A differential output current $\Delta I_D$ ($=I_{D1}-I_{D2}$) of the quadritail cell is given by the following equations (36) to (39), by solving the equations (32) to (35).

sixth embodiment varies within a relatively wider range for the negative value of $V_2$ compared with that in the third embodiment.

In other words, the MOS quadritail cell of the sixth embodiment is equivalent to an MOS triple-tail cell obtained $$\begin{aligned}\Delta I_D &= I_{D1} - I_{D2} \\ &= -\beta V_1 V_2 + \beta V_1\sqrt{\frac{I_0}{\beta} - \frac{1}{2}V_1^2 - V_2^2}\end{aligned} \tag{36}$$

$$\left(V_2 \le 0,\ |V_1| \le 2\sqrt{\frac{I_0}{\beta} - 2V_2^2},\ -\frac{2}{3}V_2 - \frac{2}{3}\sqrt{\frac{3I_0}{2\beta} - 2V_2^2} \le |V_1| \le -\frac{2}{3}V_2 + \frac{2}{3}\times\sqrt{\frac{3I_0}{2\beta} - 2V_2^2},\ \text{or } V_2 \ge 0,\ |V_1| \le -\frac{2}{3}V_2 + \frac{2}{3}\sqrt{\frac{3I_0}{2\beta} - 2V_2^2}\right)$$

$$\begin{aligned}\Delta I_D &= I_{D1} - I_{D2} \\ &= \left[\frac{I_0}{3} + \frac{1}{18}\beta\left\{(|V_1| - 2V_2)^2 + 2(|V_1| - 2V_2)\times\sqrt{\frac{12I_0}{\beta} - 2(|V_1| - 2V_2)^2}\right\}\right]sgn(V_1)\end{aligned} \tag{37}$$

$$\left(V_2 \le 0,\ |V_1| \le -\frac{1}{2}V_2,\ V_1 \le -\frac{2}{3}V_2 - \frac{2}{3}\sqrt{\frac{6I_0}{\beta} - 8V_2^2},\ -\frac{2}{3}V_2 + \frac{2}{3}\sqrt{\frac{6I_0}{\beta} - 8V_2^2} \le V_1 \text{ or } V_2 \ge 0,\ V_1 \le -\frac{2}{3}V_2 - \frac{2}{3}\sqrt{\frac{6I_0}{\beta} - 8V_2^2},\ -\frac{2}{3}V_2 + \frac{2}{3}\sqrt{\frac{6I_0}{\beta} - 8V_2^2} \le V_1\right)$$

$$\Delta I_D = I_{D1} - I_{D2} = \beta V_1\sqrt{\frac{2I_0}{\beta} - V_1^2} \tag{38}$$

$$\left(\frac{1}{2}\sqrt{\frac{I_0}{\beta} - 2V_2^2} \le |V_1| \le -\frac{2}{3}V_2 + \frac{2}{3}\times\sqrt{\frac{3I_0}{2\beta} - 2V_2^2},\ V_2 \le 0\right)$$

$$\Delta I_D = I_{D1} - I_{D2} = I_0 sgn(V_1) \tag{39}$$

$$\left(\sqrt{\frac{6I_0}{\beta}} + 2V_2 \le |V_1|,\ \text{or } \frac{1}{2}\sqrt{\frac{I_0}{\beta} - 2V_2^2} \le |V_1|,\ \sqrt{\frac{I_0}{\beta}} \le |V_1|,\ V_2 \le 0\right)$$

Figure 27:
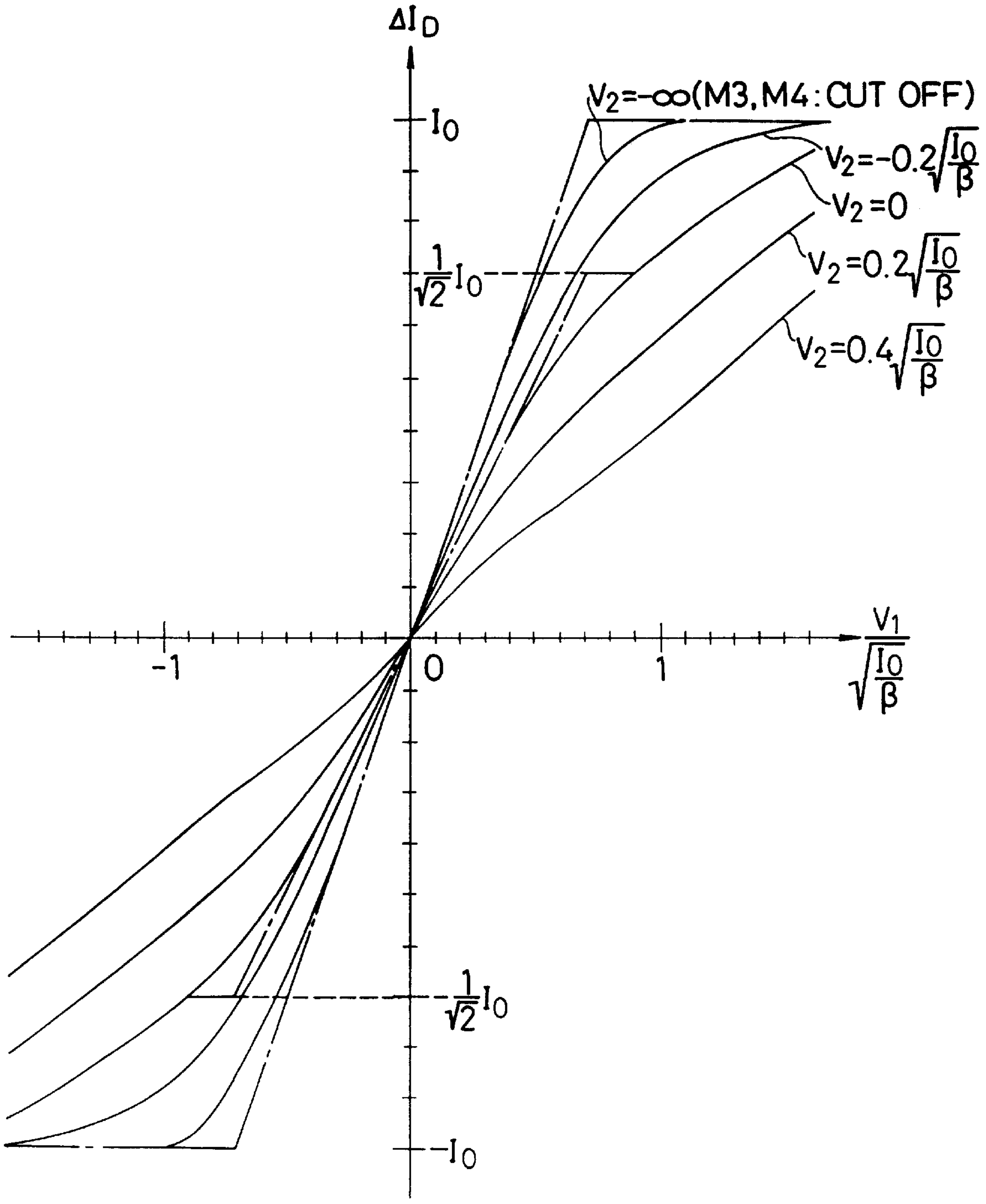
FIG. 27 is a graph showing the transfer characteristic of the multiplier of FIG. 26 according to the sixth embodiment.

FIG. 27 shows the transfer characteristic of the MOS quadritail cell or the multiplier according to the sixth embodiment, which shows the relationship between the differential output current $\Delta I_D$ and the first input voltage $V_1$ with the second input voltage $V_2$ as a parameter. In FIG. 27, the input voltages $V_1$ and $V_2$ are normalized by $(I_0/\beta)^{1/2}$.

It is seen from FIG. 27 that the differential output current $\Delta I_D$ increases monotonously and has a limiting characteristic concerning the first input voltage $V_1$. On the other hand, concerning the second input voltage $V_2$, it is seen that the current $\Delta I_D$ has a limiting characteristic only for a negative value of $V_2$.

This is similar to those of the bipolar quadritail cell according to the fifth embodiment (FIG. 19).

Since the MOSFET M4 is added to the MOS triple-tail cell of the third embodiment (FIG. 17), the current $\Delta I_D$ in the by making the gate-width to gate-length ratio (W/L) of the MOSFET M3 twice as large as those of the MOSFETs M1 and M2 in the third embodiment.

Therefore, similar to the bipolar case, it is understood, in general, that the number of an additional MOSFET or MOSFETs to be applied with the second input voltage $V_2$ may be 1, 2, 3, 4, 5, 6, . . . , and that the variation range of the differential output current $\Delta I_D$ may be expanded for the voltage $V_2$ dependent on this number.

The transconductance characteristics of the multiplier according to the sixth embodiment is given by differentiating the differential output current $\Delta I_D$ by the first or second input voltage $V_1$ or $V_2$ in the equations (36) to (39), resulting in the following equations (40) to (43) for $V_1$ and the following equations (44) to (46).

$$\begin{aligned}\frac{d(\Delta I_D)}{dV_1} &= -\beta V_2 + 2\beta\sqrt{\frac{I_0}{\beta} - \frac{1}{2}V_1^2 - V_2^2} \\ &= -\frac{1}{2}\frac{\beta V_1^2}{\sqrt{\frac{I_0}{\beta} - \frac{1}{2}V_1^2 - V_2^2}}\end{aligned} \tag{40}$$

-continued $$\left(V_2 \le 0,\ |V_1| \le \frac{1}{2}\sqrt{\frac{I_0}{\beta} - 2V_2^2},\ -\frac{2}{3}V_2 - \frac{2}{3}\sqrt{\frac{3I_0}{2\beta} - 2V_2^2} \le |V_1| \le -\frac{2}{3}V_2 + \frac{2}{3}\times\sqrt{\frac{3I_0}{2\beta} - 2V_2^2} \text{ or } V_2 \ge 0,\ |V_1| \le -\frac{2}{3}V_2 + \frac{2}{3}\sqrt{\frac{3I_0}{2\beta} - 2V_2^2}\right)$$

$$\frac{d(\Delta I_D)}{dV_1} = \frac{1}{9}\beta\left\{(|V_1| - 2V_2) - 2\sqrt{\frac{12I_0}{\beta} - 2(|V_1| - 2V_2)^2} - \frac{4(|V_1| - 2V_2)^2}{\sqrt{\frac{12I_0}{\beta} - 2(|V_1| - 2V_2)^2}}\right\}sgn(V_1) \tag{41}$$

$$\left(V_2 \le 0,\ |V_1| \le -\frac{1}{2}V_2,\ V_1 \le -\frac{2}{3}V_2 - \frac{2}{3}\sqrt{\frac{6I_0}{\beta} - 8V_2^2},\ -\frac{2}{3}V_2 + \frac{2}{3}\sqrt{\frac{6I_0}{\beta} - 8V_2^2} \le V_1 \text{ or}\right.$$

$$\left.V_2 \ge 0,\ V_1 \le -\frac{2}{3}V_2 - \frac{2}{3}\sqrt{\frac{6I_0}{\beta} - 8V_2^2},\ -\frac{2}{3}V_2 + \frac{2}{3}\sqrt{\frac{6I_0}{\beta} - 8V_2^2} \le V_1\right)$$

$$\frac{d(\Delta I_D)}{dV_1} = \beta\sqrt{\frac{2I_0}{\beta} - V_1^2} - \frac{\beta V_1^2}{\sqrt{\frac{2I_0}{\beta} - V_1^2}} \tag{42}$$

$$\left(\frac{1}{2}\sqrt{\frac{I_0}{\beta} - 2V_2} \le |V_1| \le -\frac{2}{3}V_2 + \frac{2}{3}\sqrt{\frac{3I_0}{2\beta} - 2V_2^2},\ V_2 \le 0\right)$$

$$\frac{d(\Delta I_D)}{dV_1} = 0 \tag{43}$$

$$\left(\sqrt{\frac{6I_0}{\beta}} + 2V_2 \le |V_1|, \text{ or } \frac{1}{2}\sqrt{\frac{I_0}{\beta} - 2V_2^2} \le |V_1|,\ \sqrt{\frac{I_0}{\beta}} \le |V_1|,\ V_2 \le 0\right)$$

$$\frac{d(\Delta I_D)}{dV_2} = -\beta V_1 - \frac{\beta V_1 V_2}{\sqrt{\frac{I_0}{\beta} - \frac{1}{2}V_1^2 - V_2^2}} \tag{44}$$

$$\left(V_2 \le 0,\ |V_1| \le \frac{1}{2}\sqrt{\frac{I_0}{\beta} - 2V_2^2},\ -\frac{2}{3}V_2 - \frac{2}{3}\sqrt{\frac{3I_0}{2\beta} - 2V_2^2} \le |V_1| \le -\frac{2}{3}V_2 + \frac{2}{3}\times\sqrt{\frac{3I_0}{2\beta} - 2V_2^2}, \text{ or } V_2 \ge 0,\ |V_1| \le -\frac{2}{3}V_2 + \frac{2}{3}\sqrt{\frac{3I_0}{2\beta} - 2V_2^2}\right)$$

$$\frac{d(\Delta I_D)}{dV_2} = -\frac{2}{9}\beta\left\{(|V_1| - 2V_2) - 2\sqrt{\frac{12I_0}{\beta} - 2(|V_1| - 2V_2)^2} - \frac{2(|V_1| - 2V_2)^2}{\sqrt{\frac{12I_0}{\beta} - 2(|V_1| - 2V_2)^2}}\right\}sgn(V_1) \tag{45}$$

$$\left(V_2 \le 0,\ |V_1| \le -\frac{1}{2}V_2,\ V_1 \le -\frac{2}{3}V_2 - \frac{2}{3}\sqrt{\frac{6I_0}{\beta} - 8V_2^2},\ -\frac{2}{3}V_2 + \frac{2}{3}\sqrt{\frac{6I_0}{\beta} - 8V_2^2} \le V_1 \text{ or}\right.$$

$$\left.V_2 \ge 0,\ V_1 \le -\frac{2}{3}V_2 - \frac{2}{3}\sqrt{\frac{6I_0}{\beta} - 8V_2^2},\ -\frac{2}{3}V_2 + \frac{2}{3}\sqrt{\frac{6I_0}{\beta} - 8V_2^2} \le V_1\right)$$

$$\frac{d(\Delta I_D)}{dV_2} = 0 \tag{46}$$

$$\left(\sqrt{\frac{6I_0}{\beta}} + 2V_2 \le |V_1|, \text{ or } \frac{1}{2}\sqrt{\frac{I_0}{\beta} - 2V_2^2} \le |V_1|,\ V_2 \le 0\right)$$

In the multiplier according to sixth embodiment, which is made of the MOS quadritail cell, the same effects and advantages can be obtained as those of the third embodiment (FIG. 17).

[Seventh Embodiment]

Figure 22:
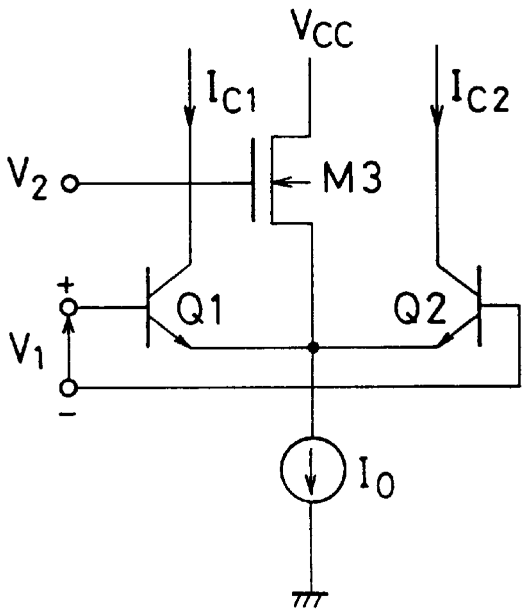
FIG. 22 is a circuit diagram of a multiplier containing one multitail cell according to a seventh embodiment of the invention.

FIG. 22 shows a two-quadrant analog multiplier according to a seventh embodiment, which is composed of only one triple-tail cell of two bipolar transistors and one MOSFET. This is equivalent to one that the npn bipolar transistor Q3 is replaced by an n-channel MOSFET in the first embodiment (FIG. 14).

In FIG. 22, this triple-tail cell contains a differential pair of npn bipolar transistors Q1 and Q2, an n-channel MOSFET M3 and a constant current source (current: $I_0$).

Emitters of the bipolar transistors Q1 and Q2 and a source of the MOSFET M3 are connected in common to one end of the constant current source, and the bipolar transistors Q1 and Q2 and the MOSFET M3 are driven by the same current source. The other end of the constant current source is grounded. The transistors Q1 and Q2 are the same in capacity, i.e., emitter area.

A supply voltage $V_{CC}$ is applied to a drain of the MOSFET M3.

A first signal or a differential voltage $V_1$ is applied across bases of the transistors Q1 and Q2. A second signal or a differential voltage $V_2$ is applied in positive or negative phase (or polarity) to the gate of the MOSFET M3.

In the seventh embodiment, the drain current of the MOSFET M3 increases dependent on its gate voltage, the change of which is approximately in conformity with the square-law characteristic of an MOSFET itself.

Therefore, it is expected that the triple-tail cell of the seventh embodiment has a transfer characteristic near that (FIG. 15) of the first embodiment (FIG. 14).

However, since design parameters for an MOSFET are more than those for a bipolar transistor, the input voltage range in which the transconductance characteristic is approximately linear for the voltage $V_1$ can be made wider than that (about 200 $mV_{p-p}$) of the first embodiment Therefore, the same effects or advantages as those in the first embodiment can be obtained.

[Eighth Embodiment]

Figure 23:
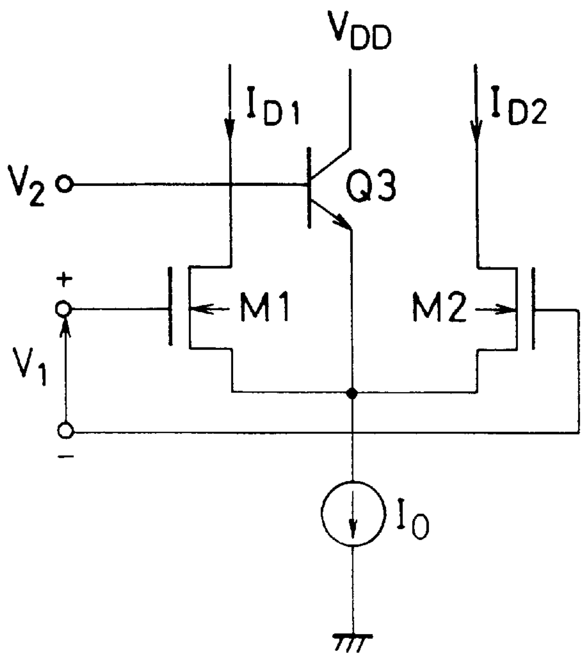
FIG. 23 is a circuit diagram of a multiplier containing one multitail cell according to an eighth embodiment of the invention.

FIG. 23 shows a two-quadrant analog multiplier according to an eighth embodiment, which is composed of only one triple-tail cell of one bipolar transistor and two MOSFETs. This is equivalent to one that the n-channel MOSFET M3 is replaced by an npn bipolar transistor in the third embodiment (FIG. 17).

In FIG. 23, this triple-tail cell contains a differential pair of n-channel MOSFETs M1 and M2, an npn bipolar transistor Q3 and a constant current source (current: $I_0$).

Sources of the MOSFETs M1 and M2 and an emitter of the bipolar transistor Q3 are connected in common to one end of the constant current source, and the MOSFETs M1 and M2 and the transistors Q3 are driven by the same current source. The other end of the constant current source is grounded. The MOSFETs M1 and M2 are the same in transconductance parameter, i.e., gate-width to gate-length ratio.

A supply voltage $V_{DD}$ is applied to a collector of the transistor Q3.

A first signal or a differential voltage $V_1$ is applied across bases of the transistors Q1 and Q2. A second signal or a differential voltage $V_2$ is applied in positive or negative phase (or polarity) to the gate of the MOSFET M3.

In the eighth embodiment, the collector current of the transistor Q3 changes dependent on its base-emitter voltage, the change of which is approximately in conformity with the exponential characteristic of a bipolar transistor itself.

Therefore, it is expected that the triple-tail cell of the eighth embodiment has a transfer characteristic near that (FIG. 18) of the third embodiment (FIG. 17).

Therefore, also in the eighth embodiment, the same effects or advantages as those in the second embodiment can be obtained.

[Ninth Embodiment]

Figure 24:
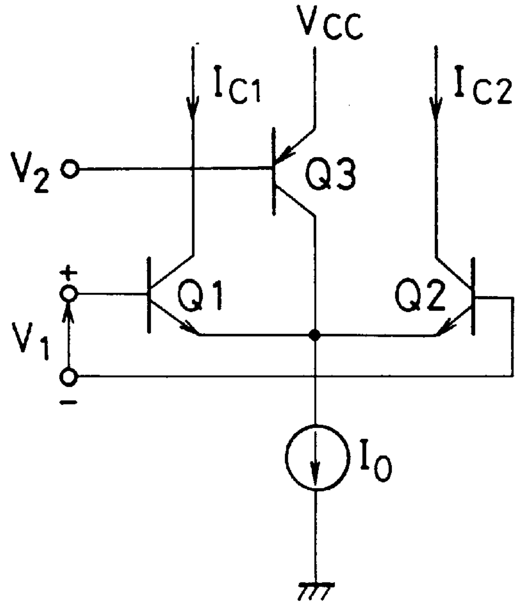
FIG. 24 is a circuit diagram of a multiplier containing one multitail cell according to a ninth embodiment of the invention.

FIG. 24 shows a two-quadrant analog multiplier according to a ninth embodiment, which is composed of only one triple-tail cell of bipolar transistors. This is equivalent to one that the npn bipolar transistor Q3 is replaced by a pnp bipolar transistor in the first embodiment (FIG. 14).

In FIG. 24, this triple-tail cell contains a differential pair of npn bipolar transistors Q1 and Q2, a pnp bipolar transistor Q3 and a constant current source (current: $I_0$).

Emitters of the bipolar transistors Q1 and Q2 and a collector of the transistor Q3 are connected in common to one end of the constant current source, and the bipolar transistors Q1, Q2 and Q3 are driven by the same current source. The other end of the constant current source is grounded. The transistors Q1, Q2 and Q3 are the same in capacity, i.e., emitter area.

A supply voltage $V_{CC}$ is applied to an emitter of the transistor Q3.

A first signal or a differential voltage $V_1$ is applied across bases of the transistors Q1 and Q2. A second signal or a differential voltage $V_2$ is applied in positive or negative phase (or polarity) to the base of the transistor Q3.

In the ninth embodiment, if the voltage $V_2$ is applied to the base of the transistor Q3 with reference to the supply voltage $V_{CC}$, similar to the first embodiment, the collector current $I_{C3}$ of the transistor Q3 increases monotonously dependent on the voltage $V_2$. That is, the following relationship is established.

$$I_{C3} = I_S \exp\left(-\frac{V_2 + V_R - V_{CC}}{V_T}\right)$$

Therefore, the substantial tail current that drives the transistors Q1 and Q2 is expressed as $$I_{EE}=I_0-I_{C3},$$

so that the ninth embodiment is equivalent to a differential pair driven by the current $I_{EE}$.

The differential current ΔI is given as $$\Delta I=(I_0-I_{C3})\tanh\,(V_1/2V_T)$$

Figure 27A:
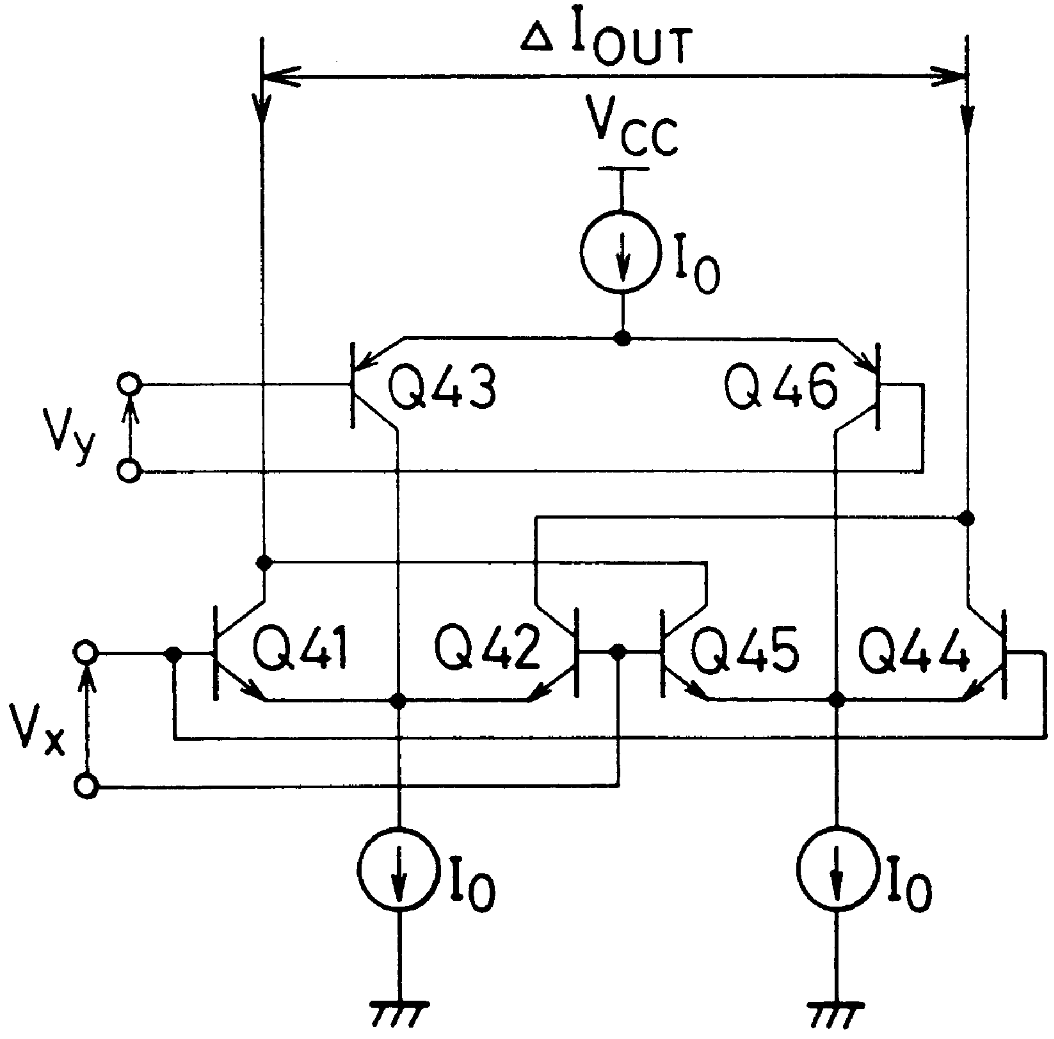
FIG. 27A PRIOR ART
FIG. 27A is a circuit diagram of a prior-art folded Gilbert cell multiplier.

If two such the triple-tail cells are combined with each other, a multiplier as shown in FIG. 27A is obtained, which has been termed the known folded "Gilbert multiplier cell".

[Tenth Embodiment]

Figure 25:
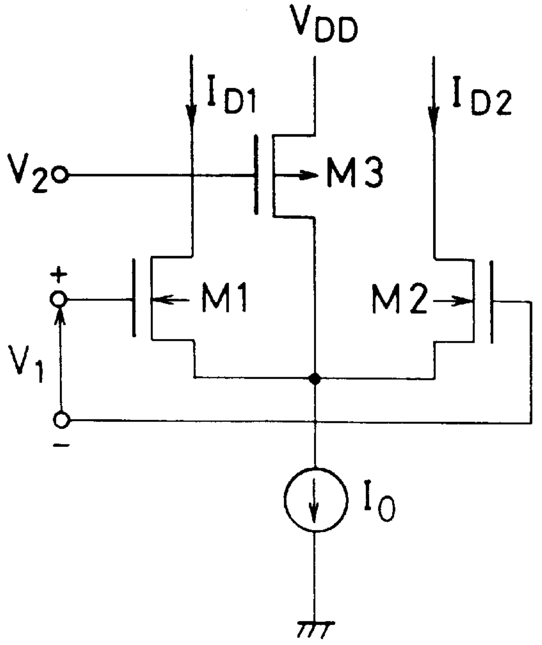
FIG. 25 is a circuit diagram of a multiplier containing one multitail cell according to a tenth embodiment of the invention.

FIG. 25 shows a two-quadrant analog multiplier according to a tenth embodiment, which is composed of only one triple-tail cell of MOSFETs. This is equivalent to one that the n-channel MOSFET M3 is replaced by a p-channel MOSFET in the third embodiment (FIG. 17).

In FIG. 25, this triple-tail cell contains a differential pair of n-channel MOSFETs M1 and M2, a p-channel MOSFET M3 and a constant current source (current: $I_0$).

Sources of the MOSFETs M1 and M2 and a drain of the MOSFET M3 are connected in common to one end of the constant current source, and the MOSFETs M1, M2 and M3 are driven by the same current source. The other end of the constant current source is grounded. The MOSFETs M1, M2 and M3 are the same in transconductance parameter, i.e., gate-width to gate-length ratio.

A supply voltage $V_{DD}$ is applied to a source of the MOSFET M3.

A first signal or a differential voltage $V_1$ is applied across gates of the MOSFETs M1 and M2. A second signal or a differential voltage $V_2$ is applied in positive or negative phase (or polarity) to the gate of the MOSFET M3.

In the tenth embodiment, similar to the ninth embodiment, the substantial tail current that drives the MOSFETs M1 and M2 is expressed as $$I_{EE}'=I_0-I_{D3},$$

where $I_{D33}$ is a drain current of the MOSFET M3, so that the tenth embodiment is equivalent to a differential pair driven by the current $I_{EE}'$.

[Eleventh to Seventeenth Embodiments]

FIGS. 28 to 34 show two-quadrant analog multipliers according to eleventh to seventeenth embodiments, respectively, each of which is composed of only one triple-tail or quadritail cell of bipolar transistors.

In the above MOS triple-tail and quadritail cells, the input voltage ranges for $V_1$ and $V_2$ are decided by their capacities, i.e., gate-width to gate-length ratios (W/L) of the MOSFETs, and therefore, the ranges can be made comparatively wider.

On the other hand, in the above bipolar ones, the input voltage ranges for $V_1$ and $V_2$ are decided by only their emitter areas, which means that the ranges cannot be made as wide as those of the MOS multitail cells.

To expand the input voltage ranges for the bipolar multitail cells, additional resistors or diodes may be provided.

Figure 28:
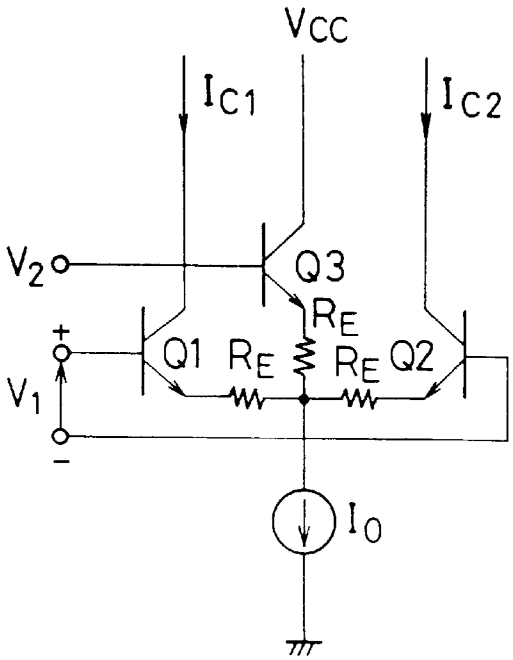
FIG. 28 is a circuit diagram of a multiplier according to an eleventh embodiment of the invention.

The bipolar triple-tail cell according to the eleventh embodiment is shown in FIG. 28, which has three resistors (resistance: $R_E$) connected to the emitters of the respective transistors Q1, Q2 and Q3. The emitters are connected in common to the end of the constant current source through the resistors, respectively.

Figure 29:
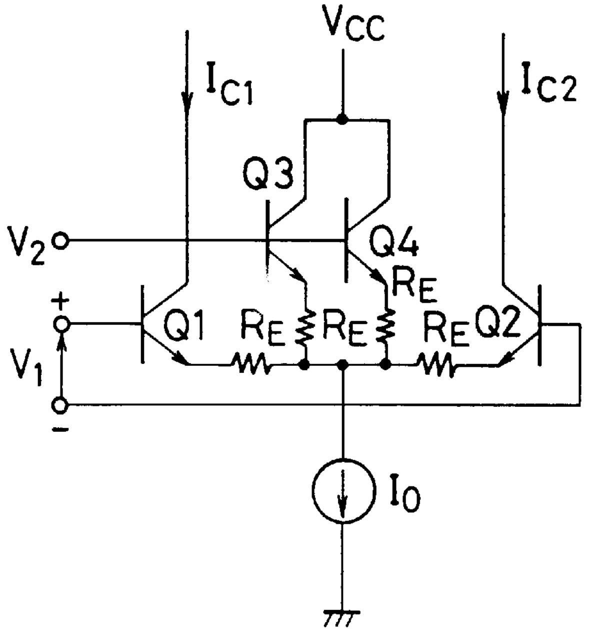
FIG. 29 is a circuit diagram of a multiplier according to a twelfth embodiment of the invention.

The bipolar quadritail cell according to the twelfth embodiment is shown in FIG. 29, which has four resistors (resistances: $R_E$) connected to the emitters of the respective transistors Q1, Q2, Q3 and Q4. The emitters are connected in common to the end of the constant current source through the resistors, respectively.

Figure 30:
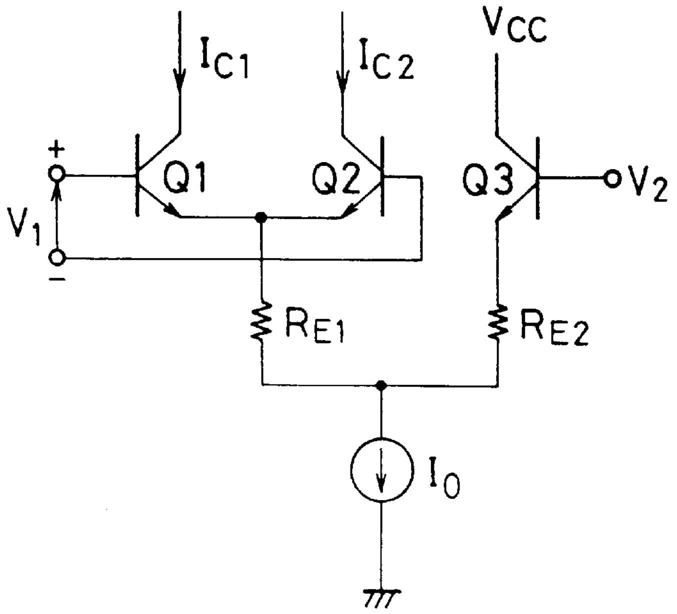
FIG. 30 is a circuit diagram of multiplier according to a thirteenth embodiment of the invention.

The bipolar triple-tail cell according to the thirteenth embodiment is shown in FIG. 30, which has first and second resistors whose resistance values are $R_{E1}$ and $R_{E2}$, respectively. The first resistor ($R_{E1}$) is connected to the coupled emitters of the transistors Q1 and Q2. The second resistor ($R_{E2}$) is connected to the emitter of the transistor Q3.

The coupled emitters of the transistors Q1 and Q2 are connected in common to the end of the constant current source through the first resistor. The emitter of the transistor Q3 is connected to the end of the constant current source through the second resistor.

Figure 31:
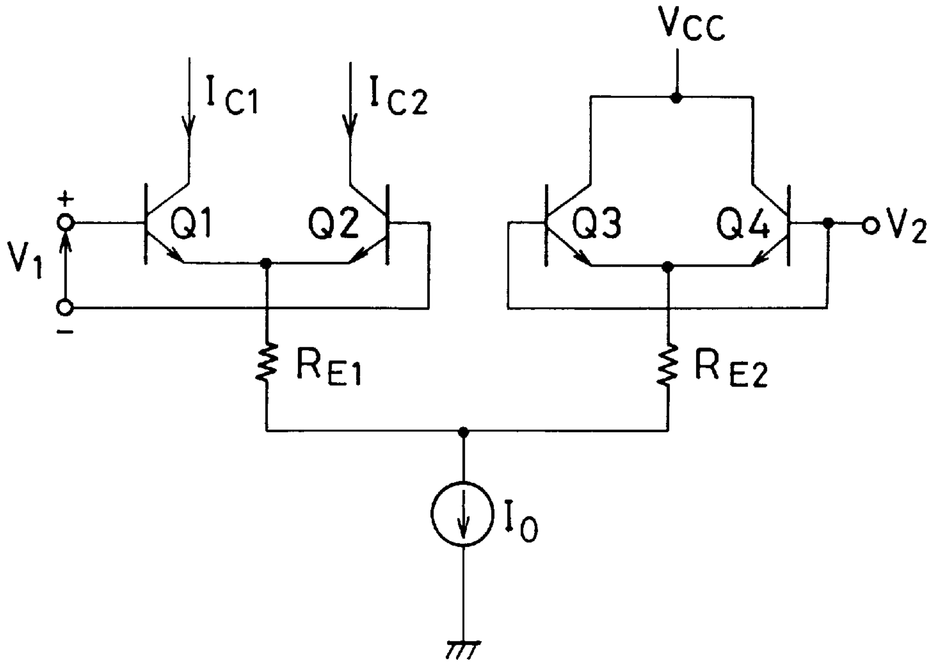
FIG. 31 is a circuit diagram of a multiplier containing two multitail cells according to a fourteenth embodiment of the invention.

The bipolar quadritail cell according to the fourteenth embodiment is shown in FIG. 31, which has first and second resistors whose resistances are $R_{E1}$ and $R_{E2}$, respectively. The first resistor ($R_{E1}$) is connected to the coupled emitters of the transistors Q1 and Q2. The second resistor ($R_{E2}$) is connected to the coupled emitters of the transistors Q3 and Q4.

The coupled emitters of the transistors Q1 and Q2 are connected in common to the end of the constant current source through the first resistor. The couple emitters of the transistors Q3 and Q4 are connected to the end of the constant current source through the second resistor.

Figure 32:
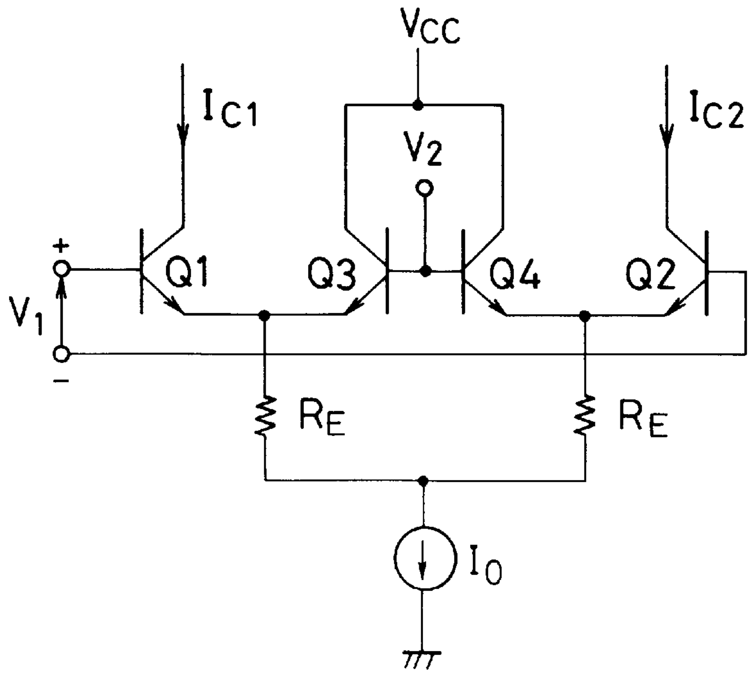
FIG. 32 is a circuit diagram of a multiplier according to a fifteenth embodiment of the invention.

The bipolar quadritail cell according to the fifteenth embodiment is shown in FIG. 32, which has first and second resistors whose resistances are both $R_E$. The first resistor is connected to the coupled emitters of the transistors Q1 and Q3. The second resistor is connected to the coupled emitters of the transistors Q2 and Q4.

The coupled emitters of the transistors Q1 and Q3 are connected in common to the end of the constant current source through the first resistor. The coupled emitters of the transistors Q2 and Q4 are connected to the end of the constant current source through the second resistor.

In the above eleventh to fifteenth embodiments, the emitter resistors are arranged in the form of T character; however, it is needless to say that they may be arranged in the form of π character or the like.

Such the method of adding the emitter resistors is termed the "emitter degeneration method". In this method, the input voltage ranges for $V_1$ and $V_2$ of a bipolar multitail cell can be enlarged if the degeneration value is set optimum for each emitter resistor, where the degeneration value is defined as the product of each emitter resistance value and the tail current value, because of improvement in transconductance linearity.

Figure 33:
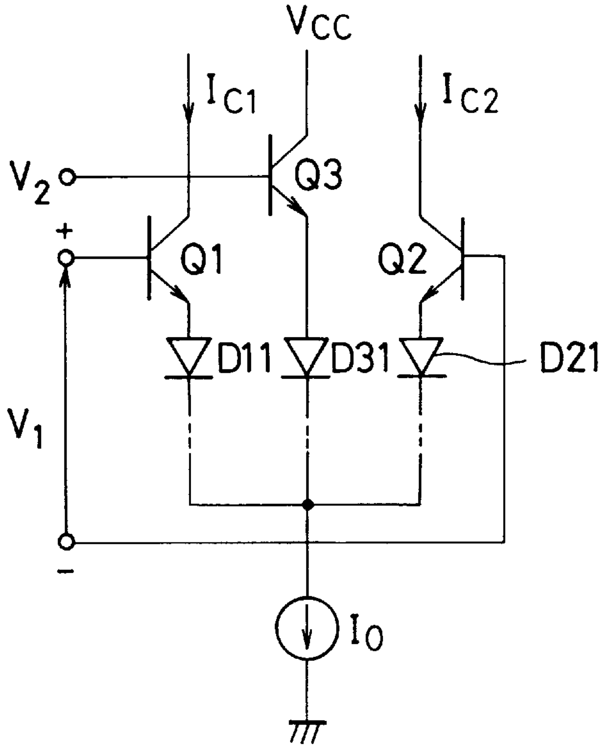
FIG. 33 is a circuit diagram of a multiplier according to a sixteenth embodiment of the invention.

The bipolar triple-tail cell according to the sixteenth embodiment shown in FIG. 33 has series-connected diodes $D_{11}$ connected to the emitter of the transistor Q1, series-connected diodes $D_{21}$ connected to the emitter of the transistor Q2, and series-connected diodes $D_{31}$ connected to the emitter of the transistor Q3. The emitters of the transistors Q1, Q2 and Q3 are connected in common to the end of the constant current source through the diodes $D_{11}$, $D_{21}$ and $D_{31}$, respectively.

Figure 34:
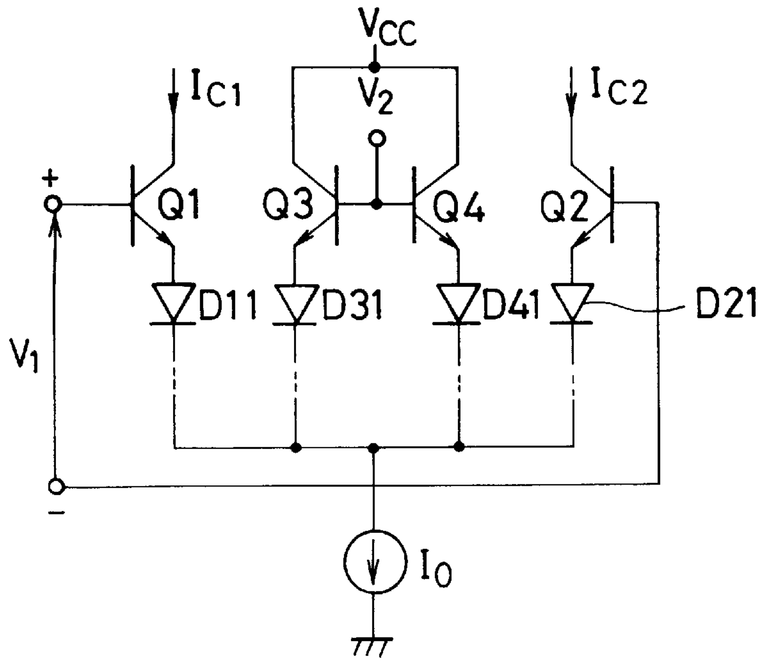
FIG. 34 is a circuit diagram of a multiplier according to a seventeenth embodiment of the invention.

The bipolar triple-tail cell according to the seventeenth embodiment is shown in FIG. 34, which has series-connected diodes $D_{11}$ connected to the emitter of the transistor Q1, series-connected diodes $D_{21}$ connected to the emitter of the transistor Q2, series-connected diodes $D_{31}$ connected to the emitter of the transistor Q3, and series-connected diodes $D_{41}$ connected to the emitter of the transistor Q4. The emitters are connected in common to the end of the constant current source through the diodes $D_{11}$, $D_{21}$, $D_{31}$ and $D_{41}$, respectively.

In the sixteenth and seventeenth embodiments, the input voltages $V_1$ and $V_2$ are divided by the corresponding diodes to be applied to each transistors.

Also, if the number of each of series-connected diodes is defined as n, although the necessary supply voltage, i.e., the operating voltage for each multitail cell increases by $n \cdot V_{BE}$ where the base-emitter voltage of each transistor; however, the obtainable input voltage ranges can be expanded to (n+1) times the ranges shown in FIG. 15 or 20.

For example, if m=1, the input voltage ranges are expanded to twice the ranges in FIG. 15 or 20, and at the same time, the operating voltage increases by 0.7 V. However, compared with the conventional Gilbert multiplier cell, the supply voltage can be reduced because the input voltage ranges for $V_1$ and $V_2$ need not be set separately or differently.

Therefore, in the case of the emitter diodes, the multitail cells according to the sixteenth and seventeenth embodiments can operate at a low supply voltage such as 3 or 3.3 V together with the enlarged input voltage ranges.

The above methods of adding the emitter resistors or diodes may be also applied to the case of three or more transistors to be applied with the second voltage $V_1$.

[Eighteenth Embodiment]

In the above first to seventeenth embodiments, one triple-tail or quadritail cell is employed; however, a multiplier can be obtained by using two such the triple-tail or quadritail cells.

Figure 35:
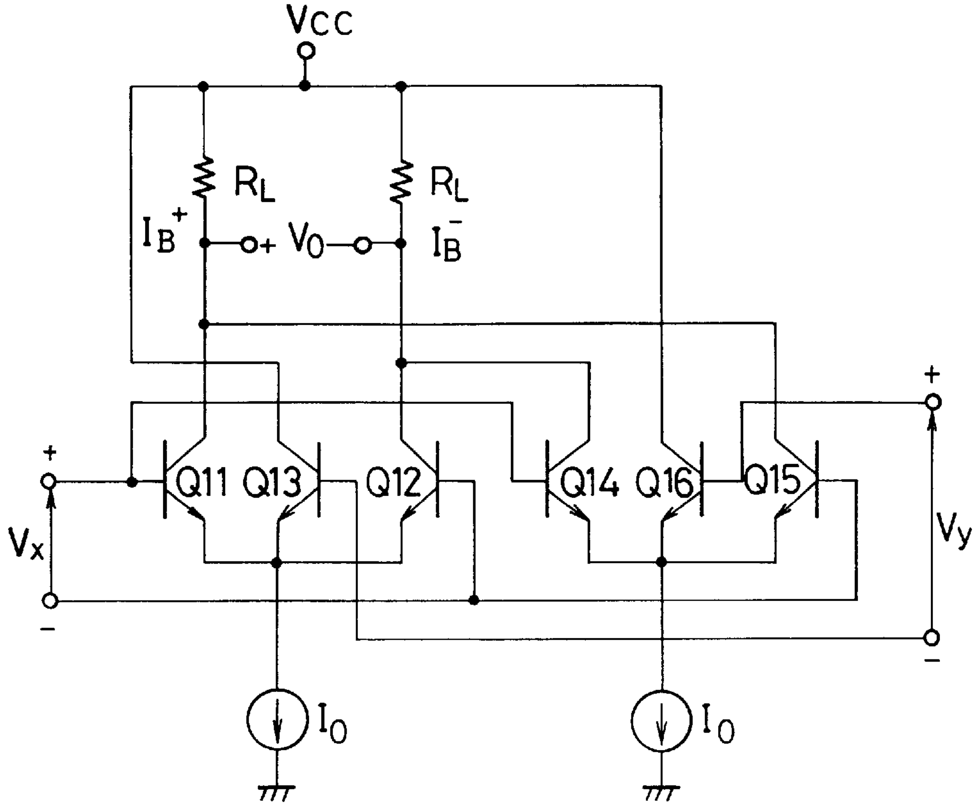
FIG. 35 is a circuit diagram of multiplier according to an eighteenth embodiment of the invention.

FIG. 35 shows a four-quadrant analog multiplier according to an eighteenth embodiment, which is composed of two triple-tail cells of bipolar transistors. This is equivalent to one that the triple-tail cells according to the first embodiment shown in FIG. 14 are combined with each other.

In FIG. 35, this multiplier comprises first and second bipolar triple-tail cells.

The first triple-tail cell contains a differential pair of npn bipolar transistors Q11 and Q12, an npn bipolar transistor Q13 and a first constant current source (current: $I_0$).

The transistors Q11, Q12 and Q13 have emitters connected in common to one end of the first constant current source, and they are driven by the same current source. The other end of the first constant current source is grounded.

The transistors Q11, Q12 and Q13 are the same in emitter area.

A first load resistor (resistance: $R_L$) is connected to a collector of the transistor Q11 and a second load resistor (resistance: $R_L$) is connected to a collector of the transistor Q12. A supply voltage $V_{CC}$ is applied to the collectors of the transistors Q11 and Q12 through the first and second resistors, respectively. The supply voltage $V_{CC}$ is directly applied to a collector of the transistor Q13.

A first signal or a differential voltage $V_x$ is applied across differential input ends of the pair, i.e., bases of the transistors Q11 and Q12. A second signal or a differential voltage $V_y$ is applied in negative polarity to an input end or a base of the transistor Q13.

The second triple-tail cell contains a differential pair of npn bipolar transistors Q14 and Q15, an npn bipolar transistor Q16 and a second constant current source (current: $I_0$).

The transistors Q14, Q15 and Q16 have emitters connected in common to one end of the second constant current source, and they are driven by the same current source. The other end of the second constant current source is grounded.

The transistors Q14, Q15 and Q16 are the same in emitter area.

The first load resistor is connected to a collector of the transistor Q15 and the second load resistor is connected to a collector of the transistor Q14. The supply voltage $V_{CC}$ is applied to the collectors of the transistors Q15 and Q14 through the first and second resistors, respectively. The supply voltage $V_{CC}$ is directly applied to a collector of the transistor Q16.

The first signal or the differential voltage $V_x$ is applied across differential input ends of the pair, i.e., bases of the transistors Q14 and Q15. The second signal or the differential voltage $V_y$ is applied in positive polarity to an input end or a base of the transistor Q16.

The voltage $V_x$ is applied to the bases of the transistors Q11 and Q14 in positive polarity and to the bases of the transistors Q12 and Q15 in negative polarity.

The coupled collectors of the transistors Q11 and Q15 are coupled with the coupled collectors of the transistors Q12 and Q14 in opposite polarities, constituting a differential output ends of the multiplier, to which the first and second load resistors are connected, respectively.

Then, similar to the first embodiment, supposing that the transistors Q11, Q12, Q13, Q14, Q15 and Q16 are matched in characteristic and ignoring the base-width modulation, an output differential current $\Delta I_B$ of this multiplier can be given by the following equation (47).

In the equation (47), $I_{C11}$, $I_{C12}$, $I_{C13}$ and $I_{C14}$ are collector currents of the transistors Q11, Q12, Q13 and Q14, respectively, and $I_B^+$ and $I_B^-$ are output currents from the coupled collectors of the transistors Q11 and Q13 and from those of the transistors Q12 and Q14, respectively $$\Delta I_B = I_B^+ - I_B^- = (I_{C11} + I_{C13}) - (I_{C12} + I_{C14}) = \frac{4\alpha_F I_0 \sinh\left(\frac{V_X}{2V_T}\right)\sinh\left(\frac{V_y}{2V_T}\right)}{\left\{2\cosh\left(\frac{V_x}{2V_T}\right) + \exp\left(\frac{V_y}{2V_T}\right)\right\}\left\{2\cosh\left(\frac{V_x}{2V_T}\right) + \exp\left(-\frac{V_y}{2V_T}\right)\right\}} \tag{47}$$

Figure 36:
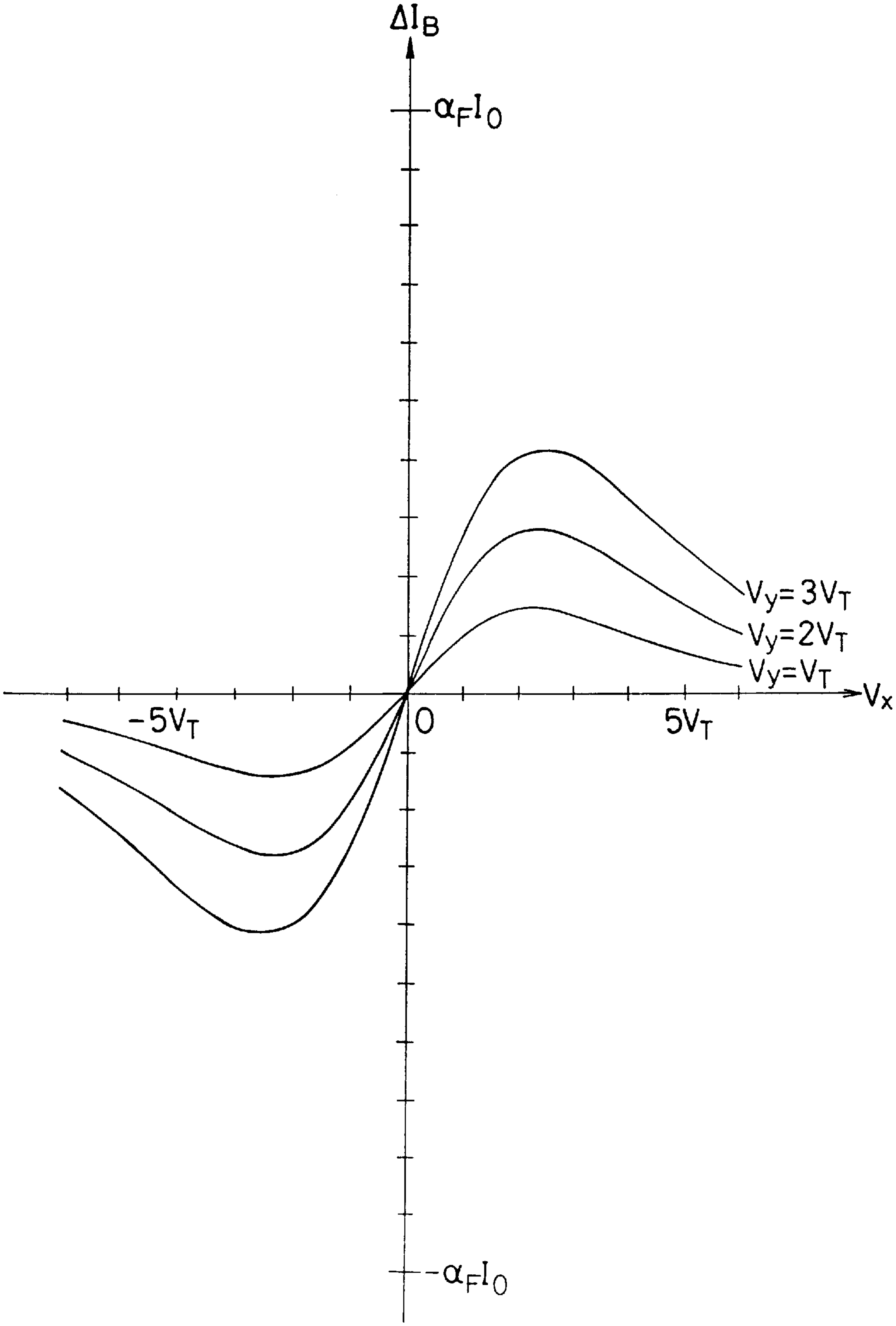
FIG. 36 is a graph showing the transfer characteristic of the multiplier of FIG. 35 according to the eighteenth embodiment.
Figure 37:
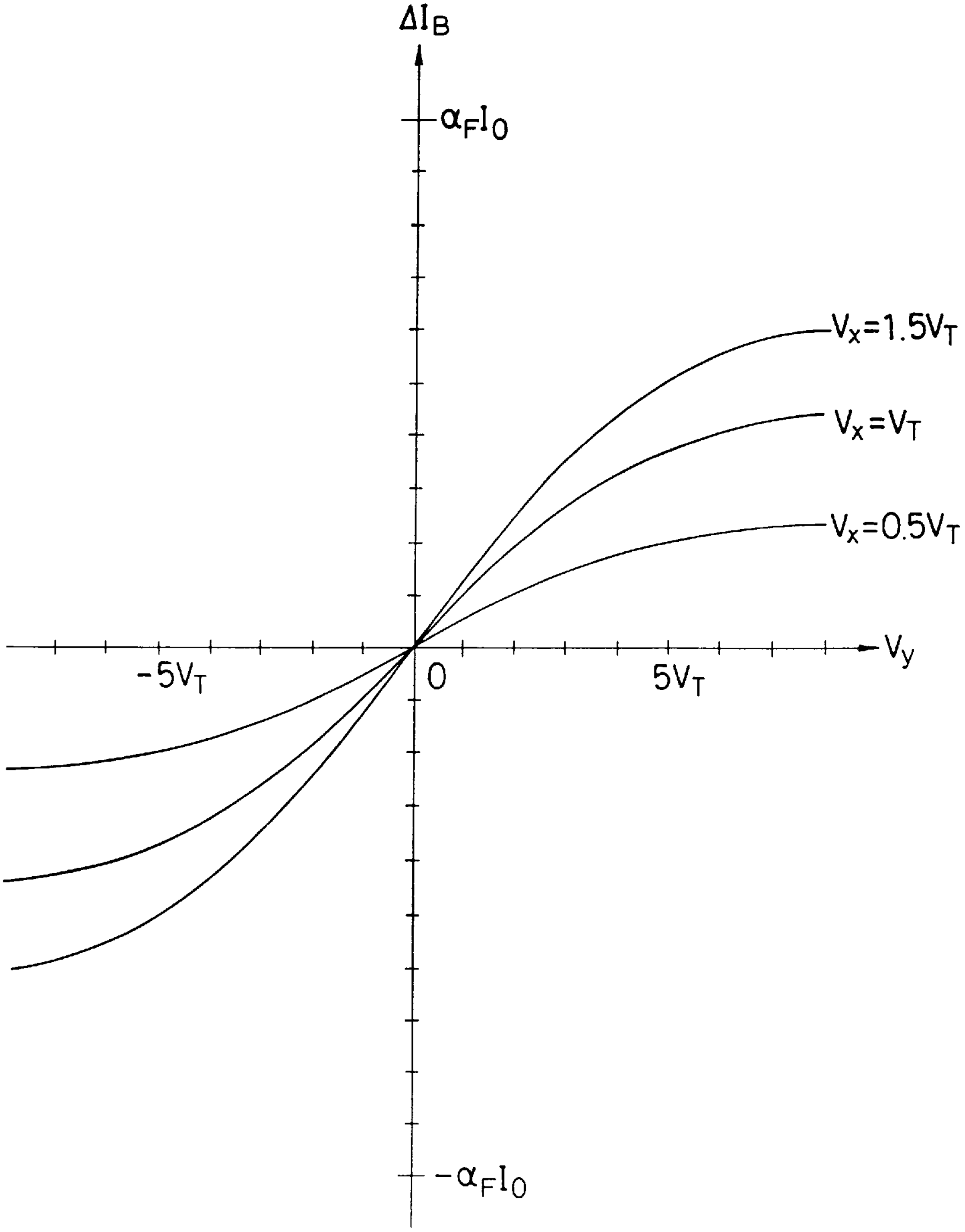
FIG. 37 is a graph showing the transfer characteristic of the multiplier of FIG. 35 according to the eighteenth embodiment.

FIGS. 36 and 37 show the transfer characteristics of the multiplier according to the eighteenth embodiment. FIG. 36 shows the relationship between the differential output current $\Delta I_B$ and the first input voltage $V_x$ with the second input voltage $V_y$ as a parameter. FIG. 37 shows the relationship between the differential output current $\Delta I_B$ and the second input voltage $V_y$ with the first input voltage $V_x$ as a parameter.

It is seen from FIGS. 36 and 37 that the deferential output current $\Delta I_B$ has a limiting characteristic for the first input voltage $V_x$, and on the other hand, the current $\Delta I_B$ has a limiting characteristic for the second input voltage $V_y$.

Figure 38:
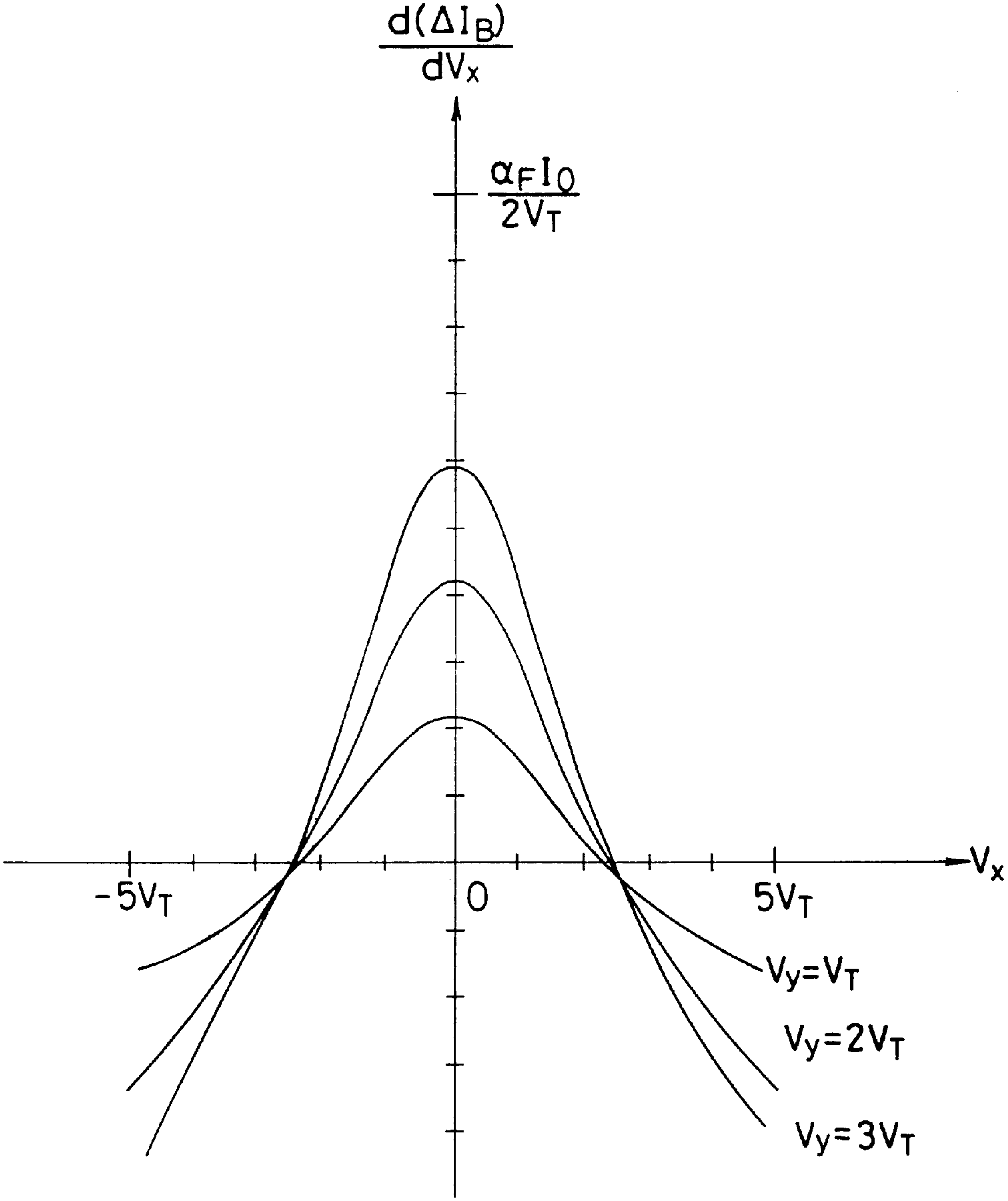
FIG. 38 is a graph showing the transconductance characteristic of the multiplier of FIG. 35 according to the eighteenth embodiment.
Figure 39:
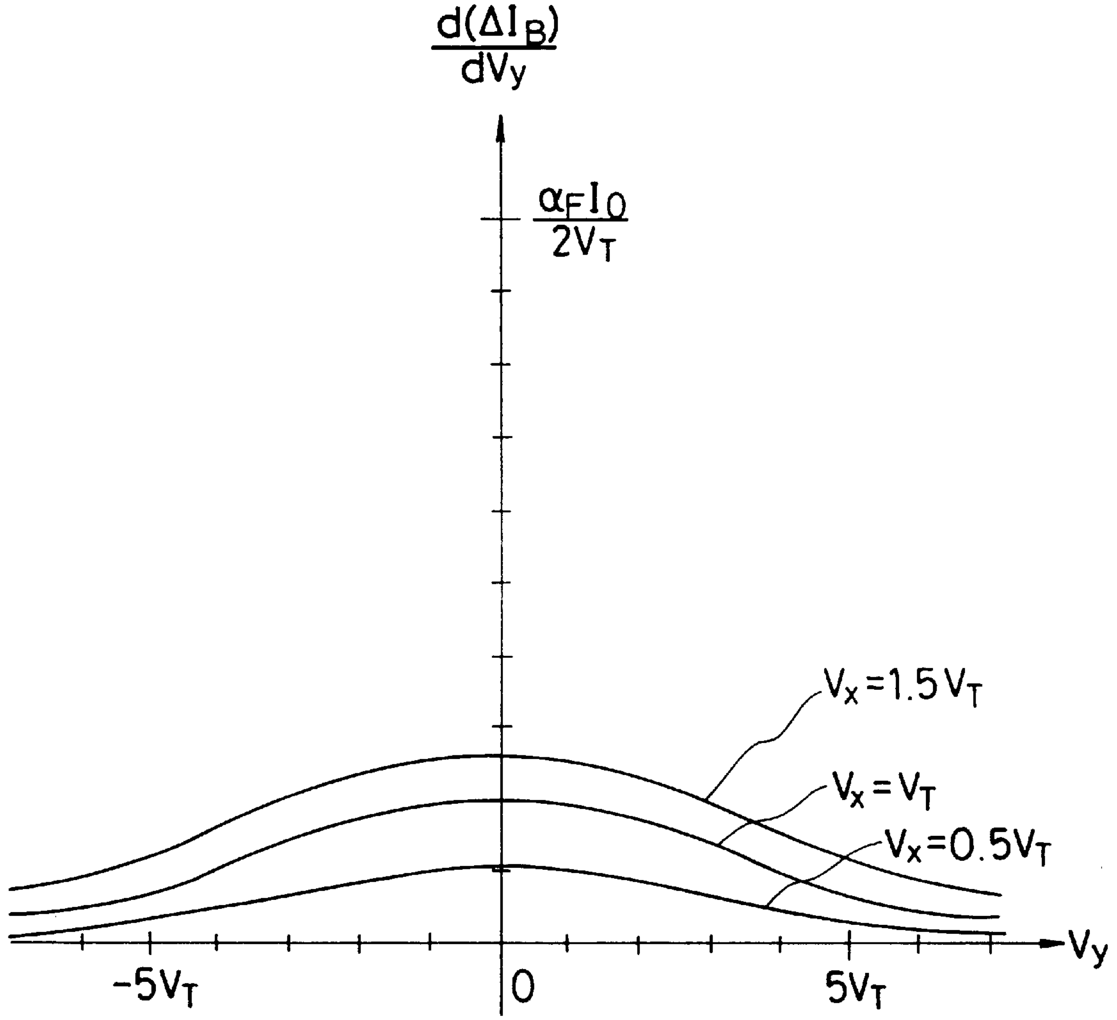
FIG. 39 is a graph showing the transconductance characteristic of the multiplier of FIG. 35 according to the eighteenth embodiment.

The transconductance characteristics of the multiplier can be given by differentiating the differential output current $\Delta I_B$ by the first or second input voltage $V_x$ or $V_y$ in the equation (47), resulting in the following equation (48) and FIG. 38 for $V_x$ and the following equation (49) and FIG. 39 for $V_y$.

$$\frac{d(\Delta I_B)}{dV_x} = \frac{2\alpha_F I_0}{V_T} \times \left[\frac{\cosh\left(\frac{V_X}{2V_T}\right)\sinh\left(\frac{V_y}{2V_T}\right)}{\left\{2\cosh\left(\frac{V_x}{2V_T}\right) + \exp\left(\frac{V_y}{2V_T}\right)\right\}\left\{2\cosh\left(\frac{V_x}{2V_T}\right) + \exp\left(-\frac{V_y}{2V_T}\right)\right\}} - \frac{4\sinh^2\left(\frac{V_X}{2V_T}\right)\sinh\left(\frac{V_y}{2V_T}\right)\left\{2\cosh\left(\frac{V_x}{2V_T}\right) + \cosh\left(\frac{V_y}{2V_T}\right)\right\}}{\left\{2\cosh\left(\frac{V_x}{2V_T}\right) + \exp\left(\frac{V_y}{2V_T}\right)\right\}^2\left\{2\cosh\left(\frac{V_x}{2V_T}\right) + \exp\left(-\frac{V_y}{2V_T}\right)\right\}^2}\right] \tag{48}$$

$$\frac{d(\Delta I_B)}{dV_y} = \frac{2\alpha_F I_0}{V_T} \times \left[\frac{\sinh\left(\frac{V_X}{2V_T}\right)\cosh\left(\frac{V_y}{2V_T}\right)}{\left\{2\cosh\left(\frac{V_x}{2V_T}\right) + \exp\left(\frac{V_y}{2V_T}\right)\right\}\left\{2\cosh\left(\frac{V_x}{2V_T}\right) + \exp\left(-\frac{V_y}{2V_T}\right)\right\}} + \frac{4\sinh\left(\frac{V_X}{V_T}\right)\sinh^2\left(\frac{V_y}{2V_T}\right)}{\left\{2\cosh\left(\frac{V_x}{2V_T}\right) + \exp\left(\frac{V_y}{2V_T}\right)\right\}^2\left\{2\cosh\left(\frac{V_x}{2V_T}\right) + \exp\left(-\frac{V_y}{2V_T}\right)\right\}^2}\right] \tag{49}$$

It is seen that the four-quadrant analog multiplier according to the eighteenth embodiment is expanded in linear transconductance range for the first input voltage $V_1$.

[Nineteenth Embodiment]

Figure 35A:
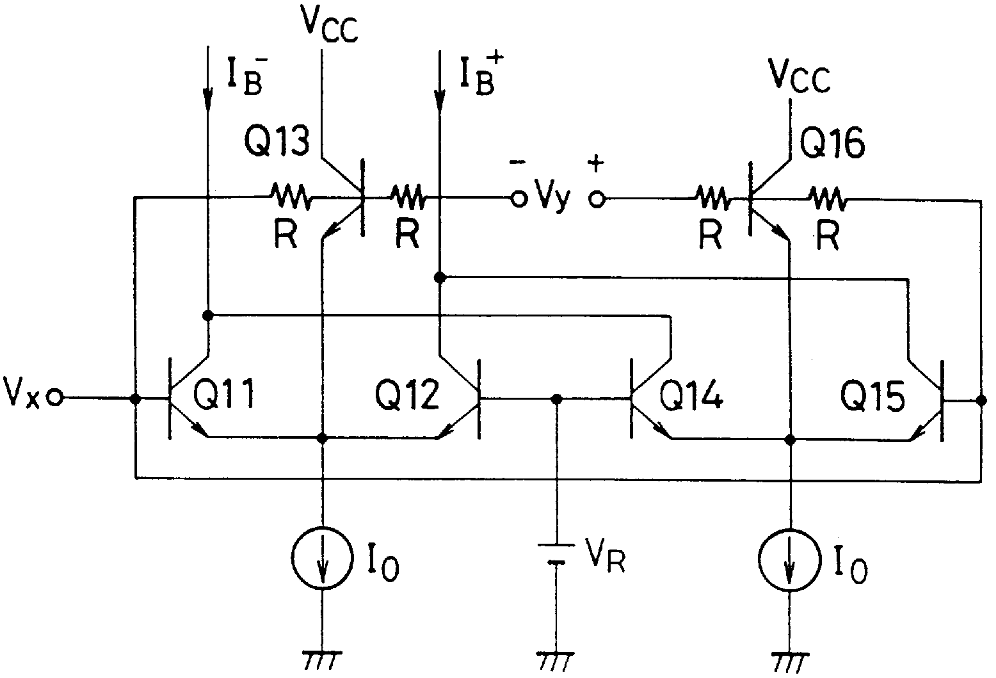
FIG. 35A is a circuit diagram of multiplier according to a nineteenth embodiment of the invention.

FIG. 35A shows a four-quadrant analog multiplier according to a nineteenth embodiment, which is composed of two triple-tail cells of bipolar transistors. This is equivalent to one that the triple-tail cells according to the second embodiment shown in FIG. 14A are combined with each other.

It is also said that this multiplier is the same in configuration as that of the eighteenth embodiment shown in FIG. 35 other than that four resistors and a dc voltage source are added.

In FIG. 35A, a constant dc voltage $V_R$ is applied to the bases of the transistors Q12 and Q14. A first voltage $V_1$, which is not a differential one, is applied to the base of the transistors Q11 and Q15.

A first resistor (resistance: R) is connected between the bases of the transistors Q11 and Q13 and a second resistor (resistance: R) is connected to the base of the transistor Q13. A third resistor (resistance: R) is connected between the bases of the transistors Q15 and Q16 and a fourth resistor (resistance: R) is connected to the base of the transistor Q16.

A voltage ($V_x/2$) is applied to the bases of the transistors Q11, Q12, Q13, Q14, Q15 and Q16, so that the voltage $V_1$ need not be a differential one.

The voltage $V_2$ is divided by the first and second resistors to be applied to the base of the transistor Q13 on the one hand and it is divided by the third and fourth resistors to be applied to the base of the transistor Q16, on the other hand.

Therefore, the output value of the multiplier becomes a half that of the eighteenth embodiment.

[Twentieth Embodiment]

Figure 35B:
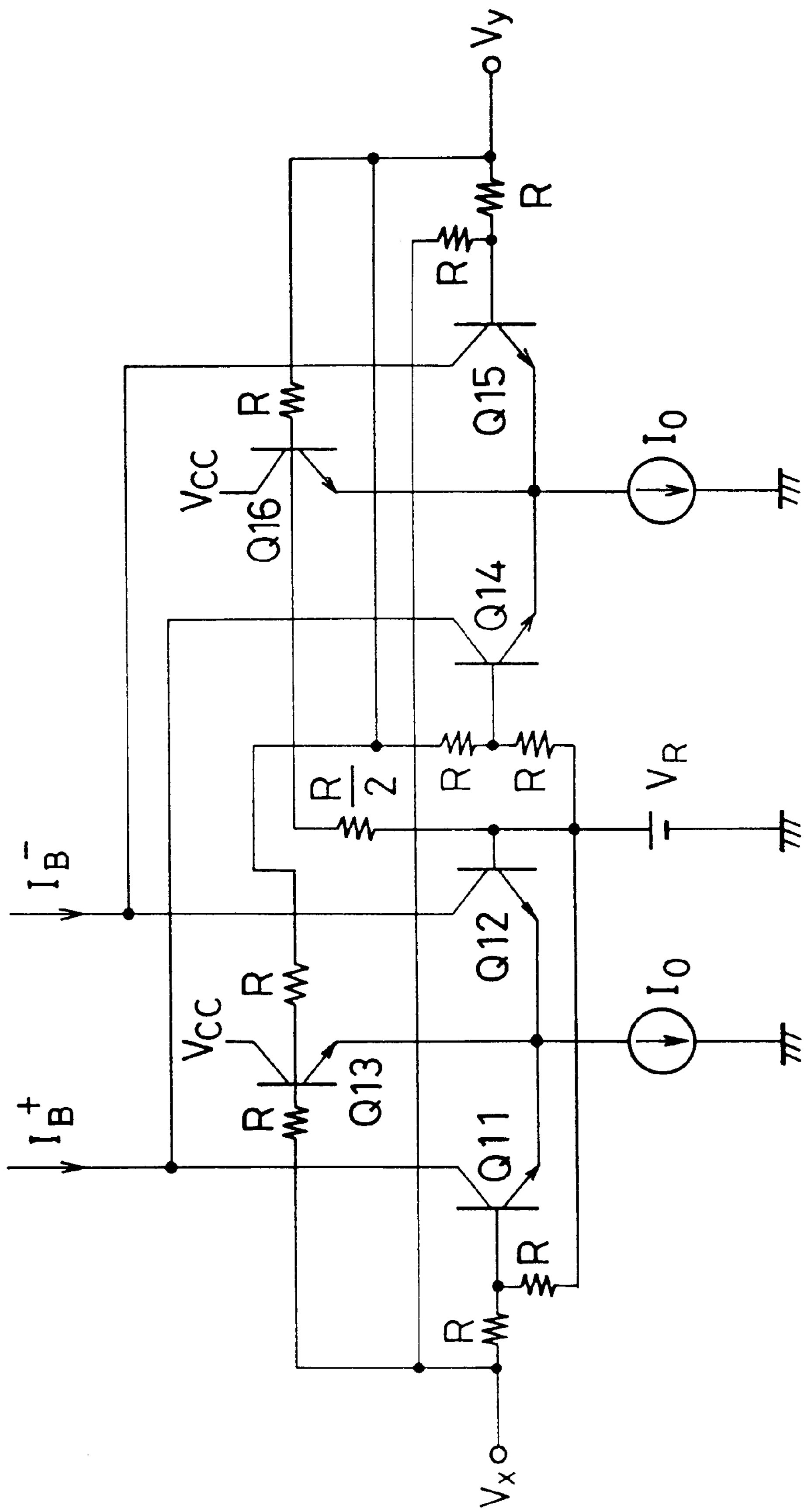
FIG. 35B is a circuit diagram of multiplier according to a twentieth embodiment of the invention.

FIG. 35B shows a four-quadrant analog multiplier according to a twentieth embodiment, which is composed of two triple-tail cells of bipolar transistors. This also is equivalent to one that the triple-tail cells according to the second embodiment shown in FIG. 14A are combined with each other.

It is also said that this multiplier is the same in configuration as that of the eighteenth embodiment shown in FIG. 35 other than that eleven resistors and a dc voltage source are added.

In FIG. 35B, a first resistor (resistance: R) is connected between the base of the transistor Q11 and an input end for the voltage $V_x$, and a second resistor (resistance: R) is connected between the bases of the transistors Q11 and Q12. A third resistor (resistance: R) is connected between the input end for the voltage $V_x$ and the base of the transistor Q13, and a fourth resistor (resistance: R) is connected between the base of the transistor Q13 and an input end for the voltage $V_y$.

A fifth resistor (resistance: R) is connected between the base of the transistor Q15 and the input end for the voltage $V_y$, and a sixth resistor (resistance: R) is connected between the base of the transistors Q15 and the input end for $V_x$. A seventh resistor (resistance: R) is connected between the input end for the voltage $V_y$ and the base of the transistor Q16, and an eighth resistor (resistance: R/2) is connected between the bases of the transistors Q16 and Q12.

A ninth resistor (resistance: R) is connected between the bases of the transistors Q11 and Q14, and a tenth resistor (resistance: R) is connected between the base of the transistors Q14 and the input end for the voltage $V_y$.

A constant dc voltage $V_R$ is applied to the base of the transistor Q11 through the first resistor, is applied directly to the base of the transistor Q12, and is applied to the base of the transistor Q13 through the fourth, ninth and tenth resistors.

The constant dc voltage $V_R$ is also applied to the base of the transistor Q14 through the ninth resistor, and is applied to the base of the transistor Q16 through the eighth resistor.

With this multiplier, a voltage ($V_x/2$) is applied to the bases of the transistors Q11, Q12 and Q13 forming the first triple-tail cell, and a voltage $[(V_x/2)+V_x]$ is applied to the bases of the transistors Q14, Q15 and Q16 forming the second triple-tail cell.

There is an advantage that both the input voltages $V_1$ and $V_2$ need not be differential ones. However, the output value of the multiplier becomes a quarter that of the eighteenth embodiment.

[Twenty-First Embodiment]

Figure 40:
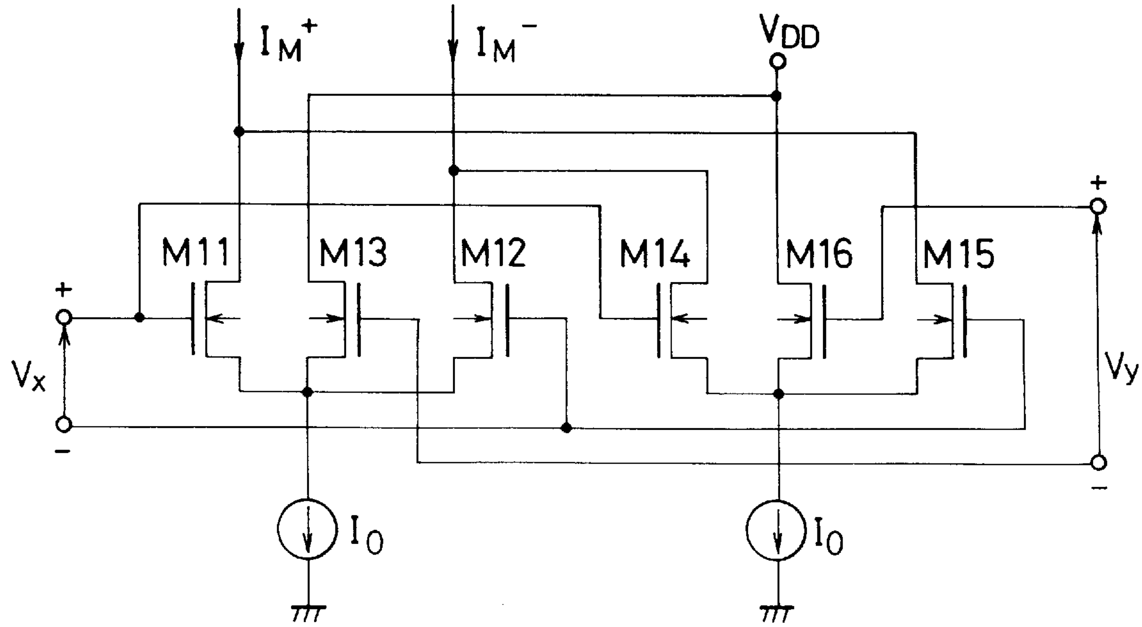
FIG. 40 is a circuit diagram of multiplier according to a twenty-first embodiment of the invention.

FIG. 40 shows a four-quadrant analog multiplier according to a twenty-first embodiment, which is composed of two triple-tail cells of MOSFETs. This is equivalent to one that the triple-tail cells according to the third embodiment shown in FIG. 17 are combined with each other.

In FIG. 40, this multiplier comprises first and second MOS triple-tail cells.

The first triple-tail cell contains a differential pair of n-channel MOSFETs M11 and M12, an n-channel MOSFET M13 and a first constant current source (current: $I_0$).

The MOSFETs M11, M12 and M13 have sources connected in common to one end of the first constant current source, and they are driven by the same current source. The other end of the first constant current source is grounded.

The transistors M11, M12 and M13 are the same in gate-width to gate-length ratio.

A first load resistor (not shown) is connected to a drain of the MOSFET M11 and a second load resistor (not shown) is connected to a drain of the MOSFET M12. A supply voltage $V_{DD}$ is applied to the drains of the MOSFETs M11 and M12 through the first and second resistors, respectively. The supply voltage $V_{DD}$ is directly applied to a drain of the MOSFET M13.

A first signal or a differential voltage $V_x$ is applied across differential input ends of the pair, i.e., gates of the MOSFETs M11 and M12. A second signal or a differential voltage $V_y$ is applied in negative polarity to an input end or a gate of the MOSFET M13.

The second triple-tail cell contains a differential pair of n-channel MOSFETs M14 and M15, an n-channel MOSFET M16 and a second constant current source (current $I_0$).

The MOSFETs M14, M15 and M16 have sources connected in common to one end of the second constant current source, and they are driven by the same current source. The other end of the second constant current source is grounded.

The MOSFETs M14, M15 and M16 are the same in gate-width to gate-length ratio.

The first load resistor is connected to a drain of the MOSFET M15 and the second load resistor is connected to a drain of the MOSFET M14. The supply voltage $V_{DD}$ is applied to the drains of the MOSFETs M15 and M14 through the first and second resistors, respectively The supply voltage $V_{DD}$ is directly applied to a drain of the MOSFET M16.

The first signal or the differential voltage $V_x$ is applied across differential input ends of the pair, i.e., gates of the MOSFETs M14 and M15. The second signal or the differential voltage $V_y$ is applied in positive polarity to an input end or a gate of the MOSFET M16.

The voltage $V_x$ is applied to the gates of the MOSFETs M11 and M14 in positive polarity and to the gates of the MOSFETs M12 and M15 in negative polarity.

The coupled drains of the MOSFETs M11 and M15 are coupled with the coupled drains, of the MOSFETs M12 and M14 in opposite phases, constituting a differential output ends of the multipliers to which the first and second load resistors are connected, respectively.

Then, similar to the third embodiment, supposing that the MOSFETs M11, M12, M13, M14, M15 and M16 are matched in characteristic and ignoring the gate-width modulation, an output differential current $\Delta I_M$ of this multiplier can be given by the following equations (50), (51), (52) and (53).

In these equations, $I_{D11}$, $I_{D12}$, $I_{D13}$ and $I_{D14}$ are drain currents of the MOSFETs M11, M12, M13 and M14, respectively, and $I_M^+$ and $I_M^-$ are output currents from the coupled drains of the MOSFETs M11 and M13 and from those of the MOSFETs M12 and M14, respectively.

$$\Delta I_M = I_M^+ - I_M^- = (I_{D11} + I_{D13}) - (I_{D12} + I_{D14}) = \frac{2}{3}\beta V_x V_y \tag{50}$$

$$\left(|V_X| \le -\frac{|V_y|}{5} + \frac{2}{5}\sqrt{\frac{5I_0}{\beta} - V_y^2}\ ,\ |V_x| \le \sqrt{\frac{2I_0}{\beta} - V_y^2}\right)$$

$$\begin{aligned}\Delta I_M &= I_M^+ - I_M^- = (I_{D11} + I_{D13}) - (I_{D12} + I_{D14}) \\ &= \frac{1}{3}\beta V_x V_y - \frac{1}{3}\left\{\beta V_x\sqrt{\frac{3I_0}{\beta} - \frac{3}{2}V_x^2 - \frac{1}{2}V_y^2}\right\}sgn(V_y) + \left\{\frac{I_0}{2} + \frac{1}{8}\beta(|V_x| + |V_y|) \times \sqrt{\frac{8I_0}{\beta} - (|V_x| + |V_y|)^2}\right\}sgn(V_x V_y)\end{aligned} \tag{51}$$

$$\left(|V_x| \ge \sqrt{\frac{2I_0}{\beta} - V_y^2}\ ,\ |V_x| \le -\frac{|V_y|}{5} + \frac{2}{5}\sqrt{\frac{5I_0}{\beta} - V_y^2}\right)$$

$$\begin{aligned}\Delta I_M &= I_M^+ - I_M^- = (I_{D11} + I_{D13}) - (I_{D12} + I_{D14}) \\ &= \frac{1}{3}\beta V_x V_y - \left\{\frac{1}{3}\beta V_x\sqrt{\frac{3I_0}{\beta} - \frac{3}{2}V_x^2 - \frac{1}{2}V_y^2} - \beta V_x\sqrt{\frac{2I_0}{\beta} - V_x^2}\right\}s\end{aligned} \tag{52}$$

$$\left(|V_x| \ge -\frac{|V_y|}{5} + \frac{2}{5}\sqrt{\frac{5I_0}{\beta} - V_y^2}\ ,\ |V_x| \le \sqrt{\frac{2I_0}{\beta} - V_y^2}\right)$$

$$\begin{aligned}\Delta I_M &= I_M^+ - I_M^- = (I_{D11} + I_{D13}) - (I_{D12} + I_{D14}) \\ &= \left\{\frac{I_0}{2} + \frac{1}{8}\beta(|V_x| + |V_y|) \times \sqrt{\frac{8I_0}{\beta} - (|V_x| + |V_y|)^2}\right\}sgn(V_x V_y)\end{aligned} \tag{53}$$

$$\left(\sqrt{\frac{I_0}{\beta}} \le |V_x|,\ \sqrt{\frac{2I_0}{\beta} - V_y^2} \le |V_x|\right)$$

Figure 41:
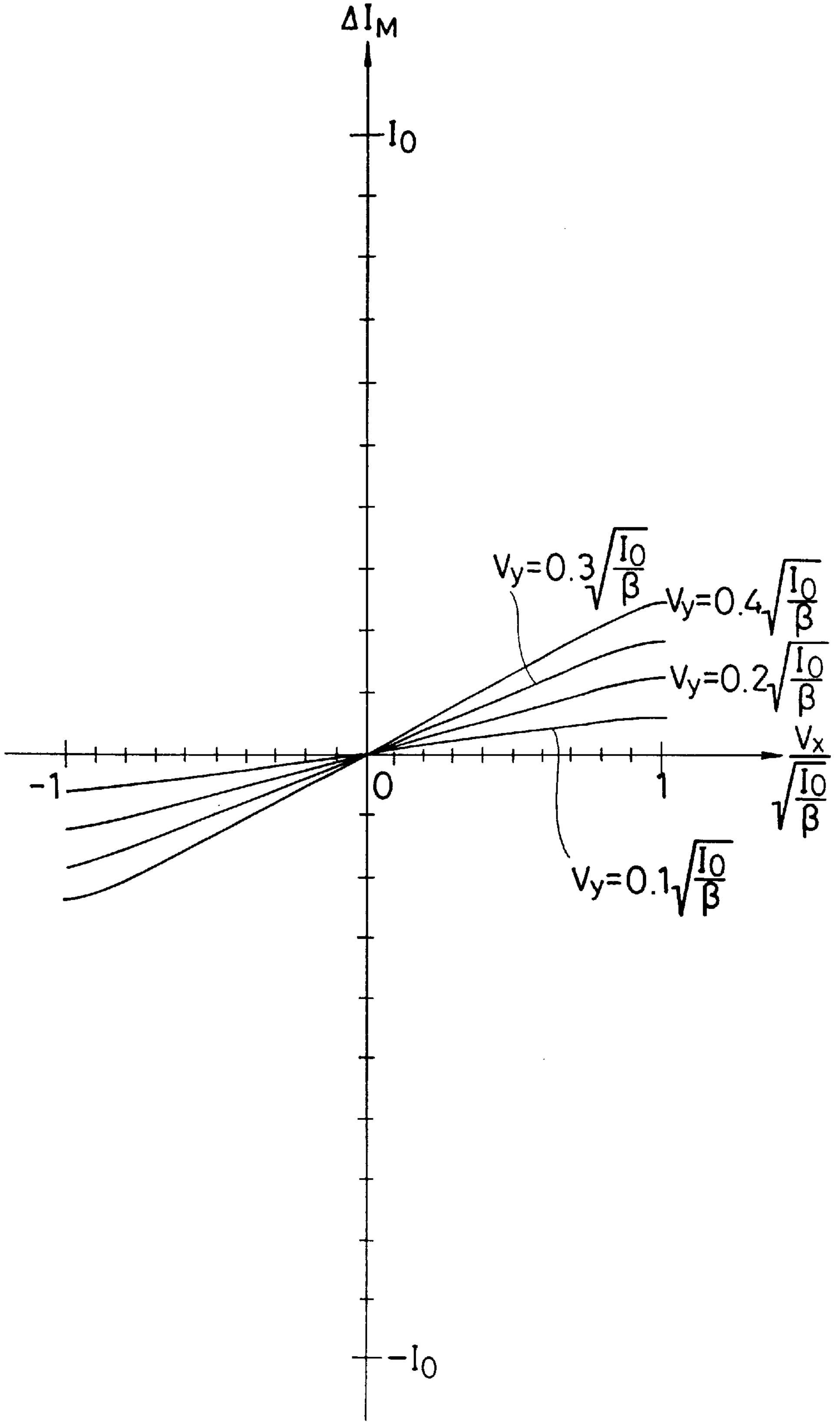
FIG. 41 is a graph showing the transfer characteristic of the multiplier of FIG. 40 according to the twenty-first embodiment.
Figure 42:
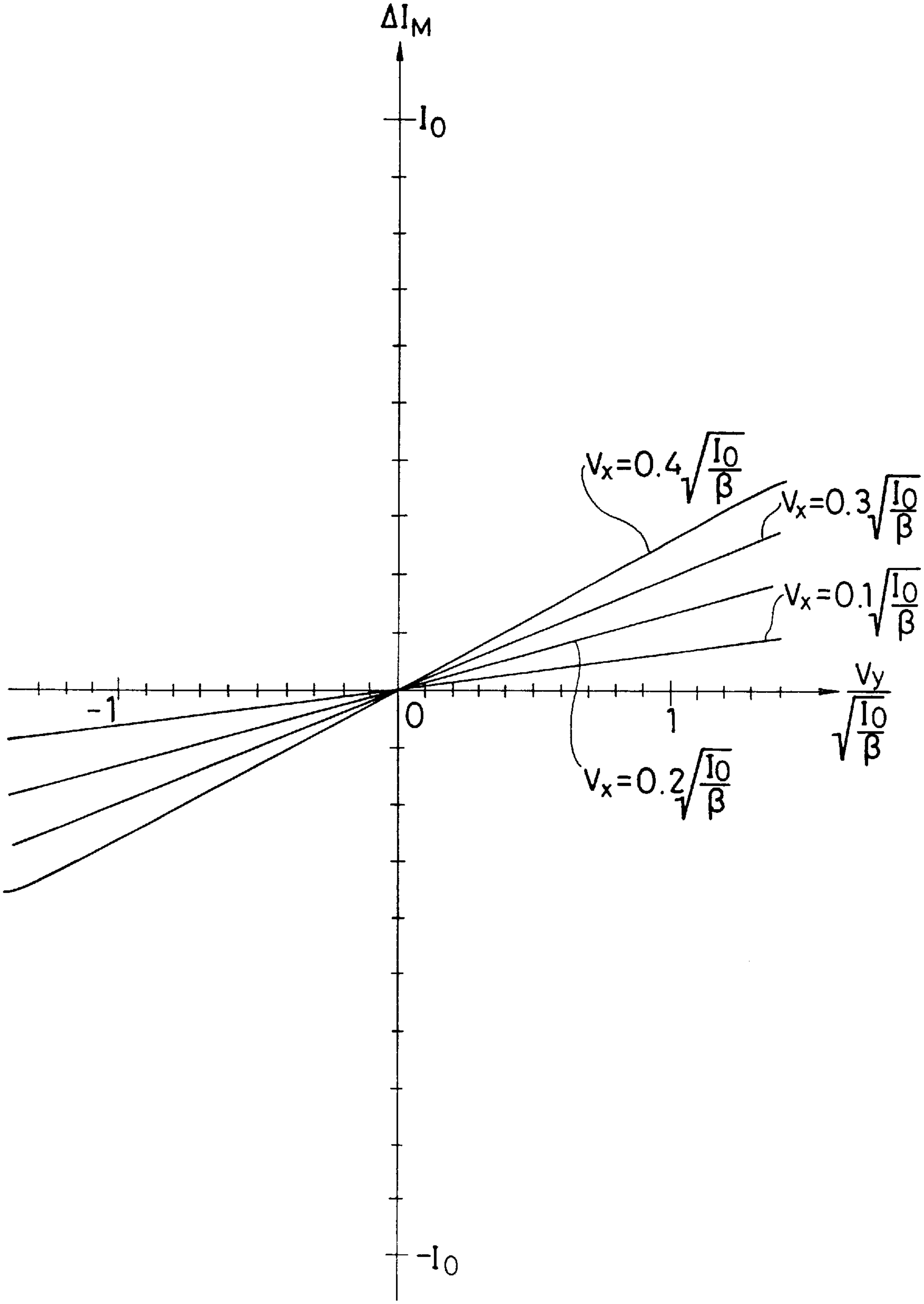
FIG. 42 is a graph showing the transfer characteristic of the multiplier of FIG. 40 according to the twenty-first embodiment.

FIGS. 41 and 42 show the transfer characteristics of the multiplier according to the twenty-first embodiment, in which the input voltages $V_x$ and $V_y$ are normalized by $(I_0/\beta)\}^{1/2}$, FIG. 41 shows the relationship between the differential output current $\Delta I_M$ and the first input voltage $V_x$ with the second input voltage $V_y$ as a parameter. FIG. 42 shows the relationship between the differential output current $\Delta I_M$ and the second input voltage $V_y$ with the first input voltage $V_x$ as a parameter.

It is seen from FIGS. 41 and 42 that, if each of the MOSFETs M11, M12, M13, M14, M15 and M16 has an square-law characteristic, the deferential output current $\Delta I_M$ has an ideal multiplication characteristic for the first and second input voltages $V_x$ and $V_y$ within the ranges of $V_x$ and $V_y$ in which none of the MOSFETs M11, M12, M13, M14, M15 and M16 occurs the pinch-off phenomenon. Also, it is seen that as the voltages $V_x$ and $V_y$ increase, the pinch-off phenomenon begins to occur so that the transfer characteristics for $V_x$ and $V_y$ deviate from the ideal multiplication characteristics, respectively.

With the multiplier according to the twenty-first embodiment, the input voltage ranges that provide the ideal multiplication characteristics are particularly wide. Especially, the input voltage range is extremely wide for the second input voltage $V_y$, being beyond $\pm(I_0/\beta)\}^{1/2}$. This means that the input voltage ranges for $V_x$ and $V_y$ are greatly expanded or improved.

The transconductance characteristics of the multiplier is given by differentiating the differential output current $\Delta I_M$ by the first or second input voltage $V_x$ or $V_y$ in the equations (50) to (53), resulting in the following equations (54) to (57) and FIG. 43 for $V_x$ and the following equations (58) to (61) and FIG. 44 for $V_y$.

$$\frac{d(\Delta I_M)}{dV_x} = \frac{2}{3}\beta V_y \tag{54}$$

$$\left(|V_x| \le -\frac{|V_x|}{5} + \frac{2}{5}\sqrt{\frac{2I_0}{\beta} - V_y^2}\ ,\ |V_x| \le \sqrt{\frac{2I_0}{\beta} - V_y^2}\right)$$

-continued $$\frac{d(\Delta I_M)}{dV_x} = \frac{1}{3}\beta V_y - \left\{\beta\frac{1}{3}\sqrt{\frac{3I_0}{\beta} - \frac{3}{2}V_x^2 - \frac{1}{2}V_y^2} - \frac{1}{2}\frac{\beta V_x|V_x|}{\sqrt{\frac{3I_0}{\beta} - \frac{3}{2}V_x^2 - \frac{1}{2}V_y^2}} + \frac{1}{8}\beta\sqrt{\frac{8I_0}{\beta} - (|V_x| + |V_y|)^2} - \frac{1}{8}\frac{\beta(|V_x| + |V_y|)^2}{\sqrt{\frac{8I_0}{\beta} - (|V_x| + |V_y|)^2}}\right\}sgn(V_y) \tag{55}$$

$$\left(|V_x| \geq \sqrt{\frac{2I_0}{\beta} - V_y^2},\ |V_x| \leq -\frac{|V_y|}{5} + \frac{2}{5}\sqrt{\frac{5I_0}{\beta} - V_y^2}\right)$$

$$\frac{d(\Delta I_M)}{dV_x} = \frac{1}{3}\beta V_y - \left\{\beta\frac{1}{3}\sqrt{\frac{3I_0}{\beta} - \frac{3}{2}V_x^2 - \frac{1}{2}V_y^2} - \frac{1}{2}\frac{\beta V_x|V_x|}{\sqrt{\frac{3I_0}{\beta} - \frac{3}{2}V_x^2 - \frac{1}{2}V_y^2}} - \beta\sqrt{\frac{2I_0}{\beta} - V_x^2} + \frac{\beta V_x|V_x|}{\sqrt{\frac{2I_0}{\beta} - V_x^2}}\right\}sgn(V_y) \tag{56}$$

$$\left(|V_x| \geq -\frac{|V_y|}{5} + \frac{2}{5}\sqrt{\frac{5I_0}{\beta} - V_y^2},\ |V_x| \leq \sqrt{\frac{2I_0}{\beta} - V_y^2}\right)$$

$$\frac{d(\Delta I_M)}{dV_x} = \frac{1}{8}\left\{\beta\sqrt{\frac{8I_0}{\beta} - (|V_x| + |V_y|)^2} - \frac{\beta(|V_x| + |V_y|)^2}{\sqrt{\frac{8I_0}{\beta} - (|V_x| + |V_y|)^2}}\right\}sgn(V_y) \tag{57}$$

$$\left(\sqrt{\frac{I_0}{\beta}} \leq |V_x|,\ \sqrt{\frac{2I_0}{\beta} - V_y^2} \leq |V_x|\right)$$

$$\frac{d(\Delta I_M)}{dV_y} = \frac{2}{3}\beta V_x \tag{58}$$

$$\left(|V_x| \leq -\frac{|V_y|}{5} + \frac{2}{5}\sqrt{\frac{2I_0}{\beta} - V_y^2},\ |V_x| \leq \sqrt{\frac{2I_0}{\beta} - V_y^2}\right)$$

$$\frac{d(\Delta I_M)}{dV_y} = \frac{1}{3}\beta V_x + \frac{1}{3}\frac{\beta V_x|V_y|}{\sqrt{\frac{3I_0}{\beta} - \frac{3}{2}V_x^2 - \frac{1}{2}V_y^2}} + \frac{1}{8}\left\{\beta\sqrt{\frac{8I_0}{\beta} - (|V_x| + |V_y|)^2} - \frac{\beta(|V_x| + |V_y|)^2}{\sqrt{\frac{8I_0}{\beta} - (|V_x| + |V_y|)^2}}\right\}sgn(V_x) \tag{59}$$

$$\left(|V_x| \geq \sqrt{\frac{2I_0}{\beta} - V_y^2},\ |V_x| \leq -\frac{|V_y|}{5} + \frac{2}{5}\sqrt{\frac{5I_0}{\beta} - V_y^2}\right)$$

$$\frac{d(\Delta I_M)}{dV_y} = \frac{1}{3}\beta V_x + \frac{1}{3}\frac{\beta V_x|V_y|}{\sqrt{\frac{3I_0}{\beta} - \frac{3}{2}V_x^2 - \frac{1}{2}V_y^2}} \tag{60}$$

$$\left(|V_x| \geq -\frac{|V_y|}{5} + \frac{2}{5}\sqrt{\frac{5I_0}{\beta} - V_y^2},\ |V_x| \leq \sqrt{\frac{2I_0}{\beta} - V_y^2}\right)$$

$$\frac{d(\Delta I_M)}{dV_x} = \frac{1}{8}\left\{\beta\sqrt{\frac{8I_0}{\beta} - (|V_x| + |V_y|)^2} - \frac{\beta(|V_x| + |V_y|)^2}{\sqrt{\frac{8I_0}{\beta} - (|V_x| + |V_y|)^2}}\right\}sgn(V_x) \tag{61}$$

$$\left(\sqrt{\frac{I_0}{\beta}} \leq |V_x|,\ \sqrt{\frac{2I_0}{\beta} - V_y^2} \leq |V_x|\right)$$

Figure 43:
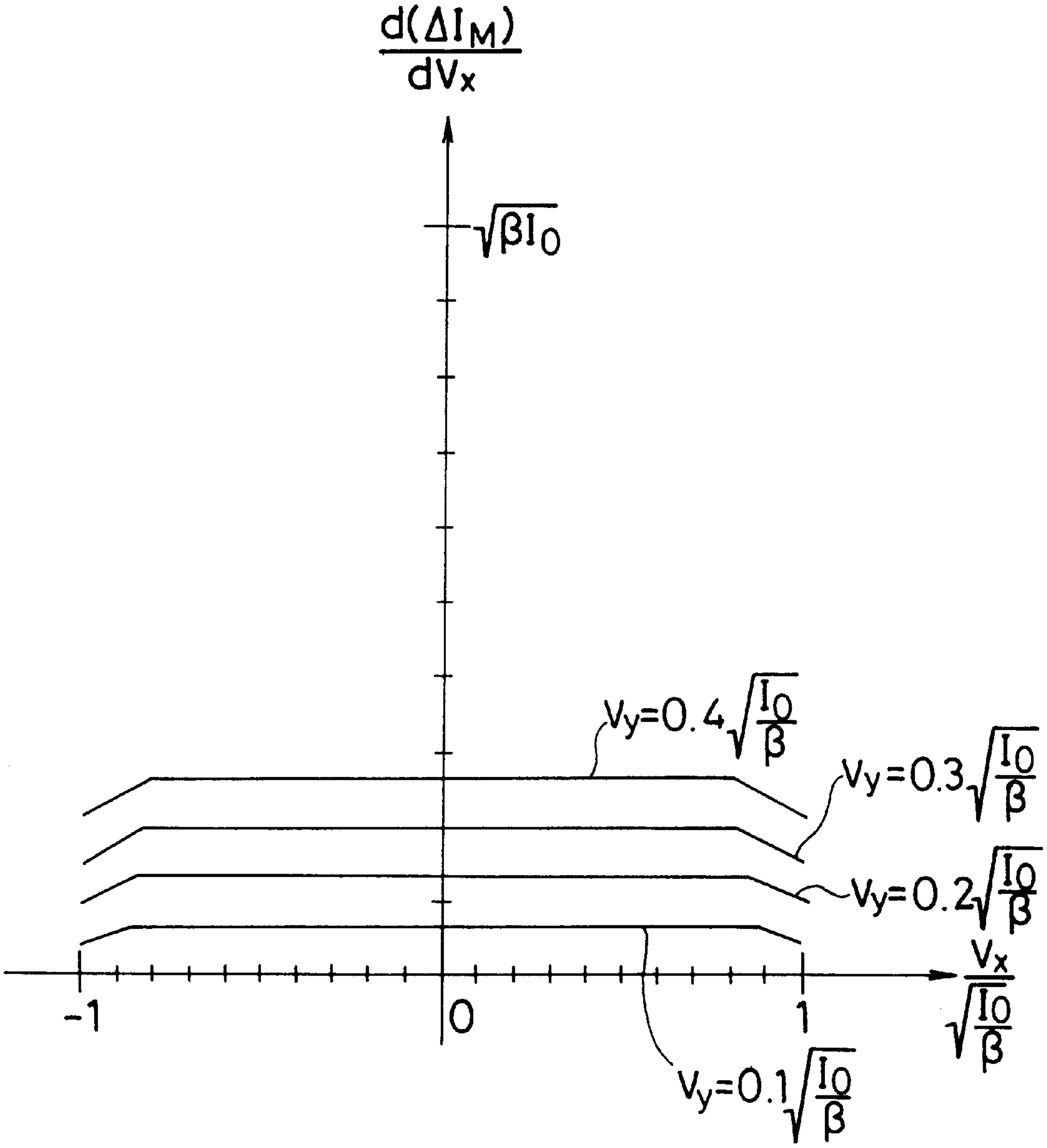
FIG. 43 is a graph showing the transconductance characteristic of the multiplier of FIG. 40 according to the twenty-first embodiment.
Figure 44:
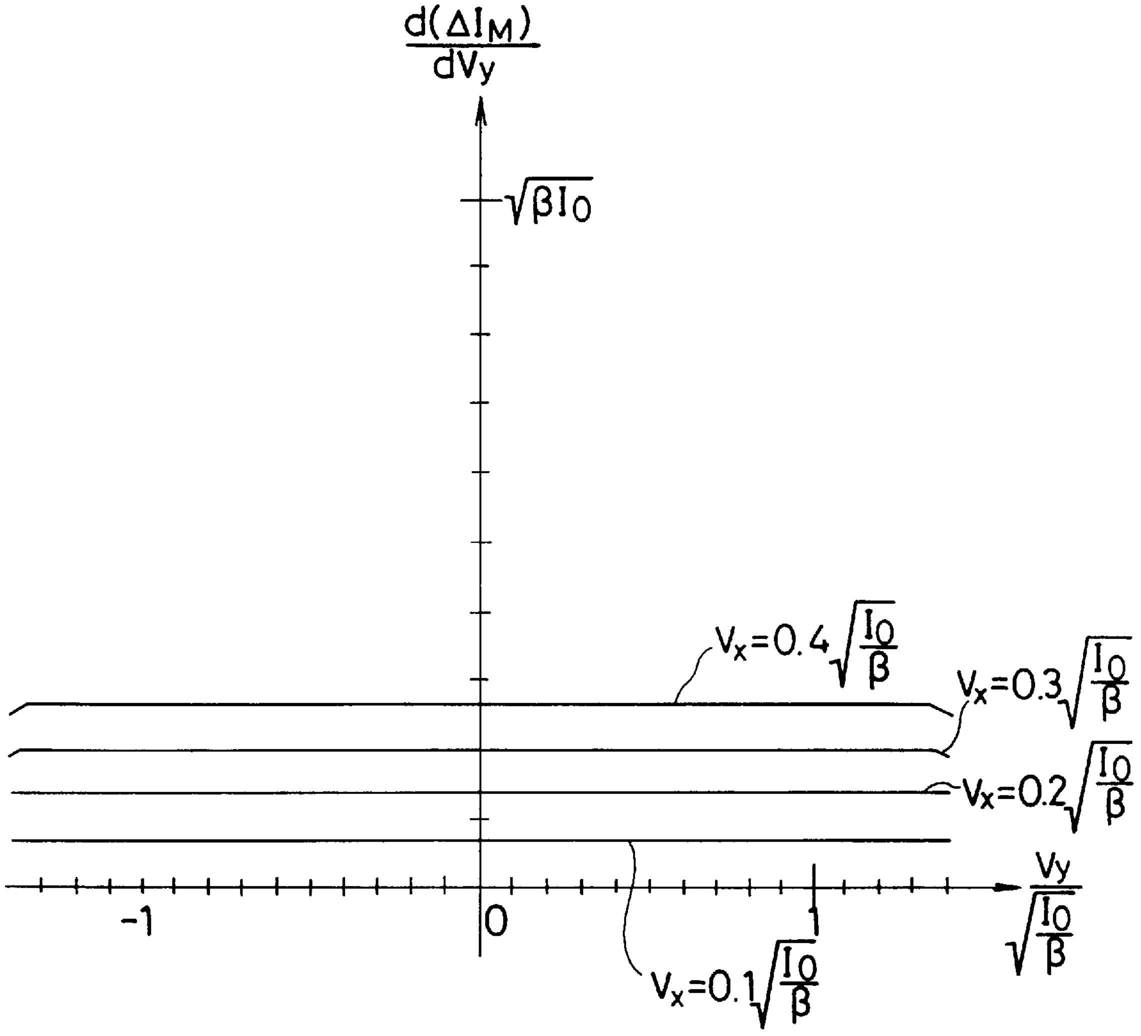
FIG. 44 is a graph showing the transconductance characteristic of the multiplier of FIG. 40 according to the twenty-first embodiment.

It is seen from FIGS. 43 and 44 that the four-quadrant analog multiplier according to the twenty-first embodiment has a particularly wide linear-transconductance range for the first and second input voltages $V_x$ and $V_y$.

[Twenty-Second Embodiment]

Figure 40A:
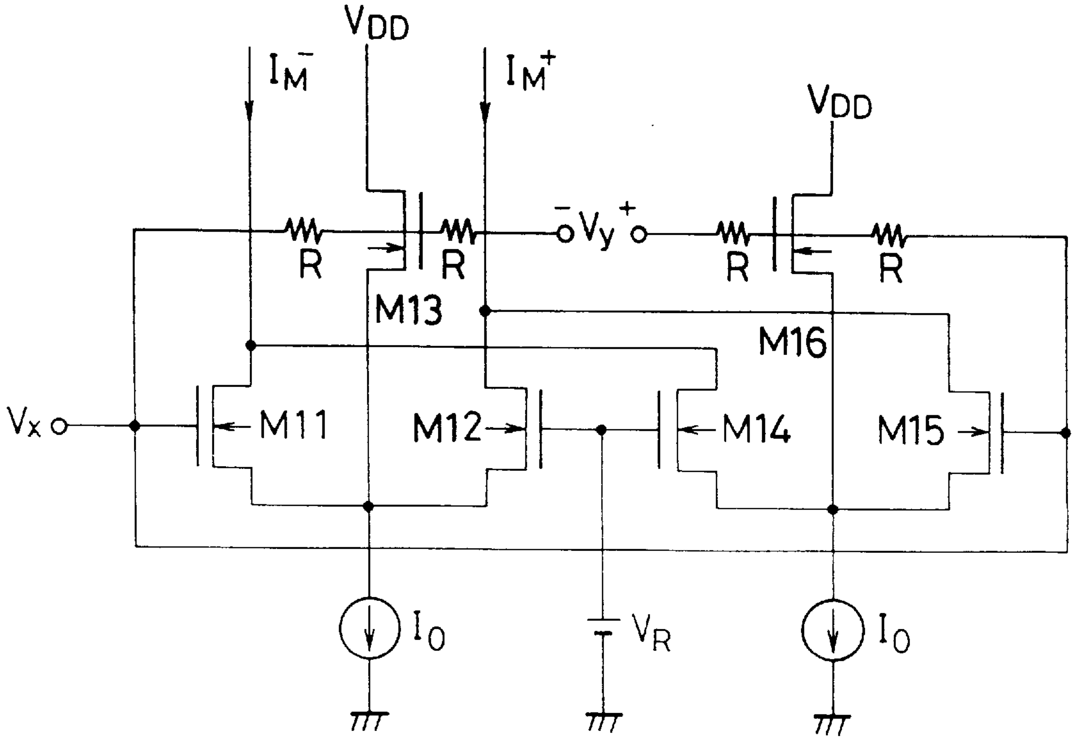
FIG. 40A is a circuit diagram of multiplier according to a twenty-second embodiment of the invention.

FIG. 40A shows a four-quadrant analog multiplier according to a twenty-second embodiment, which is composed of two triple-tail cells of MOSFETs. This is equivalent to one that the triple-tail cells according to the fourth embodiment shown in FIG. 17A are combined with each other.

It is also said that this multiplier is the same in configuration as that of the nineteenth embodiment shown in FIG. 40 other than that four resistors and a dc voltage source are added.

In FIG. 40A, a constant dc voltage $V_R$ is applied to the gates of the MOSFETs M12 and M14. A first input voltage $V_x$, which is not a differential one, is applied to the gate of the MOSFETs M11 and M15.

A first resistor (resistance: R) is connected between the gates of the MOSFETs M11 and M13 and a second resistor (resistance: R) is connected to the gate of the MOSFET M13. A third resistor (resistance: R) is connected between the gates of the MOSFETs M15 and M16 and a fourth resistor (resistance: R) is connected to the gate of the MOSFETs M16.

A voltage ($V_x/2$) is applied to the gates of the MOSFETs M11, M12, M13, M14, M15 and M16, so that the voltage $V_1$ need not be a differential one.

The voltage $V_2$ is divided by the first and second resistors to be applied to the gate of the MOSFET M13 on the one hand, and it is divided by the third and fourth resistors to be applied to the gate of the MOSFET M16, on the other hand.

Therefore, the output value of the multiplier becomes a half that of the twenty-first embodiment.

[Twenty-Third Embodiment]

Figure 40B:
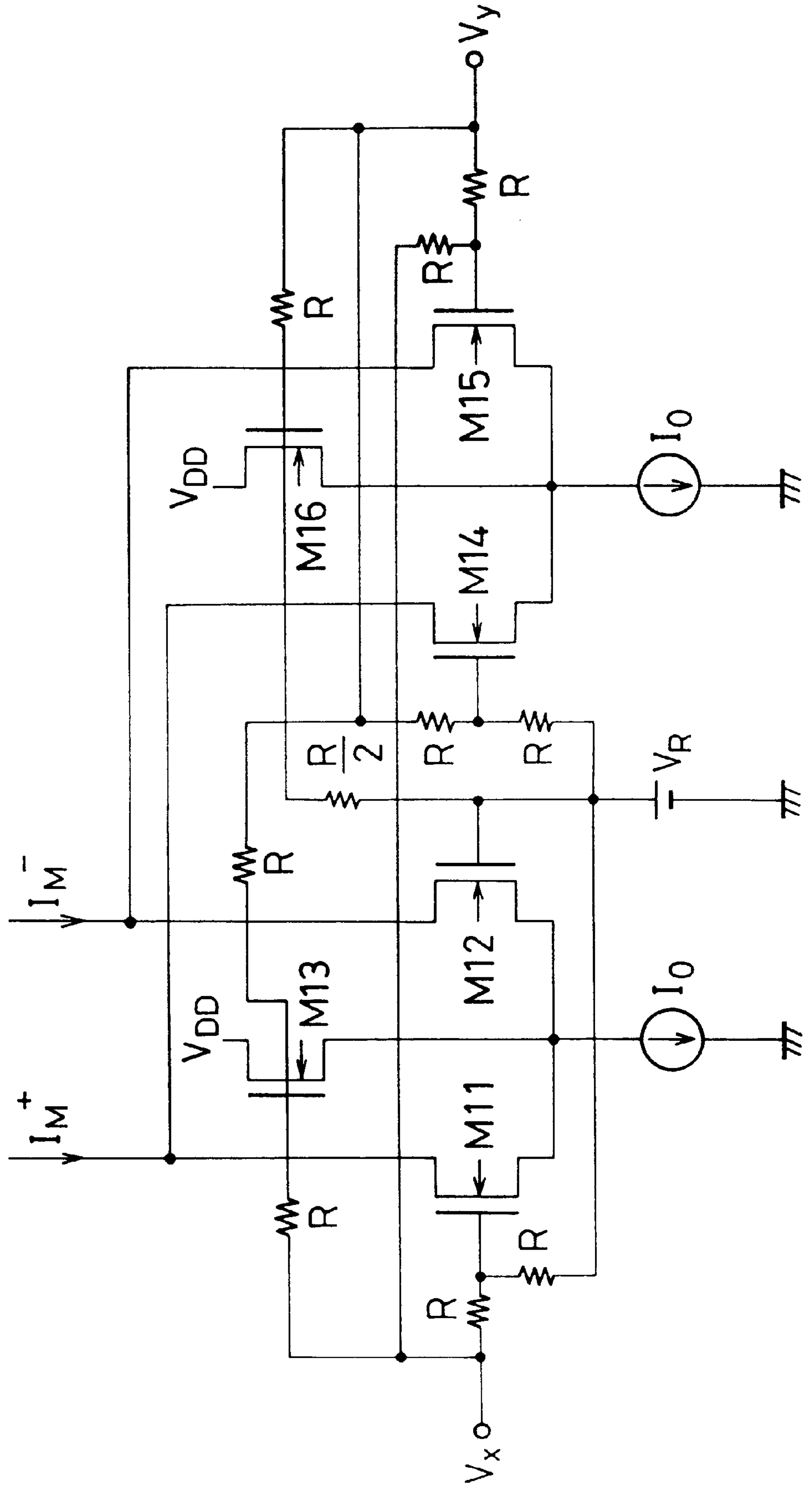
FIG. 40B is a circuit diagram of multiplier according to a twenty-third embodiment of the invention.

FIG. 40B shows a four-quadrant analog multiplier according to a twenty-third embodiments which is composed of two triple-tail cells of MOSFETs. This also is equivalent to one that the triple-tail cells according to the fourth embodiment shown in FIG. 17A are combined with each other.

It is also said that this multiplier is the same in configuration as that of the twenty-first embodiment shown in FIG. 40 other than that eleven resistors and a de voltage source are added.

In FIG. 40B, a first resistor (resistance: R) is connected between the gate of the MOSFETs M11 and an input end for the voltage $V_x$, and a second resistor (resistance: R) is connected between the gates of the MOSFETs M11 and M12. A third resistor (resistance: R) is connected between the input end for the voltage $V_x$ and the gate of the MOSFET M13, and a fourth resistor (resistance: R) is connected between the gate of the MOSFETs M13 and an input end for the voltage $V_y$.

A fifth resistor (resistance: R) is connected between the gate of the MOSFET M15 and the input end for the voltage $V_y$, and a sixth resistor (resistance: R) is connected between the gate of the MOSFETs M15 and the input end for $V_x$. A seventh resistor (resistance: R) is connected between the input end for the voltage $V_y$ and the gate of the MOSFET M16, and an eighth resistor (resistance: R/2) is connected between the gates of the MOSFETs M16 and M12.

A ninth resistor (resistance: R) is connected between the gates of the MOSFETs M11 and M14, and a tenth resistor (resistance: R) is connected between the gate of the MOSFET M14 and the input end for the voltage $V_y$.

A constant dc voltage $V_R$ is applied to the gate of the MOSFET M11 through the first resistor, is applied directly to the gate of the MOSFET M12, and is applied to the gate of the MOSFET M13 through the fourths ninth and tenth resistors.

The constant dc voltage $V_R$ is also applied to the gate of the MOSFET M14 through the ninth resistors and is applied to the gate of the MOSFET M16 through the eighth resistor.

With this multiplier, a voltage ($V_x/2$) is applied to the gates of the MOSFETs M11, M12 and M13 forming the first triple-tail cell, and a voltage $[(V_x/2)+V_x]$ is applied to the gates of the MOSFETs M14, M15 and M16 forming the second triple-tail cell.

There is an advantage that both the input voltages $V_1$ and $V_2$ need not be differential ones. However, the output value of the multiplier becomes a quarter that of the eighteenth embodiment.

[Twenty-Fourth Embodiment]

Figure 45:
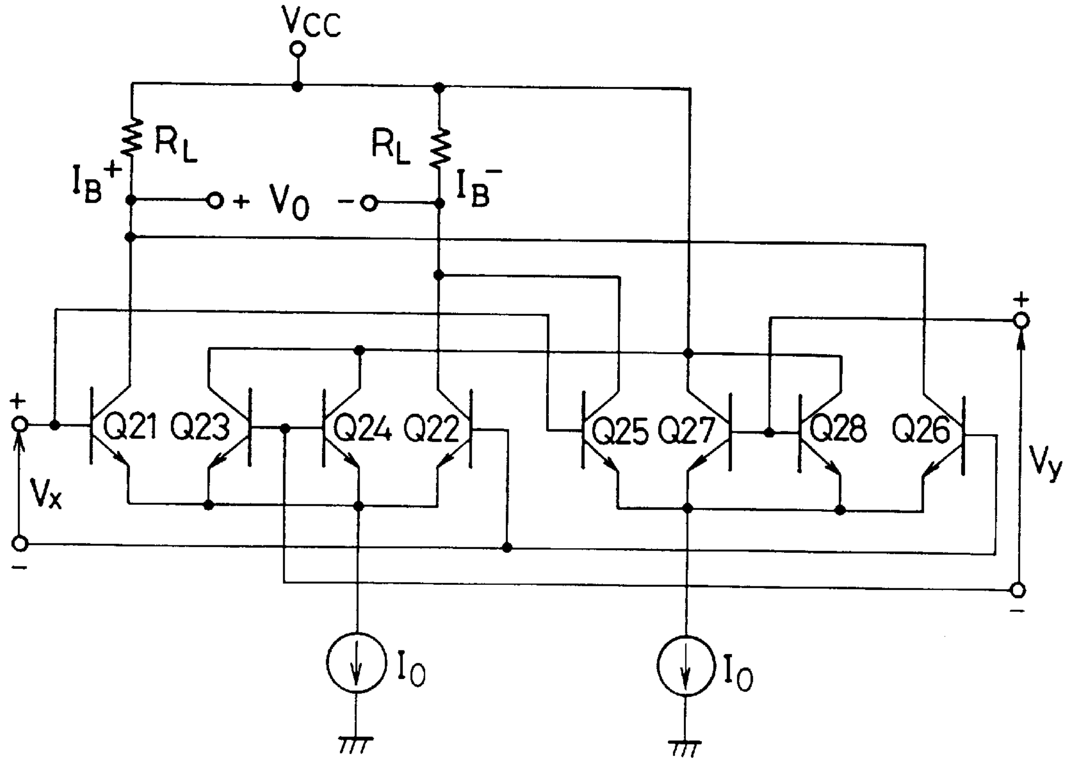
FIG. 45 is a circuit diagram of multiplier according to a twenty-fourth embodiment of the invention.

FIG. 45 shows a four-quadrant analog multiplier according to a twenty-fourth embodiments which is composed of two quadritail cells of bipolar transistors. This is equivalent to one that the quadritail cells according to the fifth embodiment shown in FIG. 19 are combined with each other.

In FIG. 45, this multiplier comprises first and second bipolar quadritail cells.

The first quadritail cell contains a differential pair of npn bipolar transistors Q21 and Q22, an npn bipolar transistors Q23 and Q24, and a first constant current source (current: $I_0$).

The transistors Q21, Q22, Q23 and Q24 have emitters connected in common to one end of the first constant current source, and they are driven by the same current source. The other end of the first constant current source is grounded.

The transistors Q21, Q22, Q23 and Q24 are the same in emitter area.

A first load resistor (resistance: $R_L$) is connected to a collector of the transistor Q21 and a second load resistor (resistance: $R_L$) is connected to a collector of the transistor Q22. A supply voltage $V_{CC}$ is applied to the collectors of the transistors Q21 and Q22 through the first and second resistors, respectively. The supply voltage $V_{CC}$ is directly applied to collector of the transistors Q23 and Q24.

A first signal or a differential voltage $V_x$ is applied across differential input ends of the pair, i.e., bases of the transistors Q21 and Q22. A second signal or a differential voltage $V_y$ is applied in negative polarity to input ends or bases of the transistors Q23 and Q24.

The second triple-tail cell contains a differential pair of npn bipolar transistors Q25 and Q26, npn bipolar transistors Q27 and Q28, and a second constant current source (current: $I_0$).

The transistors Q25, Q26, Q27 and Q28 have emitters connected in common to one end of the second constant current source, and they are driven by the same current source. The other end of the second constant current source is grounded.

The transistors Q25, Q26, Q27 and Q28 are the same in emitter area.

The first load resistor is connected to a collector of the transistor Q26 and the second load resistor is connected to a collector of the transistor Q25. The supply voltage $V_{CC}$ is applied to the collectors of the transistors Q26 and Q25 through the first and second resistors, respectively. The supply voltage $V_{CC}$ is directly applied to collectors of the transistors Q27 and Q28.

The first signal or the differential voltage $V_x$ is applied across differential input ends of the pair, i.e., bases of the transistors Q25 and Q26. The second signal or the differential voltage $V_y$ is applied in positive polarity to input ends or bases of the transistors Q27 and Q28.

The voltage $V_x$ is applied to the bases of the transistors Q21 and Q25 in positive polarity and to the bases of the transistors Q22 and Q26 in negative polarity.

The collectors of the transistors Q21 and Q22 are coupled with the collectors of the transistors Q25 and Q26 in opposite phases, constituting a differential output ends of the multiplier, to which the first and second load resistors are connected, respectively.

Then, similar to the first embodiment, an output differential current $\Delta I_B$ of this multiplier is given by the following equation 62.

In the equation 62, $I_{C21}$, $I_{C22}$, $I_{C23}$ and $I_{C24}$ are collector currents of the transistors Q21, Q22, Q23 and Q24, respectively, and $I_{B2}^+$ and $I_{B2}^-$ are output currents from the coupled collectors of the transistors Q21 and Q26 and from those of the transistors Q22 and Q25, respectively.

$$\Delta I_B = I_B^+ - I_B^- = (I_{C1} + I_{C3}) - (I_{C2} + I_{C4}) = \frac{2\alpha_F I_0 \sinh\left(\frac{V_X}{2V_T}\right)\sinh\left(\frac{V_y}{2V_T}\right)}{\left\{\cosh\left(\frac{V_x}{2V_T}\right) + \exp\left(\frac{V_y}{2V_T}\right)\right\}\left\{\cosh\left(\frac{V_x}{2V_T}\right) + \exp\left(-\frac{V_y}{2V_T}\right)\right\}} \quad (62)$$

Figure 46:
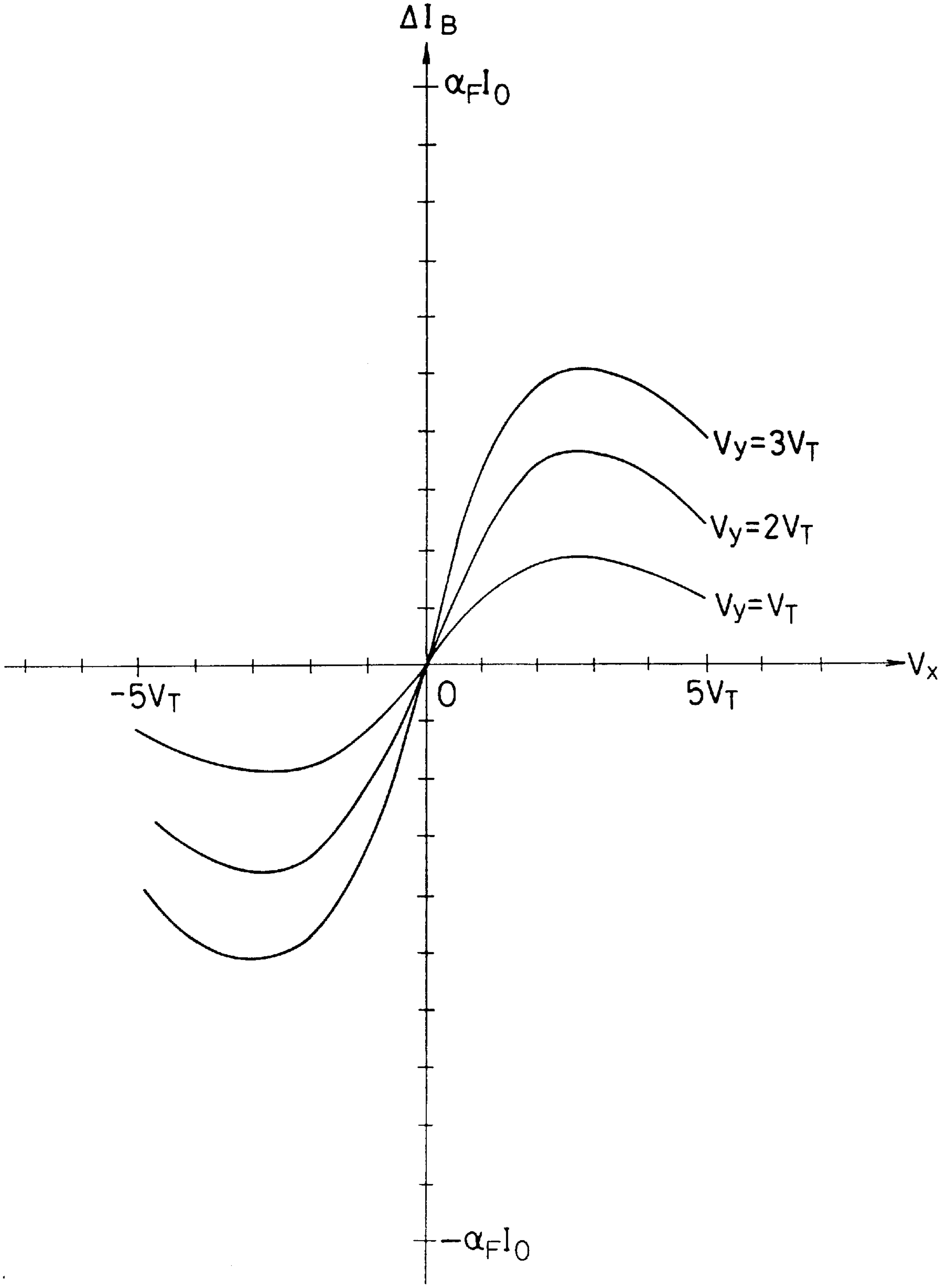
FIG. 46 is a graph showing the transfer characteristic of the multiplier of FIG. 45 according to the twenty-fourth embodiment.
Figure 47:
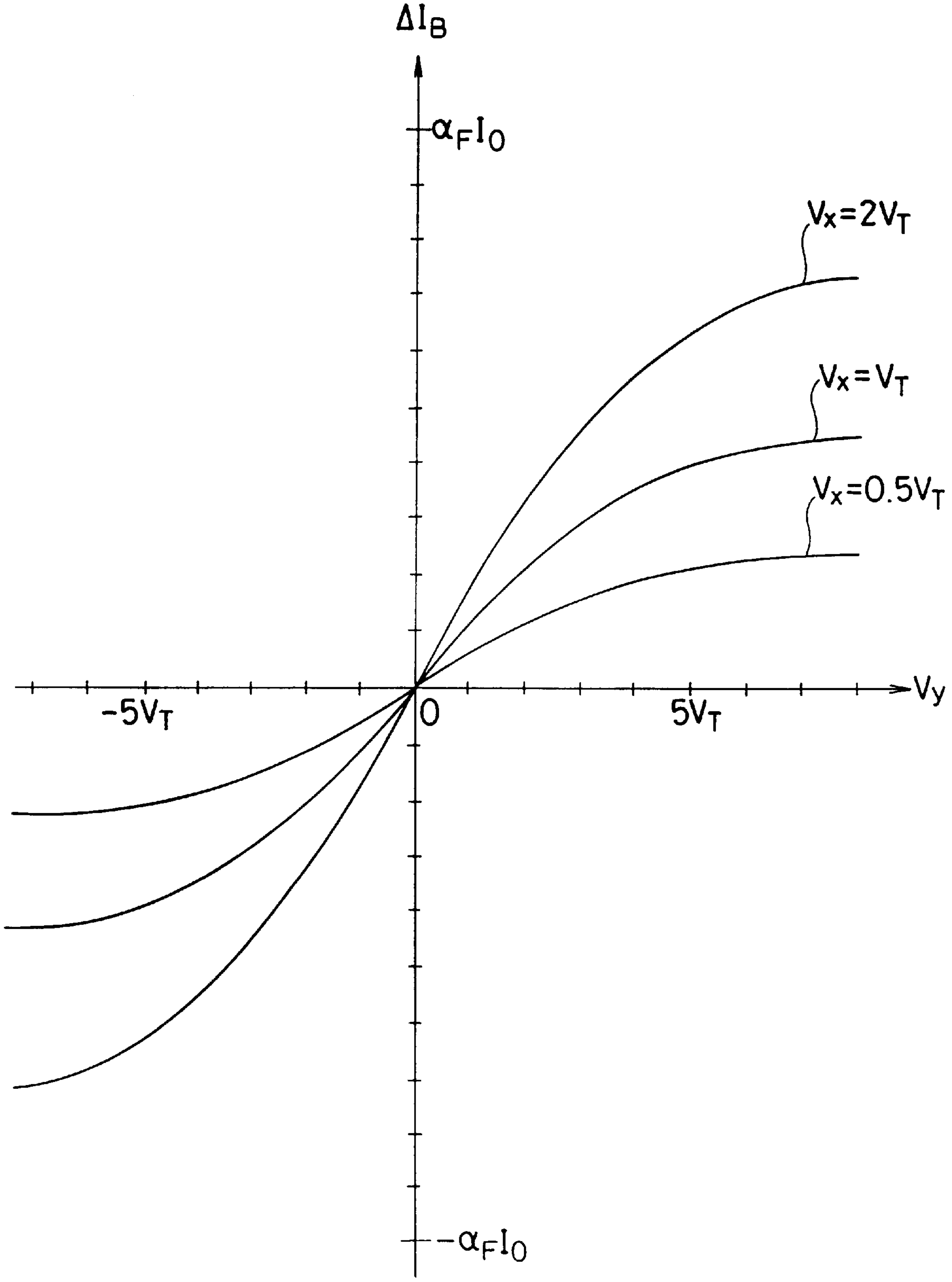
FIG. 47 is a graph showing the transfer characteristic of the multiplier of FIG. 45 according to the twenty-fourth embodiment.

FIGS. 46 and 47 show the transfer characteristics of the multiplier according to the twenty-fourth embodiment. FIG. 46 shows the relationship between the differential output current $\Delta I_B$ and the first input voltage $V_x$ with the second input voltage $V_y$ as a parameter. FIG. 47 shows the relationship between the differential output current $\Delta I_B$ and the second input voltage $V_y$ with the first input voltage $V_x$ as a parameter.

It is seen from FIGS. 46 and 47 that the deferential output current $\Delta I_B$ has no limiting characteristic for the first input voltage $V_x$, and on the other hand, the current $\Delta I_B$ has a limiting characteristic for the second input voltage $V_y$.

Also, it is seen that the input voltage range for the first voltage $V_x$ is narrow and the input voltage range for the second voltage $V_y$ is comparatively wide.

Figure 48:
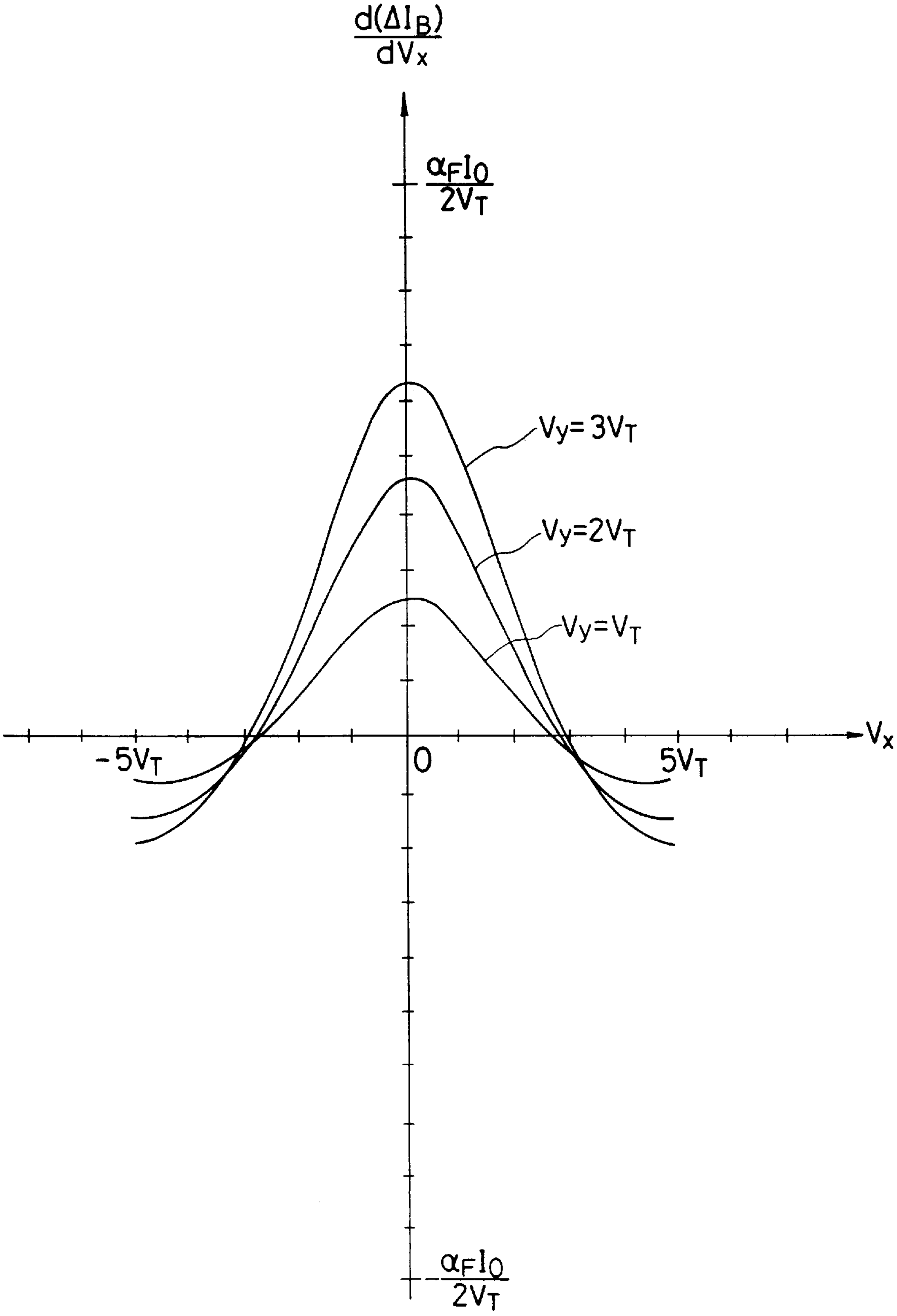
FIG. 48 is a graph showing the transconductance characteristic of the multiplier of FIG. 45 according to the twenty-fourth embodiment.
Figure 49:
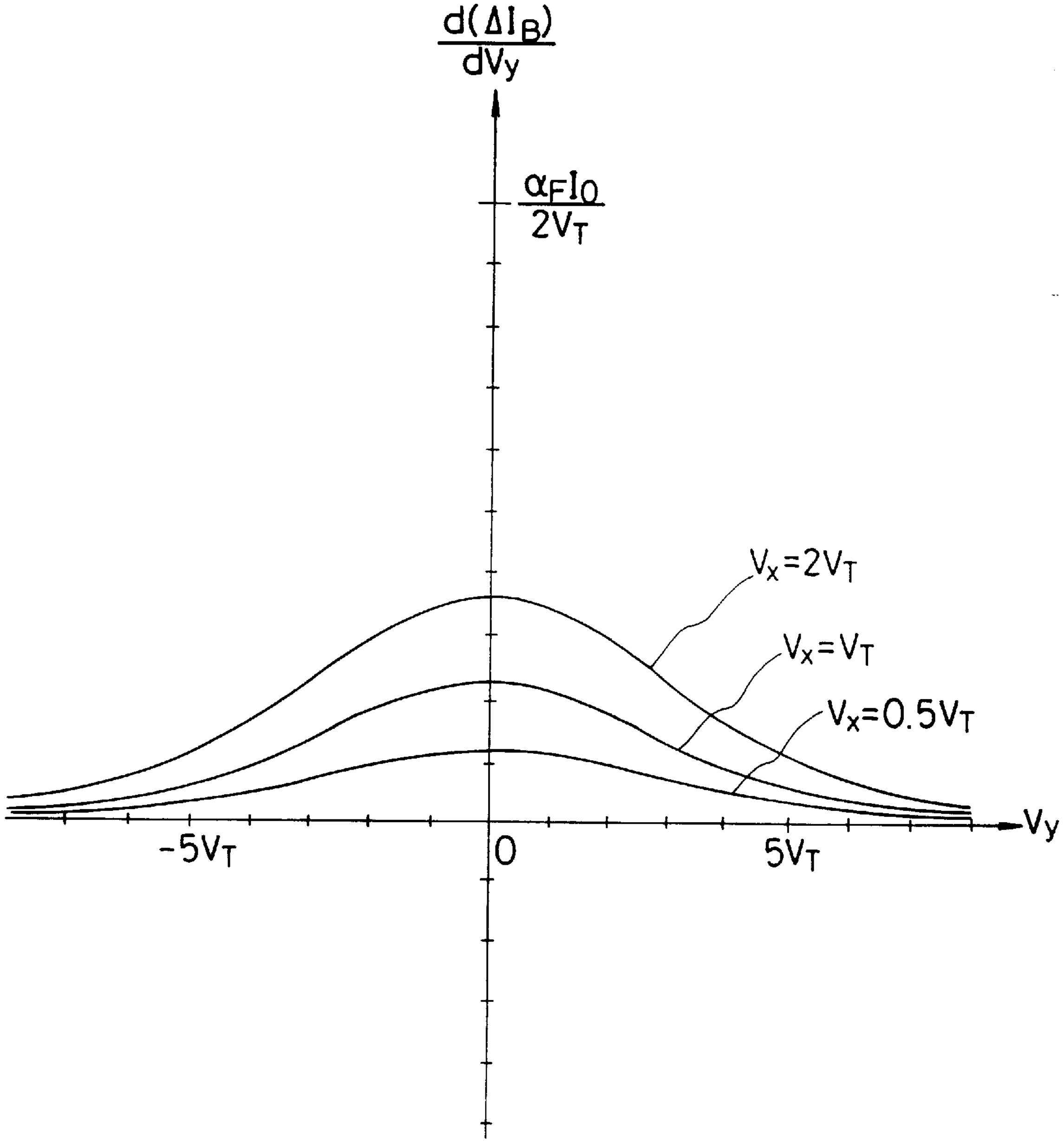
FIG. 49 is a graph showing the transconductance characteristic of the multiplier of FIG. 45 according to the twenty-fourth embodiment.

The transconductance characteristics of the multiplier can be given by differentiating the differential output current $\Delta I_B$ by the first or second input voltage $V_x$ or $V_y$ in the equation (62), resulting in the following equation (63) and FIG. 48 for $V_x$ and the following equation (64) and FIG. 49 for $V_y$.

It is seen from FIGS. 43 and 44 that the two-quadrant analog multiplier according to the twenty-first embodiment has a particularly wide linear-transconductance range for the first and second input voltages $V_x$ and $V_y$.

$$\frac{d(\Delta I_B)}{dV_x} = \frac{\alpha_F I_0}{V_T} \times \left[\frac{\cosh\left(\frac{V_X}{2V_T}\right)\sinh\left(\frac{V_y}{2V_T}\right)}{\left\{\cosh\left(\frac{V_x}{2V_T}\right) + \exp\left(\frac{V_y}{2V_T}\right)\right\}\left\{\cosh\left(\frac{V_x}{2V_T}\right) + \exp\left(-\frac{V_y}{2V_T}\right)\right\}} - \frac{2\sinh^2\left(\frac{V_X}{2V_T}\right)\sinh\left(\frac{V_y}{2V_T}\right)\left\{\cosh\left(\frac{V_x}{2V_T}\right) + \cosh\left(\frac{V_y}{2V_T}\right)\right\}}{\left\{\cosh\left(\frac{V_x}{2V_T}\right) + \exp\left(\frac{V_y}{2V_T}\right)\right\}^2\left\{\cosh\left(\frac{V_x}{2V_T}\right) + \exp\left(-\frac{V_y}{2V_T}\right)\right\}^2}\right] \quad (63)$$

$$\frac{d(\Delta I_B)}{dV_y} = \frac{\alpha_F I_0}{V_T} \times \left[\frac{\sinh\left(\frac{V_X}{2V_T}\right)\cosh\left(\frac{V_y}{2V_T}\right)}{\left\{\cosh\left(\frac{V_x}{2V_T}\right) + \exp\left(\frac{V_y}{2V_T}\right)\right\}\left\{\cosh\left(\frac{V_x}{2V_T}\right) + \exp\left(-\frac{V_y}{2V_T}\right)\right\}} + \frac{\sinh\left(\frac{V_X}{V_T}\right)\sinh^2\left(\frac{V_y}{2V_T}\right)}{\left\{\cosh\left(\frac{V_x}{2V_T}\right) + \exp\left(\frac{V_y}{2V_T}\right)\right\}^2\left\{\cosh\left(\frac{V_x}{2V_T}\right) + \exp\left(-\frac{V_y}{2V_T}\right)\right\}^2}\right] \quad (64)$$

It is seen that the two-quadrant analog multiplier according to the twenty-fourth embodiment is expanded in linear transconductance range for the first and second input voltages $V_x$ and $V_y$.

Also in this embodiment, the input voltage ranges for $V_x$ and $V_y$ can be expanded by inserting emitter resistors or emitter diodes to the bipolar transistors, as already shown in the eleventh to seventeenth embodiments (FIGS. 28 to 34).

[Twenty-Fifth Embodiment]

Figure 50:
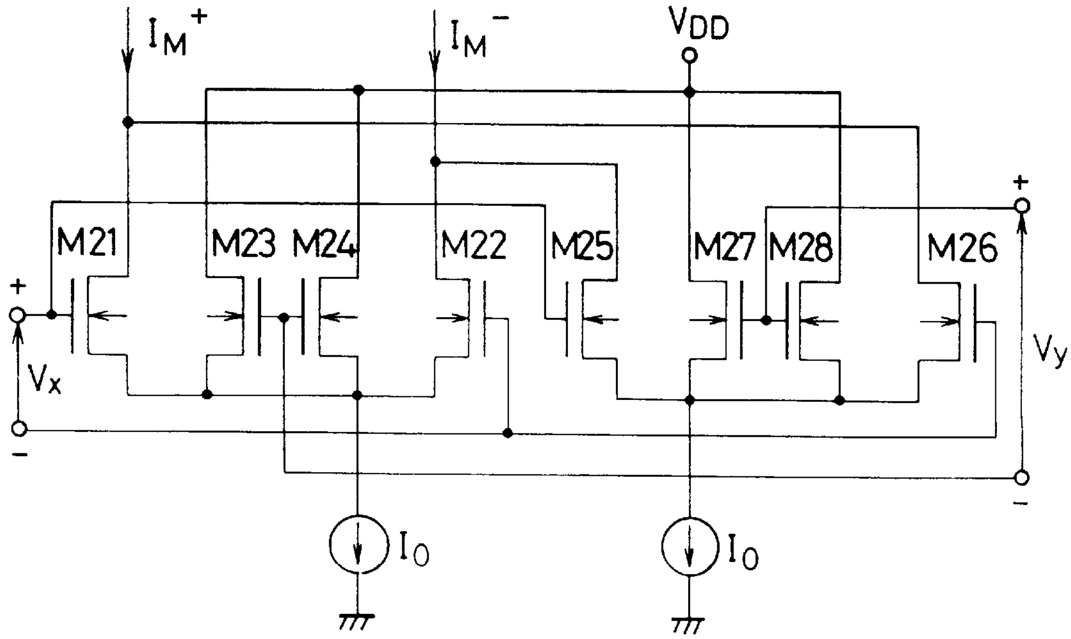
FIG. 50 is a circuit diagram of multiplier according to a twenty-fifth embodiment of the invention.

FIG. 50 shows a four-quadrant analog multiplier according to a twenty-fifth embodiment, which is composed of two quadritail cells of MOSFETs. This is equivalent to one that the quadritail cells according to the sixth embodiment shown in FIG. 26 are combined with each other.

In FIG. 50, this multiplier comprises first and second MOS triple-tail cells.

The first triple-tail cell contains a differential pair of n-channel MOSFETs M21 and M22, n-channel MOSFETs M23 and M24, and a first constant current source (current: $I_0$).

The MOSFETs M21, M22, M23 and M24 have sources connected in common to one end of the first constant current source, and they are driven by the same current source. The other end of the first constant current source is grounded.

The transistors M21, M22, M23 and M24 are the same in gate-width to gate-length ratio.

A first load resistor (not shown) is connected to a drain of the MOSFET M21 and a second load resistor (not shown) is connected to a drain of the MOSFET M22. A supply voltage $V_{DD}$ is applied to the drains of the MOSFETs M21 and M22 through the first and second resistors, respectively. The supply voltage $V_{DD}$ is directly applied to drains of the MOSFETs M23 and M24.

A first signal or a differential voltage $V_x$ is applied across differential input ends of the pairs i.e., gates of the MOSFETs M21 and M22. A second signal or a differential voltage $V_y$ is applied in negative polarity to an input end or gates of the MOSFETs M23 and M24.

The second triple-tail cell contains a differential pair of n-channel MOSFETs M25 and M26, n-channel MOSFETs M27 and M28, and a second constant current source (current: $I_0$).

The MOSFETs M25, M26, M27 and M28 have sources connected in common to one end of the second constant current source, and they are driven by the same current source. The other end of the second constant current source is grounded.

The MOSFETs M25, M26, M27 and M28 are the same in gate-width to gate-length ratio.

The first load resistor is connected to a drain of the MOSFET M26 and the second load resistor is connected to a drain of the MOSFET M25. The supply voltage $V_{DD}$ is applied to the drains of the MOSFETs M26 and M25 through the first and second resistors, respectively. The supply voltage $V_{DD}$ is directly applied to drains of the MOSFETs M27 and M28.

The first signal or the differential voltage $V_x$ is applied across differential input ends of the pair, i.e., gates of the MOSFETs M25 and M26. The second signal or the differential voltage $V_y$ is applied in positive phase or polarity to input ends or gates of the MOSFETs M27 and M28.

The voltage $V_x$ is applied to the gates of the MOSFETs M21 and M25 in positive polarity and to the gates of the MOSFETs M22 and M26 in negative polarity.

The drains of the MOSFETs M21 and M22 are coupled with the drains of the MOSFETs M26 and M25 in opposite phases, constituting a differential output ends of the multiplier, to which the first and second load resistors are connected, respectively.

Then, similar to the third embodiment, an output differential current $\Delta I_M$ of this multiplier is given by the following equations (65), (66), (67), (68) and (69).

In these equations, $I_{D21}$, $I_{D22}$, $I_{D23}$ and $I_{D24}$ are drain currents of the MOSFETs M21, M22, M23 and M24, respectively, and $I_M^+$ and $I_M^-$ are output currents from the coupled drains of the MOSFETs M21 and M26 and from those of the MOSFETs M22 and M25, respectively.

Figure 51:
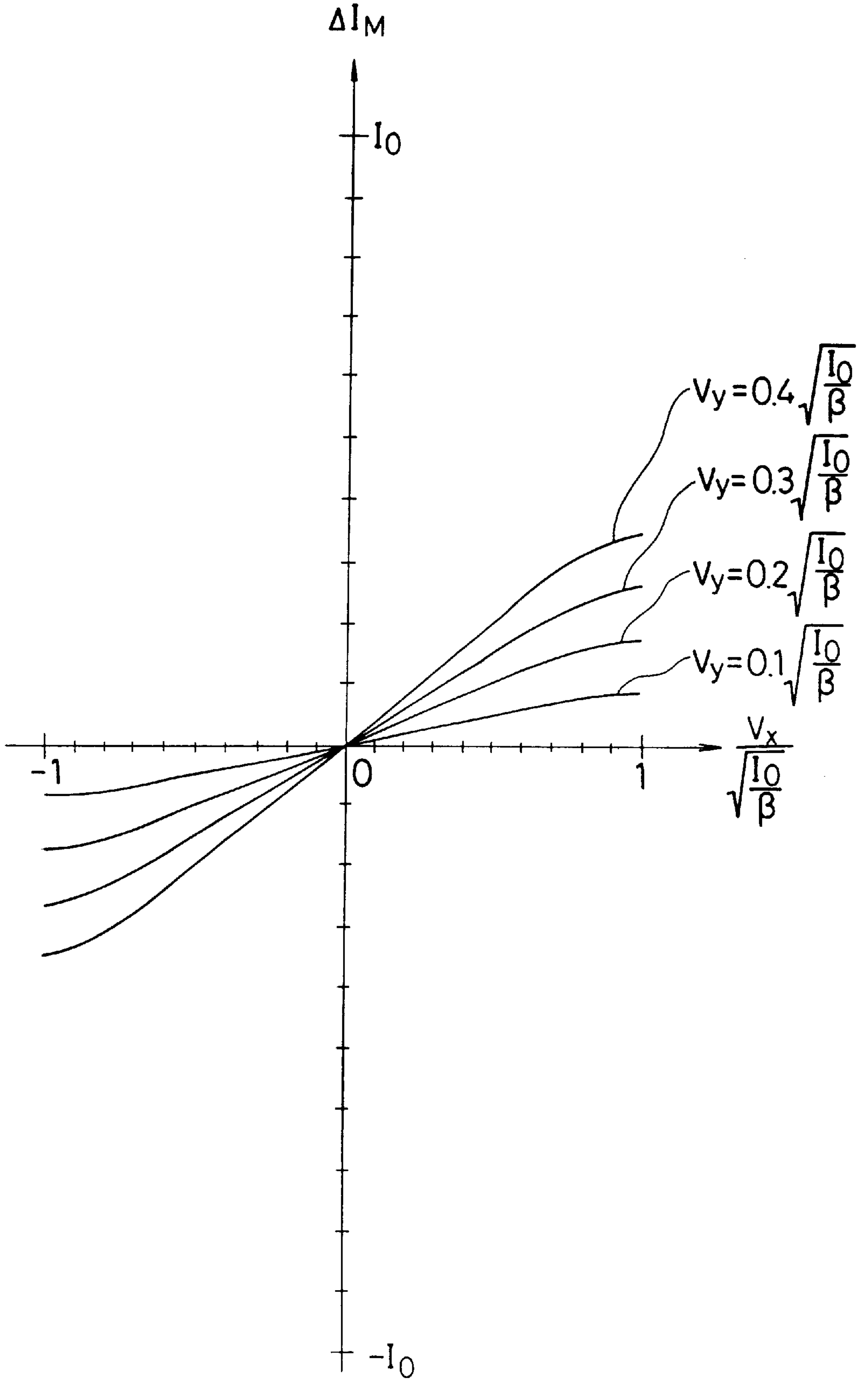
FIG. 51 is a graph showing the transfer characteristic of the multiplier of FIG. 50 according to the twenty-fifth embodiment.
Figure 52:
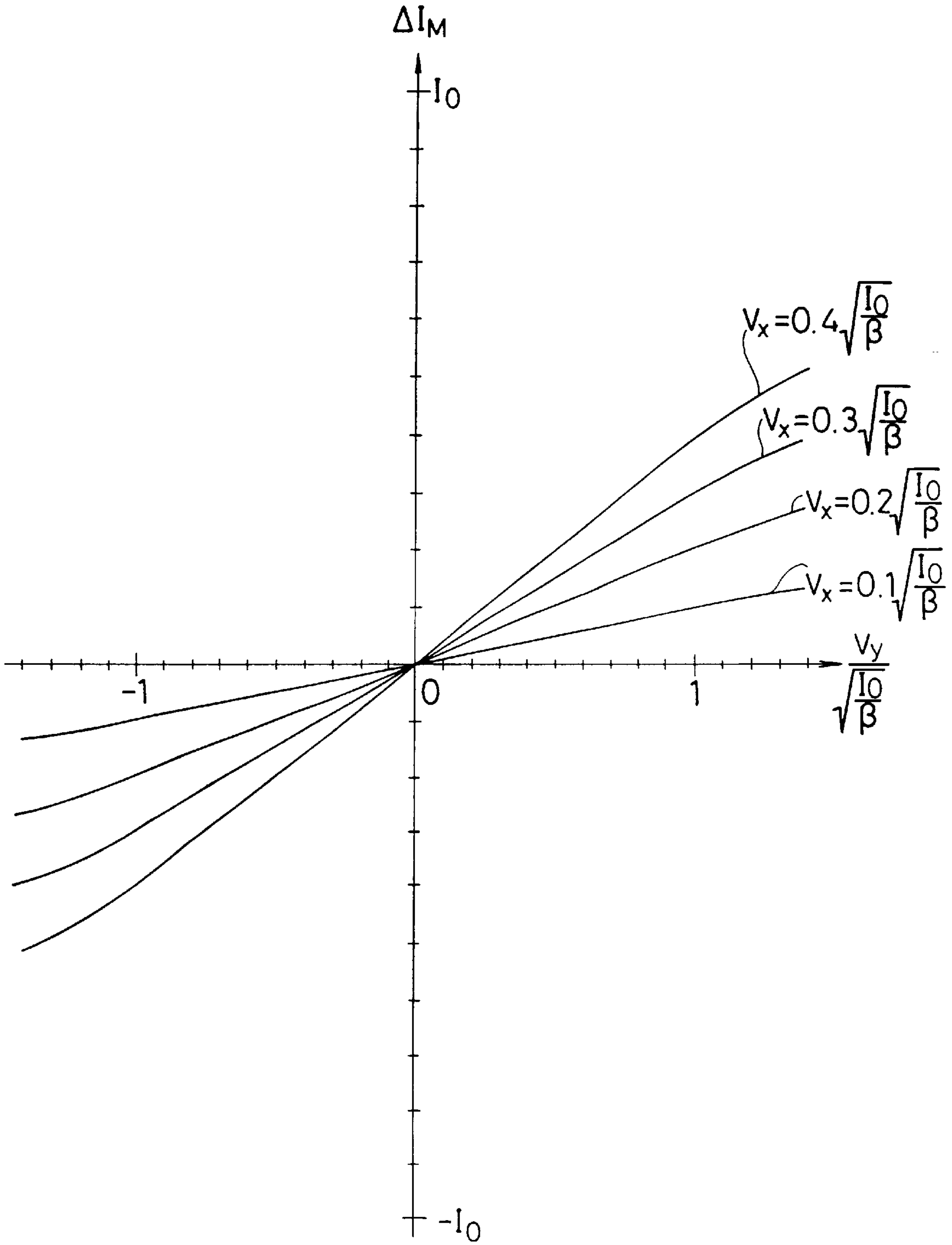
FIG. 52 is a graph showing the transfer characteristic of the multiplier of FIG. 50 according to the twenty-fifth embodiment.

FIG. 51 shows the relationship between the differential output current $\Delta I_M$ and the first input voltage $V_x$ with the second input voltage $V_y$ as a parameter. FIG. 52 shows the relationship between the differential output current $\Delta I_M$ and the second input voltage $V_y$ with the first input voltage $V_x$ as a parameter.

It is seen from FIGS. 51 and 52 that, if each of the MOSFETs M21, M22, M23, M24, M25, M26, M27 and M28 has an square-law characteristic, the deferential output current $\Delta I_M$ has an ideal multiplication characteristic for the first and second input voltages $V_x$ and $V_y$ within the ranges of $V_x$ and $V_y$ in which none of the MOSFETs M21, M22, M23, M24, M25, M26, M27 and M28 occurs the pinch-off phenomenon. Also, it is seen that as the voltages $V_x$ and $V_y$ increase, the pinch-off phenomenon begins to occur so that the transfer characteristics for $V_x$ and $V_y$ deviate from the ideal multiplication characteristics, respectively.

With the multiplier according to the twenty-sixth embodiment, the input voltage ranges that provide the ideal $$\Delta I_M = I_M^+ - I_M^- = (I_{D1} + I_{D3}) - (I_{D2} + I_{D4}) = \beta V_x V_y \tag{65}$$

$$\left(|V_X| \le -\frac{|V_y|}{3} + \sqrt{\frac{2I_0}{3\beta} - \frac{2}{9}V_y^2}\,,\ |V_x| \le \sqrt{\frac{2I_0}{\beta} - V_y^2}\right)$$

$$\begin{aligned}\Delta I_M &= I_M^+ - I_M^- = (I_{D1} + I_{D3}) - (I_{D2} + I_{D4}) \\ &= \frac{7}{36}\beta V_y V_y + \left\{-\frac{I_0}{12} - \frac{19}{72}\beta V_x^2 - \frac{1}{18}V_y^2 + \frac{1}{9}\beta(2|V_x| + |V_y|)\sqrt{\frac{12I_0}{\beta} - 2(|V_x| + |V_y|)^2} - \frac{1}{8}\beta(2|V_x| + |V_y|)\sqrt{\frac{4I_0}{\beta} - 2V_x^2 - V_y^2}\right\} sgn(V_x V_y)\end{aligned} \tag{66}$$

$$\left(-\frac{|V_y|}{3} + \sqrt{\frac{2I_0}{3\beta} - \frac{2}{9}V_y^2} \le |V_x| \le \sqrt{\frac{2I_0}{\beta} - V_y^2}\,,\ |V_y| \le |V_x|\right)$$

$$\begin{aligned}\Delta I_M &= I_M^+ - I_M^- = (I_{D1} + I_{D3}) - (I_{D2} + I_{D4}) \\ &= \frac{1}{9}\beta V_x V_y + \left\{\frac{5}{18}\beta V_x^2 - \frac{1}{18}\beta V_y^2 + \frac{2}{3}I_0 - \frac{1}{18}\beta(|V_x| + |V_y|) \times \sqrt{\frac{12I_0}{\beta} - 2(|V_x| + |V_y|)^2}\right\} sgn(V_x V_y)\end{aligned} \tag{67}$$

$$\left(-\frac{|V_y|}{3} + \sqrt{\frac{2I_0}{3\beta} - \frac{2}{9}V_y^2} \le |V_x|,\ \sqrt{\frac{2I_0}{\beta} - V_y^2} \le |V_x|,\ |V_y| \le |V_x|\right)$$

$$\begin{aligned}\Delta I_M &= I_M^+ - I_M^- = (I_{D1} + I_{D3}) - (I_{D2} + I_{D4}) \\ &= \frac{1}{2}\beta V_x V_y + \beta V_x\left(\sqrt{\frac{2I_0}{\beta} - V_x^2} - \frac{1}{2}\sqrt{\frac{4I_0}{\beta} - 2V_x^2 - V_y^2}\right) sgn(V_y)\end{aligned} \tag{68}$$

$$\left(\sqrt{\frac{2I_0}{\beta} - V_y^2} \le |V_x| \le -\frac{|V_y|}{3} + \sqrt{\frac{2I_0}{3\beta} - \frac{2}{9}V_y^2}\,,\ |V_x| \le |V_y|,\ |V_x| \le \sqrt{\frac{I_0}{\beta}}\right)$$

$$\begin{aligned}\Delta I_M &= I_M^+ - I_M^- = (I_{D1} + I_{D3}) - (I_{D2} + I_{D4}) \\ &= \frac{1}{2}\beta V_x V_y + I_0 sgn(V_x V_y) - \left(\frac{1}{2}\beta V_x\sqrt{\frac{4I_0}{\beta} - 2V_x^2 - V_y^2}\right) sgn(V_y)\end{aligned} \tag{69}$$

$$\left(\sqrt{\frac{2I_0}{\beta} - V_y^2} \le |V_x| \le -\frac{|V_y|}{3} + \sqrt{\frac{2I_0}{3\beta} - \frac{2}{9}V_y^2}\,,\ \sqrt{\frac{I_0}{\beta}} \le |V_x| \le |V_y|\right)$$

FIGS. 51 and 52 show the transfer characteristics of the multiplier according to the twenty-sixth embodiment, in which the input voltages $V_x$ and $V_y$ are normalized by $(I_0/\beta)\}^{1/2}$.

multiplication characteristics are particularly wide. Especially, the input voltage range is extremely wide for the second input voltage $V_y$, being beyond $\pm(I_0/\beta)\}^{1/2}$. This means that the input voltage ranges for $V_x$ and $V_y$ are greatly expanded or improved.

Figure 53:
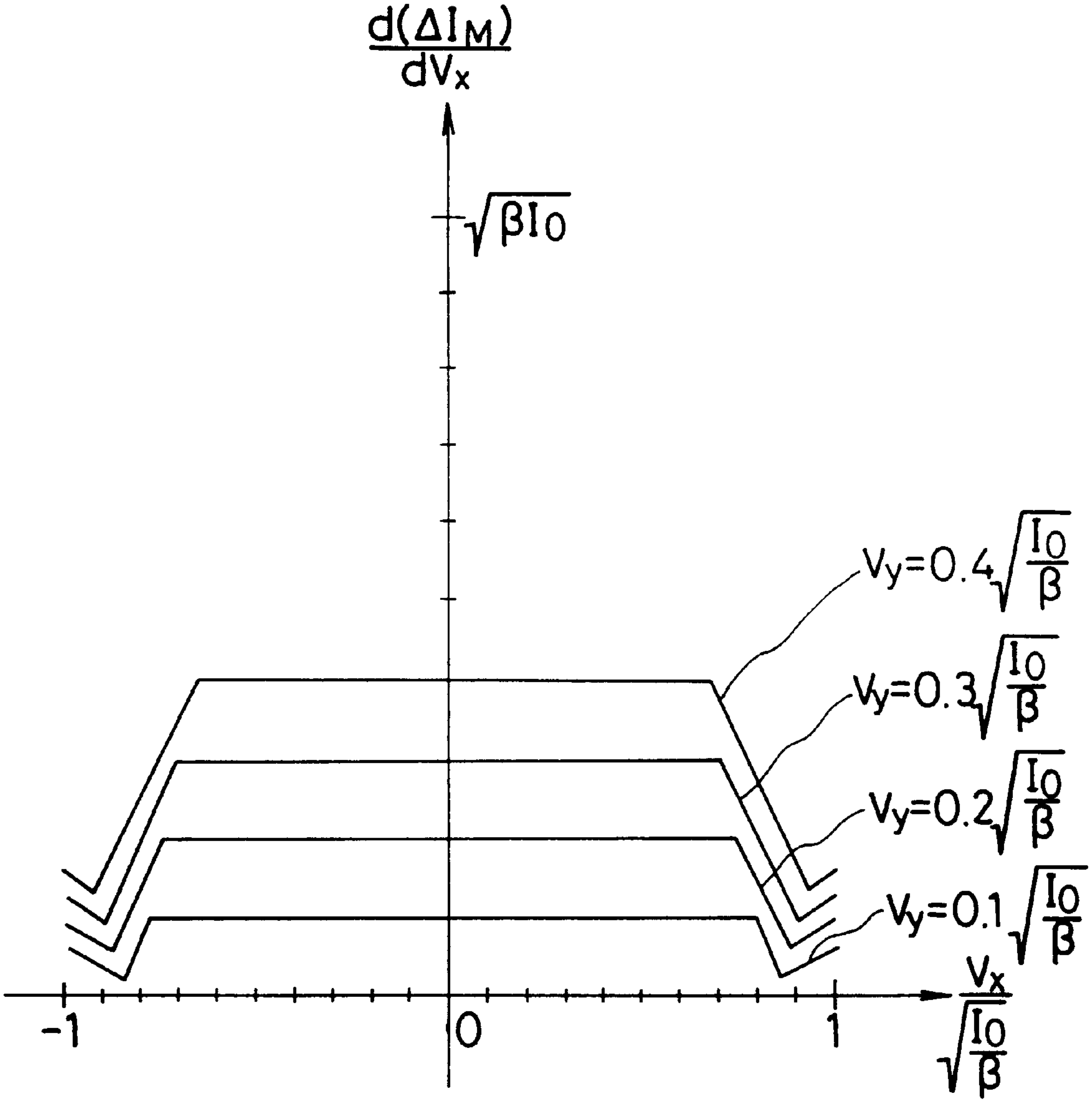
FIG. 53 is a graph showing the transconductance characteristic of the multiplier of FIG. 50 according to the twenty-fifth embodiment.
Figure 54:
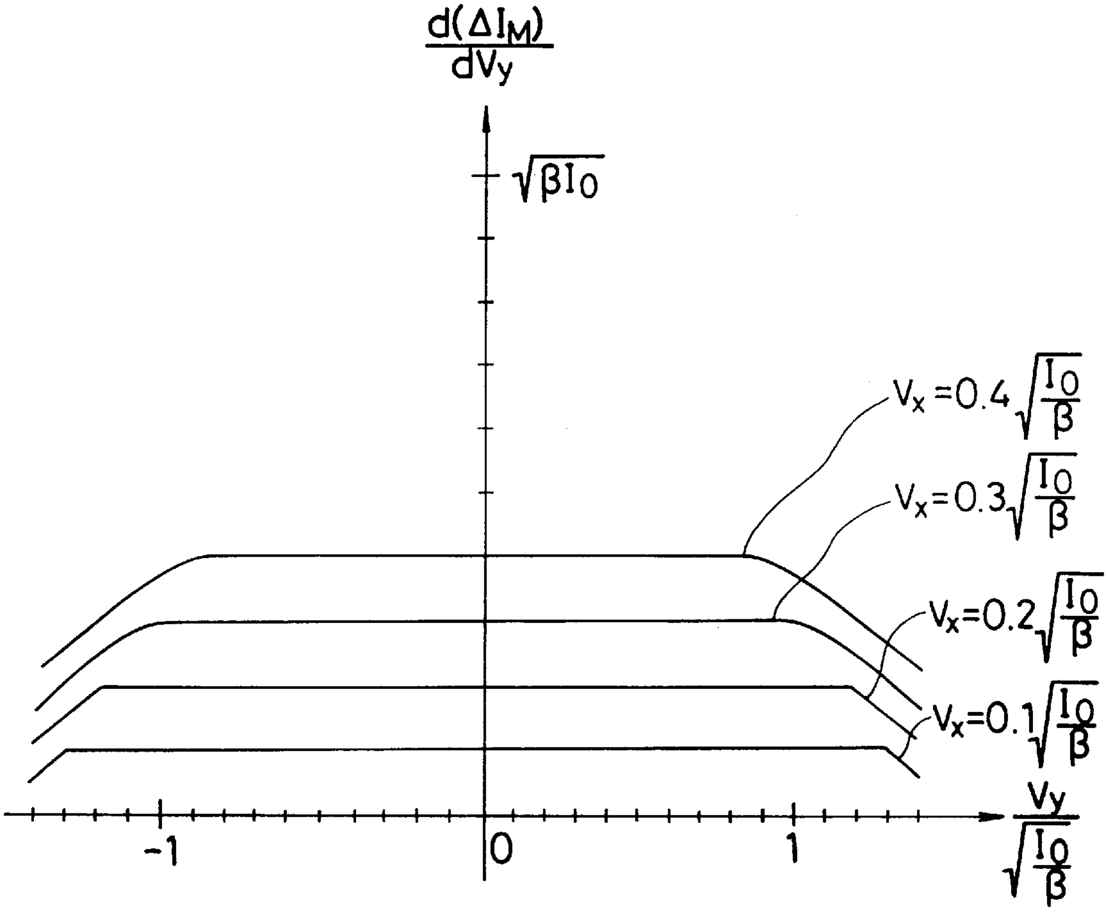
FIG. 54 is a graph showing the transconductance characteristic of the multiplier of FIG. 50 according to the twenty-fifth embodiment.

The transconductance characteristics of the multiplier is given by differentiating the differential output current $\Delta I_M$ by the first or second input voltage $V_x$ or $V_y$ in the equations (65) to (69), resulting in the following equations (70) to (75) and FIG. 53 for $V_x$ and the following equations (76) to (80) and FIG. 54 for $V_y$.

$$\frac{d(\Delta I_M)}{dV_x} = \beta V_y \tag{70}$$

$$\left(|V_x| \le -\frac{|V_y|}{3} + \sqrt{\frac{2I_0}{3\beta} - \frac{2}{9}V_y^2},\ |V_x| \le \sqrt{\frac{2I_0}{\beta} - V_y^2}\right)$$

$$\frac{d(\Delta I_M)}{dV_x} = \frac{4}{9}\beta V_y - \left\{-\frac{7}{9}\beta V_x + \frac{2}{9}\beta \times \sqrt{\frac{12I_0}{\beta} - 2(|V_x| + |V_y|)^2} - \frac{2}{9}\frac{\beta(2V_x^2 + V_y^2 + 3|V_x||V_y|)}{\sqrt{\frac{12I_0}{\beta} - 2(|V_x| + |V_y|)^2}}\right\} sgn(V_x) \tag{71}$$

$$\left(-\frac{|V_y|}{3} + \sqrt{\frac{2I_0}{3\beta} - \frac{2}{9}V_y^2} \le |V_x| \le \sqrt{\frac{2I_0}{\beta} - V_y^2},\ |V_y| \le |V_x|\right)$$

$$\frac{d(\Delta I_M)}{dV_x} = \tag{72}$$

$$\frac{7}{36}\beta V_y + \left\{-\frac{19}{36}\beta|V_x| + \frac{2}{9}\beta\sqrt{\frac{12I_0}{\beta} - 2(|V_x| + |V_y|)^2} - \frac{2}{9}\frac{\beta(2V_x^2 + V_y^2 + 3|V_y||V_x|)}{\sqrt{\frac{12I_0}{\beta} - 2(|V_x| + |V_y|)^2}} - \frac{1}{4}\beta\sqrt{\frac{4I_0}{\beta} - 2V_x^2 - V_y^2} + \frac{1}{4}\frac{\beta(2V_x^2 - |V_x||V_y|)}{\sqrt{\frac{4I_0}{\beta} - 2V_x^2 - V_y^2}}\right\} sgn(V_y)$$

$$\left(-\frac{|V_y|}{3} + \sqrt{\frac{2I_0}{3\beta} - \frac{2}{9}V_y^2} \le |V_x| \le \sqrt{\frac{2I_0}{\beta} - V_y^2},\ |V_y| \le |V_x|\right)$$

$$\frac{d(\Delta I_M)}{dV_x} = \frac{1}{9}\beta V_y + \frac{5}{9}\beta V_x + \frac{1}{9}\frac{\beta(|V_x| - |V_y|)}{\sqrt{\frac{12I_0}{\beta} - 2(|V_x| + |V_y|)^2}} - \frac{1}{18}\beta\left\{\sqrt{\frac{12I_0}{\beta} - 2(|V_x| + |V_y|)^2}\right\} sgn(V_y) \tag{73}$$

$$\left(-\frac{|V_y|}{3} + \sqrt{\frac{2I_0}{3\beta} - \frac{2}{9}V_y^2} \le |V_x|,\ \sqrt{\frac{2I_0}{\beta} - V_y^2} \le |V_x|,\ |V_y| \le |V_x|\right)$$

$$\frac{d(\Delta I_M)}{dV_x} = \frac{1}{2}\beta V_y + \beta\left(\sqrt{\frac{2I_0}{\beta} - V_x^2} - \frac{1}{2}\sqrt{\frac{4I_0}{\beta} - 2V_x^2 - V_y^2}\right) sgn(V_y) - \left\{\frac{\beta V_x^2}{\sqrt{\frac{2I_0}{\beta} - V_x^2}} - \frac{\beta V_x^2}{\sqrt{\frac{4I_0}{\beta} - 2V_x^2 - V_y^2}}\right\} sgn(V_y) \tag{74}$$

$$\left(\sqrt{\frac{2I_0}{\beta} - V_y^2} \le |V_x| \le -\frac{|V_y|}{3} + \sqrt{\frac{2I_0}{3\beta} - \frac{2}{9}V_y^2},\ |V_x| \le |V_y|,\ |V_x| \le \sqrt{\frac{I_0}{\beta}}\right)$$

$$\frac{d(\Delta I_M)}{dV_x} = \frac{1}{2}\beta V_y - \left(\frac{1}{2}\beta\sqrt{\frac{4I_0}{\beta} - 2V_x^2 - V_y^2} + \frac{\beta V_x^2}{\sqrt{\frac{4I_0}{\beta} - 2V_x^2 - V_y^2}}\right) sgn(V_y) \tag{75}$$

$$\left(\sqrt{\frac{2I_0}{\beta} - V_y^2} \le |V_x| \le -\frac{|V_y|}{3} + \sqrt{\frac{2I_0}{3\beta} - \frac{2}{9}V_y^2},\ \sqrt{\frac{I_0}{\beta}} \le |V_x| \le |V_y|\right)$$

$$\frac{d(\Delta I_M)}{dV_y} = \beta V_x \tag{76}$$

-continued $$\left(|V_y| \le -|V_x| + \sqrt{\frac{2I_0}{\beta} - 3V_x^2}\ ,\ |V_y| \le \sqrt{\frac{2I_0}{\beta} - V_x^2}\right)$$

$$\frac{d(\Delta I_M)}{dV_y} = \frac{4}{9}\beta V_x + \left\{-\frac{1}{9}\beta V_y - \frac{1}{9}\beta\sqrt{\frac{12I_0}{\beta} - 2(|V_x| + |V_y|)^2} + \frac{2}{9}\frac{\beta(2V_x^2 + V_y^2 + 3|V_y||V_x|)}{\sqrt{\frac{12I_0}{\beta} - 2(|V_x| + |V_y|)^2}}\right\}sgn(V_x) \tag{77}$$

$$\left(|V_y| \le \sqrt{\frac{2I_0}{\beta} - V_x^2}\ ,\ -|V_x| + \sqrt{\frac{2I_0}{\beta} - 3V_x^2} \le |V_y| \le |V_x| + \sqrt{\frac{2I_0}{\beta} - 3V_x^2}\right)$$

$$\frac{d(\Delta I_M)}{dV_y} = \frac{7}{36}\beta V_x - \left\{\frac{1}{9}\beta|V_x| - \frac{1}{9}\beta\sqrt{\frac{12I_0}{\beta} - 2(|V_x| + |V_y|)^2} + \frac{2}{9}\frac{\beta(2V_x^2 + V_y^2 + 3|V_y||V_x|)}{\sqrt{\frac{12I_0}{\beta} - 2(|V_x| + |V_y|)^2}} - \frac{1}{8}\beta\sqrt{\frac{4I_0}{\beta} - 2V_x^2 - V_y^2} - \frac{1}{8}\frac{\beta(2|V_x||V_y| - V_y^2)}{\sqrt{\frac{4I_0}{\beta} - 2V_x^2 - V_y^2}}\right\}sgn(V_x) \tag{78}$$

$$\left(|V_x| + \sqrt{\frac{2I_0}{3\beta} - 3V_x^2} \le |V_y|,\ \sqrt{\frac{2I_0}{5\beta} - V_x^2} \le |V_y|\right)$$

$$\frac{d(\Delta I_M)}{dV_y} = \frac{1}{9}\beta V_x - \frac{1}{9}\beta|V_y| - \frac{1}{9}\frac{\beta(V_x^2 - V_y^2)}{\sqrt{\frac{12I_0}{\beta} - 2(|V_x| + |V_y|)^2}} + \frac{1}{18}\beta\left\{\sqrt{\frac{12I_0}{\beta} - 2(|V_x| + |V_y|)^2}\right\}sgn(V_x) \tag{79}$$

$$\left(|V_x| + \sqrt{\frac{2I_0}{\beta} - 3V_x^2} \le |V_y|,\ \sqrt{\frac{2I_0}{\beta} - V_x^2} \le |V_y|,\ |V_y| \le |V_x|\right)$$

$$\frac{d(\Delta I_M)}{dV_y} = \frac{1}{4}\beta V_x + \frac{1}{4}\beta V_x\frac{|V_y|}{\sqrt{\frac{4I_0}{\beta} - 2V_x^2 - V_y^2}} \tag{80}$$

$$\left(\sqrt{\frac{2I_0}{5\beta} - V_x^2} \le |V_y| \le |V_x| + \sqrt{\frac{2I_0}{\beta} - 3V_x^2}\ ,\ |V_x| \le |V_y|\right)$$

It is seen that the two-quadrant analog multiplier according to the twenty-fifth embodiment is expanded in linear transconductance range for the first and second input voltages $V_x$ and $V_y$.

[Twenty-Sixth Embodiment]

With the four-quadrant bipolar multipliers described previously, as shown in FIGS. 36, 37, 46 and 47, the transfer characteristic deteriorates in linearity as the input voltage increases. Such the non-linearity is, to be seen from the equations (47) and (62), due to the exponential characteristic of a bipolar transistor.

Similarly, with the four-quadrant MOS multipliers described previously, as shown in FIGS. 41, 42, 51 and 52, although the transfer characteristic begins to deteriorate in linearity over given values of the input voltages $V_x$ and $V_y$, it has an ideal multiplication characteristic within the given values. Therefore, a differential input voltage generator circuit for generating the differential signal voltage $V_1$ or $V_2$ should have superior linearity in transfer characteristic.

Such the deterioration is, to be seen from the equations (50) to (53) and (65) to (69), due to the square-law characteristic of an MOSFET.

In twenty-sixth and twenty-seventh embodiments, such the non-linearity of the bipolar multiplier can be improved by the twenty-sixth embodiment.

Figure 55:
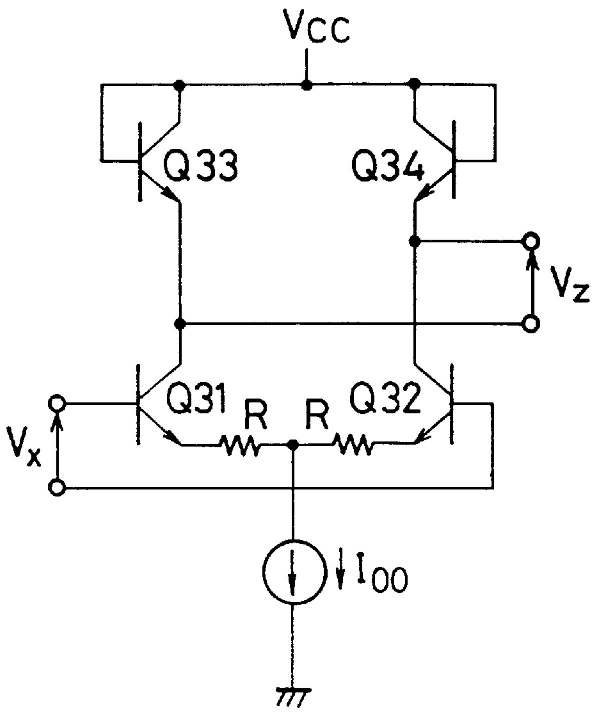
FIG. 55 is a circuit diagram of a bipolar compensation circuit for the bipolar multipliers according to the invention.

FIG. 55 shows a compensation circuit according to the twenty-sixth embodiment, which compensates the non-linearity of the bipolar multipliers described previously.

This compensation circuit contains first converter means and a second converter means.

The first converter means converts a first differential input voltage or a second differential input voltage into a first differential current or a second differential current, respectively.

The second converter means converts the resultant first differential current or the second differential current into a first differential voltage and a second differential voltage, respectively.

In FIG. 55, the circuit of the twenty-sixth embodiment contains an emitter-coupled differential pair of bipolar transistors Q31 and Q32 as the first converter means, and diode-connected bipolar transistors Q33 and Q34 as the second converter means. The transistors Q33 and Q34 are loads for the transistors Q31 and Q32, respectively.

The transistors Q31 and 32 have emitters connected in common to one end of the constant current source (current: $I_{00}$) through emitter resistors (resistance: R), and collectors connected to corresponding emitters of the transistors Q33 and Q34.

The transistor Q33 has a base and a collector coupled together to be applied with a supply voltage $V_{CC}$. The transistor Q34 has a base and a collector coupled together to be applied with the supply voltage $V_{CC}$. An initial input voltage $V_x$ is differentially applied to the differential input ends of the emitter-coupled pair, i.e., the bases of the transistors Q31 and Q32.

A differential output current is derived from the differential output ends of the pair, i.e., the collectors of the transistors Q31 and Q32. This means that the initial differential input voltage $V_x$ is converted into the differential current by the differential pair.

The differential current thus produced is then converted to a compensated input voltage $V_Z$ by the diodes or transistors Q33 and Q34 and is derived from the differential output ends of the pair, i.e., the collectors of the transistors Q31 and Q32.

The compensated input voltage $V_Z$ thus obtained is applied to the input ends of each multitail cell.

The compensation circuit compensates logarithmically the distortion or non-linearity of the transfer characteristic of the multiplier that is due to the exponential characteristic of the bipolar transistor. As a result, the overall linearity of the multiplier can be improved by this circuit.

[Twenty-Seventh Embodiments]

Figure 56:
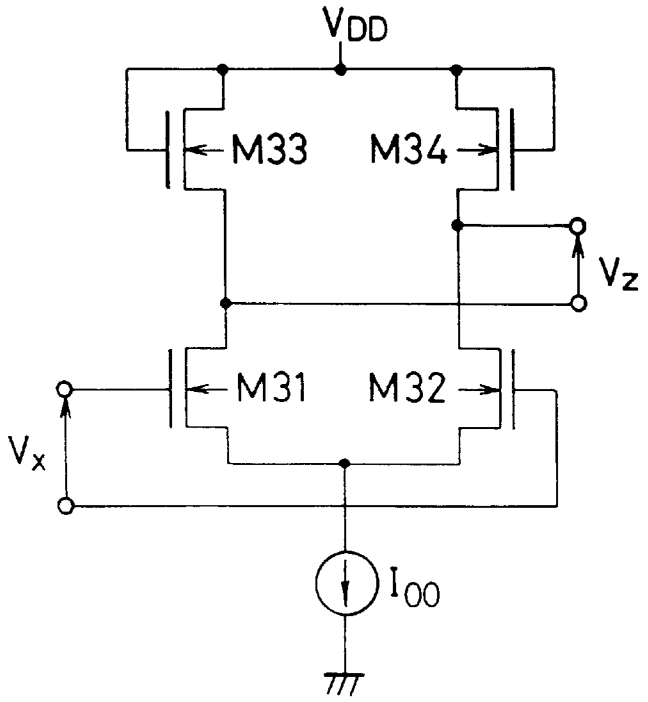
FIG. 56 is a circuit diagram of an MOS differential circuit for the MOS multipliers according to the invention.

The multiplier of the twenty-seventh embodiment contains a compensation circuit as shown in FIG. 56, which has a source-coupled differential pair of MOSFETs M31 and M32 as a first converter means, and diode-connected MOSFETs M33 and M34 as a second converter means. The MOSFETs M33 and M34 are loads for the MOSFETs M31 and M32, respectively.

The MOSFETs M31 and M32 have sources connected in common to one end of the constant current source (current: $I_{00}$), and drains connected to corresponding source of the MOSFETs M33 and M34.

The transistor M33 has a gate and a drain coupled together to be applied with a supply voltage $V_{DD}$. The MOSFET M34 has a gate and a drain coupled together to be applied with the supply voltage $V_{DD}$.

An initial input voltage $V_x$ is differentially applied to the differential input ends of the source-coupled pair, i.e., the gates of the MOSFETs M31 and M32.

A differential output current is derived from the differential output ends of the pair, i.e., the drains of the MOSFETs M31 and M32. This means that the initial differential input voltage $V_x$ is converted into the differential current by the differential pair.

The differential current thus produced is then converted to a compensated input voltage $V_Z$ by the diodes or MOSFETs M33 and M34 and is derived from the differential output ends of the pair, i.e., the drains of the MOSFETs M31 and M32.

The compensated input voltage $V_Z$ thus obtained is applied to the input ends of each multitail cell.

The compensation circuit compensates the distortion or non-linearity of the transfer characteristic of the differential pair of the MOSFETs M31 and M32 that is due to the square-law characteristic of the MOSFET by a square-root. As a result, the overall linearity of the multiplier can be improved by the MOS compensation circuit.

Particularly, since the first converter means is composed of the source-coupled differential pairs of the MOSFETs M31 and M32, the operating input voltage range is determined by a square-root of a quotient between the constant current value $I_{00}$ and the transconductance parameter $\beta$, which may be set optionally. This means that no element equivalent to the emitter resistor is required.

The transconductance parameter $\beta$ is proportional to the gate-width to gate-length ratio (W/L) of the MOSFET.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A two-quadrant multiplier for multiplying a first input signal and a second input signal, which has a single multitail cell comprising:

a circuit having a differential input and a differential output, said circuit comprising a pair of first and second transistors;

a third transistor having an input;

a common constant current source for driving said first, second, and third transistors, said common constant current source being connected to said first, second and third transistors; and said first input signal being applied across said differential input of said pair of first and second transistors, and said second input signal being applied in a single polarity to said input of said third transistor, wherein an output signal from said differential output of said pair of first and second transistors contains a multiplication result of said first and second input signals;

wherein said differential input of said pair includes first and second terminals, a dc voltage is applied to said first terminal of said differential input of said pair, and a first resistor is connected between said second terminal of said differential input and said input of said third transistor, and wherein said second input signal is applied through a second resistor to said input of said third transistor.

2. The multiplier as claimed in claim 1, wherein each of said first and second transistors is a bipolar transistors, each of said first and second bipolar transistors has a base, a collector and an emitter;

respective bases of said bipolar transistors serving as said differential input of said pair, and respective collectors of said bipolar transistors serving as said differential output of said pair;

and wherein said third transistor is a bipolar transistor having a base, a collector and an emitter;

said base of said third bipolar transistor serving as said input of said third bipolar transistor.

3. The multiplier as claimed in claim 1, wherein each of said first and second transistors is a MOSFET, and each of said first and second MOSFETs has a gate, a drain, and a source;

respective gates of said MOSFETs serving as said differential input of said pair and respective drains of said MOSFETs serving as said differential output of said pair;

and wherein said third transistor is a MOSFET having gate, a drain, and a source;

said gate of said third MOSFET transistor serving as said input of said third MOSFET transistor.

4. The multiplier as claimed in claim 1, further comprising at least one additional transistor, said at least one additional transistor having an input connected to said input of said third transistor and is driven by said constant current source.

5. The multiplier as claimed in claim 1, wherein each of said first and second transistors is a MOSFET, and each of said first and second MOSFETs has a gate, a drain and a source, respectively;

respective gates of said MOSFETs serving as said differential input of said pair and respective drains of said MOSFETs serving as said differential output of said pair;

and wherein said third transistor is a bipolar transistor having a base, a collector and an emitter;

said base of said third transistor serving as said input of said third transistor.

6. The multiplier as claimed in claim 2, wherein said first and second transistors are both of a same type selected from the group consisting of NPN and PNP, and said third transistor is of an opposite type from that of said first and second transistors.

7. The multiplier as claimed in claim 3, wherein said first transistor and said second transistor are both of a same type selected from the group consisting of N- and P- channels, and said third transistor is of an opposite type from that of said first and second transistors.

8. The multiplier as claimed in claim 1, wherein said first and second transistors have one of a same emitter area and same gate-width (W) to gate-length (L) ratio (W/L), and said third transistor has one of the same emitter area and gate-width (W) to gate-length (L) ratio (W/L) as those of said first and second transistors.

9. The multiplier as claimed in claim 1, wherein said first and second transistors have one of a same emitter area and same gate-width (W) to gate-length (L) ratio (W/L), and said third transistor has one of a different emitter area and different gate-width (W) to gate-length (L) ratio (W/L) as those of said first and second transistors.

10. A two-quadrant multiplier for multiplying a first input signal and a second input signal, which has a single multitail cell comprising:

a circuit having a differential input and a differential output, said circuit comprising a pair of first and second transistors;

a third transistor having an input;

a common constant current source for driving said first, second, and third transistors, said common constant current source being connected to said first, second and third transistors; and said first input signal being applied across said differential input of said pair of first and second transistors, and said second input signal being applied in a single polarity to said input of said third transistor, wherein an output signal from said differential output of said pair of first and second transistors contains a multiplication result of said first and second input signals;

wherein each of said first and second transistors is a bipolar transistor, and said circuit includes at least one element for degenerating an emitter of said bipolar transistors.

11. A two-quadrant multiplier for multiplying a first input signal and a second input signal, which has a single multitail cell comprising:

a circuit having a differential input and a differential output, said circuit comprising a pair of first and second transistors;

a third transistor having an input;

a common constant current source for driving said first, second, and third transistors, said common constant current source being connected to said first, second and third transistors; and said first input signal being applied across said differential input of said pair of first and second transistors, and said second input signal being applied in a single polarity to said input of said third transistor, wherein an output signal from said differential output of said pair of first and second transistors contains a multiplication result of said first and second input signals;

wherein each of said first and second transistors is a bipolar transistor, each of the bipolar transistors has a base, a collector and an emitter;

respective bases of said bipolar transistors serving as said differential input of said pair and respective collectors of said bipolar transistors serving as said differential output of said pair;

and wherein said third transistor is a MOSFET having a gate, a drain, and a source;

said gate of said third transistor serving as said input of said third transistor.

12. A four-quadrant multiplier for multiplying a first input signal and a second input signal, said multiplier comprising:

(a) a first multitail cell;

said first multitail cell containing a first circuit having a differential input and a differential output, said first circuit comprising a first pair of first and second transistors;

a third transistor having an input and an output;

a first common constant current source for driving said first pair of said first and second transistors and said third transistor;

(b) a second multitail cell;

said second multitail cell containing a second circuit having a differential input and a differential output, said second circuit comprising a second pair of fourth and fifth transistors;

a sixth transistor having an input and an output;

a second common constant current source for driving said second pair of said fourth and fifth transistors and said sixth transistor;

(c) said differential output of said first pair of said first and second transistors being coupled with said differential output of said second pair of fourth and fifth transistors in opposite polarities;

(d) said output of said third transistor and said output of said sixth transistor being coupled together;

(e) said first input signal being applied across said differential input of said first circuit and across said differential input of said second circuit in the same polarity; and (f) said second input signal being applied across said input of said third transistor and said input of said sixth transistor, (g) wherein an output signal from said coupled output of said first and second circuits contains a multiplication result of said first and second input signals;

wherein each of said first, second and third transistors of said first multitail cell is a bipolar transistor, and each of said fourth, fifth and sixth transistors of said second multitail cell is a bipolar transistor; and wherein said first circuit has at least one element for degenerating one of said first, second and third bipolar transistors, and said second circuit has at least one element for degenerating one of said fourth, fifth and sixth bipolar transistors.

13. A two-quadrant multiplier for multiplying a first input signal and a second input signal, which has a single multitail cell comprising:

a circuit having a differential input and a differential output, said circuit comprising a pair of first and second transistors;

a third transistor having an input;

a common constant current source for driving said first, second, and third transistors, said common constant current source being connected to said first, second, and third transistors; and said first input signal being applied across said differential input of said circuit, and said second input signal being applied in a single polarity to said input of said third transistor, wherein an output signal from said differential output of said circuit contains a multiplication result of said first and second input signals, wherein said first, second, and third transistors of said multitail cell are bipolar transistors, said first and second transistors have equal size emitter areas and said third transistor has an emitter area of K times as large as those of said first and second transistors, where K=1 or $K \geqq 2$, and wherein such a relationship as $V_2=V_T \ln(4/K)$ is approximately satisfied where said second input signal and the thermal voltage are defined as $V_2$(V) and $V_T$(V), respectively.

14. A four-quadrant multiplier for multiplying a first input signal and a second input signal, said multiplier comprising:

(a) a first multitail cell;

said first multitail cell containing a first circuit having a differential input and a differential output, said first circuit comprising a first pair of first and second transistors;

a third transistor having an input and an output;

a first common constant current source for driving said first pair of said first and second transistors and said third transistor;

(b) a second multitail cell;

said second multitail cell containing a second circuit having a differential input and a differential output, said second circuit comprising a second pair of fourth and fifth transistors;

a sixth transistor having an input and an output;

a second common constant current source for driving said second pair of said fourth and fifth transistors and said sixth transistor;

(c) said differential output of said first circuit being coupled with said differential output of said second circuit in opposite polarities;

(d) said output of said third transistor and said output of said sixth transistor being coupled together;

(e) said first input signal being applied across said differential input of said first circuit and across said differential input of said second circuit in the same polarity; and (f) said second input signal being applied across said input of said third transistor and said input of said sixth transistor, (g) wherein an output signal from said coupled output of said first and second circuits contains a multiplication result of said first and second input signals, wherein said differential input of said first circuit of said first multitail cell includes first and second terminals, a dc voltage is applied to said first terminal of said differential input of said first circuit of said first multitail cell, and a first resistor is connected between said second terminal of said differential input and said input of said third transistor, said second input signal being applied through a second resistor to said input of said third transistor, and wherein said differential input of said second circuit of said second multitail cell includes third and fourth terminals, said dc voltage is applied to said third terminal of said differential input of said second circuit of said second multitail cell, and a third resistor is connected between said fourth terminal of said differential input and said input of said sixth transistor, said second input signal being applied through a fourth resistor to said input of said sixth transistor.

15. The multiplier as claimed in claim 14, wherein (a) each of said first and second transistors of said first multitail cell is a bipolar transistor, and each of said first and second bipolar transistors has a collector, a base, and an emitter;

respective bases of said first and second bipolar transistors serving as said differential input of said first pair, and respective collectors of said first and second bipolar transistors serving as said differential output of said first pair;

said third transistor of said first multitail cell is a bipolar transistor having a base;

said base of said third bipolar transistor serving as said input of said third bipolar transistor, and wherein (b) each of said fourth and fifth transistors of said second multitail cell is a bipolar transistor, and each of said fourth and fifth bipolar transistors has a collector, a base, and an emitter;

respective bases of said fourth and fifth bipolar transistors serving as said differential input of said second pair, and respective collectors of said fourth and fifth bipolar transistors serving as said differential output of said second pair;

said sixth transistor of said second multitail cell is a bipolar transistor having a base;

said base of said sixth bipolar transistor serving as said input of said sixth bipolar transistor.

16. The multiplier as claimed in claim 14, wherein (a) each of said first and said second transistors of said first multitail cell is a MOSFET, and each of said first and second MOSFETS has a drain, a gate, and a source;

respective gates of said first and second MOSFETs serving as said differential input of said first pair and respective drains of said first and second MOSFETs serving as said differential output of said first pair;

said third transistor of said first multitail cell is a MOSFET having a gate;

said gate of said third MOSFET transistor serving as said input of said third MOSFET transistor, and wherein (b) each of said fourth and fifth transistors of said second multitail cell is a MOSFET, and each of said fourth and fifth MOSFETS has a drain, a gate, and a source;

respective gates of said fourth and fifth MOSFETs serving as said differential input of said second pair and respective drains of said fourth and fifth MOSFETs serving as said differential output of said second pair;

said sixth transistor of said second multitail cell is a MOSFET having a gate;

said gate of said sixth MOSFET transistor serving as said input of said sixth MOSFET transistor.

17. The multiplier as claimed in claim 14, wherein said first and second transistors of said first multitail cell have one of a same emitter area and gate-width (W) to gate-length (L) ratio (W/L), and said third transistor of said first multitail cell has one of the same emitter area and gate-width (W) to gate-length (L) ratio (W/L) as those of said first and second transistors;

said fourth and fifth transistors of said second multitail cell have one of a same emitter area and gate-width (W) to gate-length (L) ratio (W/L), and said sixth transistor of said second multitail cell has one of the same emitter area and gate-width (W) to gate-length (L) ratio (W/L) as those of said fourth transistor and said fifth transistor.

18. The multiplier as claimed in claim 14, wherein said first and second transistors of said first multitail cell have one of a same emitter area and gate-width (W) to gate-length (L) ratio (W/L), and said third transistor of said first multitail cell has one of a different emitter area and gate-width (W) to gate-length (L) ratio (W/L) as those of said first and second transistors, and wherein said fourth transistor and said fifth transistor of said second multitail cell have one of a same emitter area and gate-width (W) to gate-length (L) ratio (W/L) as each other, and said sixth transistor of said second multitail cell has one of a different emitter area and gate-width (W) to gate-length (L) ratio (W/L) as those of said fourth transistor and said fifth transistor.

19. The multiplier as claimed in claim 14, wherein said first, second, and third transistors of said first multitail cell are bipolar transistors, said first and second transistors have equal size emitter areas and said third transistor has an emitter area of K times as large as those of said first and second transistors, where K=1 or K≧2, wherein said fourth, fifth and sixth transistors of said second multitail cell are bipolar transistors, said fourth and fifth transistors have equal size emitter areas, and said sixth transistor has an emitter area of K times as large as those of said fourth and fifth transistor.

20. The multiplier as claimed in claim 14, said multiplier further comprising:

at least two additional transistors for said first and second multitail cells;

one of said at least two additional transistors having an input connected to said input of said third transistor of said first multitail cell and is driven by said first constant current source; and the other of said at least two additional transistors having an input connected to said input of said sixth transistor of said second multitail cell and is driven by said second constant current source.

21. The multiplier as claimed in claim 14, wherein said multiplier further comprises first and second compensation circuits for compensating linear transfer characteristics of said first and second multitail cells.

22. The multiplier as claimed in claim 21, each of said first and second compensation circuits has a first converter for converting an initial differential input voltage into a differential current, and a second converter for converting said differential current thus obtained to produce a compensated differential input voltage that serves as said first or second input signal to be multiplied.

23. The multiplier as claimed in claim 21, wherein each of said first and second compensation circuits has a first converter, said first converter composed of a differential pair of two transistors and two diode means connected to a differential output of said differential pair of transistors, said diode means serving as loads for said connected differential pair of transistors, and wherein an initial differential input voltage is applied across an input of said differential pair of transistors, and a compensated differential input voltage is derived from the output of the differential pair of transistors.

* * * * *